United States Patent
Hori et al.

(10) Patent No.: US 11,934,099 B2
(45) Date of Patent: Mar. 19, 2024

(54) RESIST COMPOSITION AND METHOD OF FORMING RESIST PATTERN

(71) Applicant: TOKYO OHKA KOGYO CO., LTD., Kawasaki (JP)

(72) Inventors: Yoichi Hori, Kawasaki (JP); Yosuke Suzuki, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 117 days.

(21) Appl. No.: 17/303,253

(22) Filed: May 25, 2021

(65) Prior Publication Data

US 2021/0405531 A1 Dec. 30, 2021

(30) Foreign Application Priority Data

Jun. 18, 2020 (JP) ................. 2020-105392

(51) Int. Cl.
| | | |
|---|---|---|
| G03F 7/004 | (2006.01) | |
| G03F 7/038 | (2006.01) | |
| G03F 7/039 | (2006.01) | |
| G03F 7/20 | (2006.01) | |
| G03F 7/30 | (2006.01) | |
| G03F 7/32 | (2006.01) | |

(52) U.S. Cl.
CPC .......... G03F 7/0397 (2013.01); G03F 7/0045 (2013.01); G03F 7/0382 (2013.01); G03F 7/2006 (2013.01); G03F 7/30 (2013.01); G03F 7/327 (2013.01)

(58) Field of Classification Search
CPC .... G03F 7/0392; G03F 7/0397; G03F 7/0045; G03F 7/30
See application file for complete search history.

(56) References Cited

U.S. PATENT DOCUMENTS

| | | | | |
|---|---|---|---|---|
| 8,911,927 B2 * | 12/2014 | Gallagher | ............ | G03F 7/2041 430/273.1 |
| 2009/0176175 A1 * | 7/2009 | Glodde | ................ | C07C 309/06 430/323 |
| 2013/0330669 A1 * | 12/2013 | Kawamura | ........... | G03F 7/0392 430/326 |
| 2018/0067394 A1 * | 3/2018 | Yamada | ................ | G03F 7/0392 |
| 2020/0012194 A1 | 1/2020 | Shiratani et al. | | |

FOREIGN PATENT DOCUMENTS

| | | |
|---|---|---|
| JP | 2018-194623 A | 12/2018 |
| JP | A-2020-008842 | 1/2020 |

* cited by examiner

Primary Examiner — John S Chu
(74) Attorney, Agent, or Firm — Knobbe, Martens, Olson & Bear, LLP

(57) ABSTRACT

A resist composition containing a resin component (A1) having a constitutional unit (a01) and a constitutional unit (a02) derived from compounds each represented by General Formulae (a01-1) and (a02-1), a compound (B1) represented by General Formula (b1), and a compound represented by General Formula (d1-1) or a compound represented by General Formula (d1-2), in the formulae, $C^t$ represents a tertiary carbon atom, a carbon atom at an α-position of $C^t$ constitutes a carbon-carbon unsaturated bond, $Wa^{02}$ represents an aromatic hydrocarbon group, and $Rb^1$ represents hydrocarbon group, where a fluorine atom is not contained

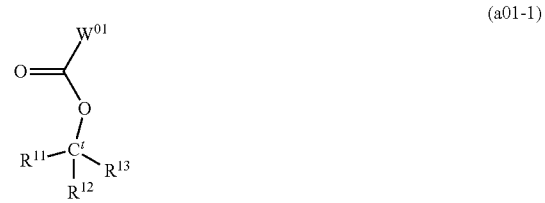
(a01-1)

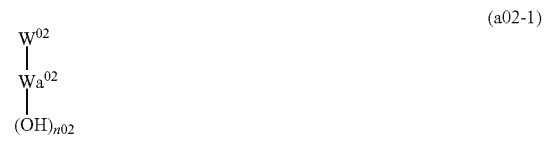

(a02-1)

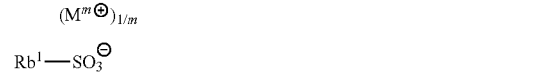

(b1)

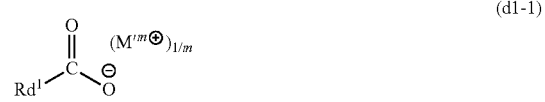

(d1-1)

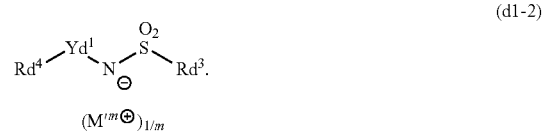

(d1-2)

4 Claims, No Drawings

RESIST COMPOSITION AND METHOD OF FORMING RESIST PATTERN

BACKGROUND OF THE INVENTION

Field of the Invention

The present invention relates to a resist composition and a method of forming a resist pattern.

Priority is claimed on Japanese Patent Application No. 2020-105392, filed on Jun. 18, 2020, the content of which is incorporated herein by reference.

Description of Related Art

In recent years, in the production of semiconductor elements and liquid crystal display elements, advances in lithography techniques have led to a rapid progress in the field of pattern miniaturization. Typically, these miniaturization techniques involve shortening the wavelength (increasing the energy) of the light source for exposure.

Resist materials for use with these types of light sources for exposure require lithography characteristics such as a high resolution capable of reproducing patterns of minute dimensions, and a high level of sensitivity to these types of light sources for exposure.

As a resist material that satisfies these requirements, a chemical amplification-type resist composition which contains a base material component exhibiting changed solubility in a developing solution under action of acid, and an acid generator component that generating an acid upon exposure has been conventionally used.

For example, Patent Document 1 discloses a radiation-sensitive resin composition containing a specific resin having a carbon-carbon double bond and an acid generator having a specific structure, where a generated acid has low reactivity and low diffusibility. With the radiation-sensitive resin composition, it is disclosed that a pattern having excellent exposure level (EL) margin and critical dimension uniformity (CDU) can be formed.

CITATION LIST

Patent Document

[Patent Document 1] Japanese Unexamined Patent Application, First Publication No. 2018-194623

SUMMARY OF THE INVENTION

With the further progress of lithography technology and the miniaturization of a resist pattern, for example, it is aimed to form a fine pattern of several tens of nanometers in lithography by EUV and EB. As the resist pattern dimensions become smaller as described above, it is required that the resist composition has a higher sensitivity to an exposure light source and has a higher level of various lithography characteristics such as a roughness reduction property and a pattern rectangularity.

However, in the conventional resist composition as described above, in a case where the sensitivity to an exposure light source such as EUV was increased, a desired resist pattern shape or the like was not easily obtained, and thus it was difficult to achieve all of these characteristics.

The present invention has been made in consideration of the above circumstances, and an object of the present invention is to provide a resist composition, with which higher sensitivity can be achieved and a resist pattern having a good roughness reduction property and a good pattern shape can be formed, and a method of forming a resist pattern by using the resist composition.

In order to achieve the above-described object, the present invention employs the following configurations.

That is, the first aspect according to the present invention is a resist composition generating an acid upon exposure and exhibits changed solubility in a developing solution under action of acid. The resist composition contains a resin component (A1) exhibiting changed solubility in a developing solution under action of acid, an acid generator component (B) generating an acid upon exposure, and a photo-degradable base (D1) which controls diffusion of the acid generated upon exposure from the acid generator component (B), where the resin component (A1) has a constitutional unit (a01) derived from a compound represented by General Formula (a01-1) and a constitutional unit (a02) derived from a compound represented by General Formula (a02-1), the acid generator component (B) contains a compound (B1) represented by General Formula (b1), and the photo-degradable base (D1) contains a compound represented by General Formula (d1-1) or a compound represented by General Formula (d1-2).

(a01-1)

[In the formula, $W^{01}$ represents a polymerizable group-containing group. $C^t$ represents a tertiary carbon atom, and a carbon atom at an α-position of $C^t$ constitutes a carbon-carbon unsaturated bond. $R^{11}$ represents an aromatic hydrocarbon group or a chain-like hydrocarbon group, which may have a substituent. $R^{12}$ and $R^{13}$ each independently represent a chain-like hydrocarbon group which may have a substituent or $R^{12}$ and $R^{13}$ are bonded to each other to form a cyclic group which may have a substituent.]

(a02-1)

[In the formula, $W^{02}$ represents a polymerizable group-containing group. $Wa^{02}$ represents an aromatic hydrocarbon group. Part or all of hydrogen atoms which the aromatic hydrocarbon group has may be substituted with a substituent other than a hydroxy group. $Wa^{02}$ may form a condensed ring with $W^{02}$. $n02$ represents 1 or 2.]

(b1)

[In the formula, $Rb^1$ represents a hydrocarbon group which may have a substituent. However, $Rb^1$ does not contain a fluorine atom. m represents an integer of 1 or greater, and M' represents an m-valent organic cation.]

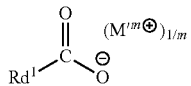

(d1-1)

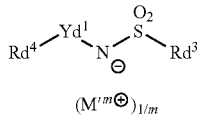

(d1-2)

[In General Formula (d1-1), $Rd^1$ represents a cyclic group which may have a substituent, a chain-like alkyl group which may have a substituent, or chain-like alkenyl group which may have a substituent. m represents an integer of 1 or greater, and $M'^{m+}$ represents an m-valent organic cation.

In General Formula (d1-2), $Rd^3$ and $Rd^{44}$ each independently represent a cyclic group which may have a substituent, a chain-like alkyl group which may have a substituent, or chain-like alkenyl group which may have a substituent. $Yd^1$ represents a single bond or a divalent linking group. m represents an integer of 1 or greater, and $M'^{m+}$ represents an m-valent organic cation.].

The second aspect according to the present invention is a method of forming a resist pattern, including a step of forming a resist film on a support using the resist composition according to the first aspect, a step of exposing the resist film, and a step of developing the exposed resist film to form a resist pattern.

According to the present invention, it is possible to provide a resist composition, with which higher sensitivity can be achieved and a resist pattern having a good roughness reduction property and a good pattern shape can be formed, and a method of forming a resist pattern by using the resist composition.

DETAILED DESCRIPTION OF THE INVENTION

In the present specification and the scope of the present claims, the term "aliphatic" is a relative concept used with respect to the term "aromatic" and defines a group or compound that has no aromaticity.

The term "alkyl group" includes linear, branched or cyclic, monovalent saturated hydrocarbon group, unless otherwise specified. The same applies to the alkyl group in an alkoxy group.

The term "alkylene group" includes linear, branched or cyclic, divalent saturated hydrocarbon group, unless otherwise specified.

Examples of the "halogen atom" include a fluorine atom, a chlorine atom, a bromine atom, and an iodine atom.

The term "constitutional unit" indicates a monomer unit that constitutes the formation of a polymer compound (a resin, a polymer, or a copolymer).

In a case where "may have a substituent" is described, both of a case where a hydrogen atom (—H) is substituted with a monovalent group and a case where a methylene group (—$CH_2$—) is substituted with a divalent group are included.

The term "exposure" is used as a general concept that includes irradiation with any form of radiation.

The term "acid-decomposable group" indicates a group in which at least a part of a bond in the structure of the acid-decomposable group can be cleaved under action of acid.

Examples of the acid-decomposable group having a polarity which is increased under action of acid include groups which are decomposed under action of acid to generate a polar group.

Examples of the polar group include a carboxy group, a hydroxyl group, an amino group, and a sulfo group (—$SO_3H$).

More specific examples of the acid-decomposable group include a group (for example, a group obtained by protecting a hydrogen atom of the OH-containing polar group with an acid-dissociable group) obtained by protecting the above-described polar group with an acid-dissociable group.

The "acid-dissociable group" indicates any one of (i) a group in which a bond between the acid-dissociable group and an atom adjacent to the acid-dissociable group can be cleaved under action of acid; and (ii) a group in which a part of bonds are cleaved under action of acid, and then a decarboxylation reaction occurs, thereby cleaving the bond between the acid-dissociable group and the atom adjacent to the acid-dissociable group."

It is necessary that the acid-dissociable group that constitutes the acid-decomposable group be a group that exhibits a lower polarity than the polar group generated by the dissociation of the acid-dissociable group. Thus, in a case where the acid-dissociable group is dissociated under action of acid, a polar group exhibiting a higher polarity than the acid-dissociable group is generated, thereby increasing the polarity. As a result, the polarity of the entire component (A1) is increased. By the increase in the polarity, the solubility in a developing solution relatively changes. The solubility in a developing solution is increased in a case where the developing solution is an alkali developing solution, whereas the solubility in a developing solution is decreased in a case where the developing solution is an organic developing solution.

The "base material component" is an organic compound having a film-forming ability. The organic compounds used as the base material component are roughly classified into a non-polymer and a polymer. As the non-polymer, those having a molecular weight of 500 or more and less than 4,000 are usually used. Hereinafter, a "low-molecular-weight compound" refers to a non-polymer having a molecular weight of 500 or more and less than 4,000. As the polymer, those having a molecular weight of 1,000 or more are usually used. Hereinafter, a "resin", a "polymer compound", or a "polymer" refers to a polymer having a molecular weight of 1,000 or more. As the molecular weight of the polymer, a polystyrene-equivalent weight-average molecular weight determined by gel permeation chromatography (GPC) is used.

A "constitutional unit derived from" means a constitutional unit that is formed by the cleavage of a multiple bond between carbon atoms, for example, an ethylenic double bond.

In the "acrylic acid ester", the hydrogen atom bonded to the carbon atom at the α-position may be substituted with a substituent. The substituent ($R^{\alpha x}$) that is substituted for the hydrogen atom bonded to the carbon atom at the α-position is an atom other than a hydrogen atom, or a group. Further, an itaconic acid diester in which the substituent ($R^{\alpha x}$) is substituted with a substituent having an ester bond or an α-hydroxyacryl ester in which the substituent ($R^{\alpha x}$) is substituted with a hydroxyalkyl group or a group obtained by modifying a hydroxyl group of the hydroxyalkyl group can be mentioned as the acrylic acid ester. A carbon atom at the α-position of acrylic acid ester indicates the carbon atom bonded to the carbonyl group of acrylic acid unless otherwise specified.

Hereinafter, an acrylic acid ester obtained by substituting a hydrogen atom bonded to the carbon atom at the α-position with a substituent is also referred to as an α-substituted acrylic acid ester".

The term "derivative" includes a compound obtained by substituting a hydrogen atom at the α-position of an object compound with another substituent such as an alkyl group or a halogenated alkyl group; and a derivative thereof. Examples of the derivative thereof include a derivative obtained by substituting the hydrogen atom of a hydroxyl group of an object compound in which a hydrogen atom at the α-position may be substituted with a substituent, with an organic group; and a derivative obtained by bonding a substituent other than a hydroxyl group to an object compound in which a hydrogen atom at the α-position may be substituted with a substituent. The α-position refers to the first carbon atom adjacent to the functional group unless otherwise specified.

Examples of the substituent that is substituted for the hydrogen atom at the α-position of hydroxystyrene include the same group as $R^{\alpha x}$.

In the present specification and the scope of the present claims, asymmetric carbon atoms may be present, and thus enantiomers or diastereomers may be present depending on the structures of the chemical formula. In that case, these isomers are represented by one chemical formula. These isomers may be used alone or in the form of a mixture.

(Resist Composition)

The resist composition according to the present embodiment is a resist composition that generates an acid upon exposure and exhibiting changed solubility in a developing solution under action of acid.

Such a resist composition contains a base material component (A) (hereinafter, also referred to as a "component (A)") exhibiting changed solubility in a developing solution under action of acid, acid generator component (B) (hereinafter, also referred to as a "component (B)") that generates an acid upon exposure, and a base component (D) (hereinafter, also referred to as a "component (D)").

In a case where a resist film is formed using the resist composition according to the present embodiment and the formed resist film is subjected to selective exposure, an acid is generated at the exposed part of the resist film, and the generated acid acts on the component (A) to change the solubility of the component (A) in a developing solution, whereas the solubility of the component (A) in a developing solution is not changed at the unexposed part of the resist film, thereby that generates the difference in solubility in the developing solution between the exposed part and the unexposed part of the resist film.

The resist composition according to the present embodiment may be a positive-tone resist composition or a negative-tone resist composition.

Further, in the formation of a resist pattern, the resist composition according to the present embodiment can be applied to an alkali developing process using an alkali developing solution in the developing treatment, or a solvent developing process using an organic developing solution in the developing treatment.

That is, the resist composition according to the present embodiment is a "positive-tone resist composition for an alkali developing process" that forms a positive-tone resist pattern in an alkali developing process and is a "negative-tone resist composition for a solvent developing process" that forms a negative-tone resist pattern in a solvent developing process.

<Component (A)>

In the resist composition according to the present embodiment, the component (A) contains a resin component (A1) (hereinafter, also referred to as a "component (A1)") exhibiting changed solubility in a developing solution under action of acid, and the resin component (A1) has a constitutional unit (a01) derived from a compound represented by General Formula (a01-1) and a constitutional unit (a02) derived from a compound represented by General Formula (a02-1).

As the component (A), at least the component (A1) is used, and at least one of another polymer compound and another low-molecular-weight compound may be used in combination with the component (A1).

In the resist composition according to the present embodiment, the component (A) may be used alone or in a combination of two or more kinds thereof.

In Regard to Component (A1)

The component (A1) has a constitutional unit (a01) and a constitutional unit (a02).

<<Constitutional Unit (a01)>>

The constitutional unit (a01) is a constitutional unit derived from a compound represented by General Formula (a01-1).

(a01-1)

[In the formula, $W^{01}$ represents a polymerizable group-containing group. $C^t$ represents a tertiary carbon atom, and a carbon atom at an α-position of $C^t$ constitutes a carbon-carbon unsaturated bond. $R^{11}$ represents an aromatic hydrocarbon group or a chain-like hydrocarbon group, which may have a substituent. $R^{12}$ and $R^{13}$ each independently represent a chain-like hydrocarbon group which may have a substituent or $R^{12}$ and $R^{13}$ are bonded to each other to form a cyclic group which may have a substituent.]

In General Formula (a01-1), $W^{01}$ represents a polymerizable group-containing group.

The "polymerizable group" as $W^{01}$ is a group that enables a compound having the polymerizable group to be polymerized by radical polymerization or the like, and includes a group containing a multiple bond between carbon atoms, such as an ethylenic double bond.

In the constitutional unit (a01), the multiple bonds in the polymerizable group are cleaved to form a main chain.

Examples of the polymerizable group as $W^{01}$ include a vinyl group, an allyl group, acryloyl group, a methacryloyl group, a fluorovinyl group, a difluorovinyl group, a trifluorovinyl group, a difluorotrifluoromethylvinyl group, a trifluoroallyl group, a perfluoroallyl group, a trifluoromethylacryloyl group, a nonylfluorobutylacryloyl group, a vinyl ether group, a fluorine-containing vinyl ether group, an allyl ether group, a fluorine-containing allyl ether group, a styryl group, and a vinylnaphthyl group, a fluorine-containing styryl group, a fluorine-containing vinylnaphthyl group, a norbornyl group, a fluorine-containing norbornyl group, and a silyl group.

The "polymerizable group-containing group" as $W^{01}$ may be a group composed of only a polymerizable group, or a group composed of a polymerizable group and a group other than the polymerizable group. Examples of the group other than the polymerizable group include a divalent hydrocarbon group which may have a substituent and a divalent linking group containing a hetero atom.

Divalent Hydrocarbon Group which May have Substituent:

In a case where the group other than the polymerizable group represents a divalent hydrocarbon group which may have a substituent, the hydrocarbon group may be an aliphatic hydrocarbon group or an aromatic hydrocarbon group.

Aliphatic Hydrocarbon Group as a Group Other than the Polymerizable Group

The aliphatic hydrocarbon group indicates a hydrocarbon group that has no aromaticity. The aliphatic hydrocarbon group may be saturated or unsaturated. In general, it is preferable that the aliphatic hydrocarbon group be saturated.

Examples of the aliphatic hydrocarbon group include a linear or branched aliphatic hydrocarbon group, and an aliphatic hydrocarbon group containing a ring in the structure thereof.

Linear or Branched Aliphatic Hydrocarbon Group

The linear aliphatic hydrocarbon group preferably has 1 to 10 carbon atoms, more preferably 1 to 6 carbon atoms, still more preferably 1 to 4 carbon atoms, and most preferably 1 to 3 carbon atoms.

The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group has preferably 2 to 10 carbon atoms, more preferably 3 to 6 carbon atoms, still more preferably 3 or 4 carbon atoms, and most preferably 3 carbon atoms.

The branched aliphatic hydrocarbon group is preferably a branched alkylene group, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. The alkyl group in the alkylalkylene group is preferably a linear alkyl group having 1 to 5 carbon atoms.

The linear or branched aliphatic hydrocarbon group may have or may not have a substituent. Examples of the substituent include a fluorine atom, a fluorinated alkyl group having 1 to 5 carbon atoms, which has been substituted with a fluorine atom, and a carbonyl group.

Aliphatic Hydrocarbon Group Containing Ring in Structure Thereof

Examples of the aliphatic hydrocarbon group containing a ring in the structure thereof include a cyclic aliphatic hydrocarbon group which may have a substituent containing a hetero atom in the ring structure thereof (a group obtained by removing two hydrogen atoms from an aliphatic hydrocarbon ring), a group obtained by bonding the cyclic aliphatic hydrocarbon group to the terminal of a linear or branched aliphatic hydrocarbon group, and a group obtained by interposing the cyclic aliphatic hydrocarbon group in a linear or branched aliphatic hydrocarbon group. Examples of the linear or branched aliphatic hydrocarbon group include the same groups as those described above.

The cyclic aliphatic hydrocarbon group preferably has 3 to 20 carbon atoms and more preferably 3 to 12 carbon atoms.

The cyclic aliphatic hydrocarbon group may be a polycyclic group or a monocyclic group. The monocyclic alicyclic hydrocarbon group is preferably a group obtained by removing two hydrogen atoms from a monocycloalkane. The monocycloalkane preferably has 3 to 6 carbon atoms, and specific examples thereof include cyclopentane and cyclohexane. The polycyclic alicyclic hydrocarbon group is preferably a group obtained by removing two hydrogen atoms from a polycycloalkane, and the polycycloalkane is preferably a group having 7 to 12 carbon atoms. Specific examples of the polycyclic alicyclic hydrocarbon group include adamantane, norbornane, isobornane, tricyclodecane, and tetracyclododecane.

The cyclic aliphatic hydrocarbon group may have or may not have a substituent. Examples of the substituent include an alkyl group, an alkoxy group, a halogen atom, a halogenated alkyl group, a hydroxyl group, and a carbonyl group.

The alkyl group as the substituent is preferably an alkyl group having 1 to 5 carbon atoms, and most preferably a methyl group, an ethyl group, a propyl group, an n-butyl group, or a tert-butyl group.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

Examples of the halogen atom for the substituent include a fluorine atom, a chlorine atom, a bromine atom, and an iodine atom, and a fluorine atom is preferable.

Examples of the halogenated alkyl group as the substituent include a group obtained by substituting part or all of hydrogen atoms in the above-described alkyl groups with the above-described halogen atoms.

In the cyclic aliphatic hydrocarbon group, a part of carbon atoms constituting the ring structure thereof may be substituted with a substituent containing a hetero atom. The substituent containing a hetero atom is preferably —O—, —C(=O)—O—, —S—, —S(=O)$_2$—, or —S(=O)$_2$—O—.

Aromatic Hydrocarbon Group as a Group Other than the Polymerizable Group

The aromatic hydrocarbon group is a hydrocarbon group having at least one aromatic ring.

The aromatic ring is not particularly limited as long as it is a cyclic conjugated system having (4n+2) π electrons, and it may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms. Here, the number of carbon atoms in a substituent is not included in the number of carbon atoms. Specific examples of the aromatic ring include aromatic hydrocarbon rings such as benzene, naphthalene, anthracene, and phenanthrene; and an aromatic heterocyclic ring obtained by substituting a part of carbon atoms constituting the above-described aromatic hydrocarbon ring with a hetero atom. Examples of the hetero atom in the aromatic heterocyclic rings include an oxygen atom, a sulfur atom, and a nitrogen atom. Specific examples of the aromatic heterocyclic ring include a pyridine ring and a thiophene ring.

Specific examples of the aromatic hydrocarbon group include a group (an arylene group or a heteroarylene group) obtained by removing two hydrogen atoms from the above-described aromatic hydrocarbon ring or the above-described aromatic heterocyclic ring; a group obtained by removing two hydrogen atoms from an aromatic compound (for example, biphenyl or fluorene) having two or more aromatic rings; and a group (for example, a group obtained by further removing one hydrogen atom from an aryl group in the arylalkyl group such as a benzyl group, a phenethyl group, a 1-naphthylmethyl group, a 2-naphthylmethyl group, a 1-naphthylethyl group, or a 2-naphthylethyl group) obtained by substituting one hydrogen atom of a group (an aryl group or a heteroaryl group) obtained by removing one hydrogen atom from the above aromatic hydrocarbon ring or the above aromatic heterocyclic ring, with an alkylene group. The alkylene group bonded to the aryl group or the heteroaryl group preferably has 1 to 4 carbon atoms, more preferably 1 or 2 carbon atoms, and particularly preferably 1 carbon atom.

With respect to the aromatic hydrocarbon group, the hydrogen atom which the aromatic hydrocarbon group has may be substituted with a substituent. For example, the hydrogen atom bonded to the aromatic ring in the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group having 1 to 5 carbon atoms, and most preferably a methyl group, an ethyl group, a propyl group, an n-butyl group, or a tert-butyl group.

Examples of the alkoxy group, the halogen atom, and the halogenated alkyl group, as the substituent, include the same groups as those exemplified as the substituent that is substituted for a hydrogen atom which the cyclic aliphatic hydrocarbon group has.

Divalent Linking Group Containing Hetero Atom

In a case where the group other than the polymerizable group represents a divalent linking group containing a hetero atom, preferred examples of the linking group include —O—, —C(=O)—O—, —C(=O)—, —O—C(=O)—O—C(=O)—NH—, —NH—, —NH—C(=NH)—(H may be substituted with a substituent such as an alkyl group, an acyl group, or the like), —S(=O)$_2$—, —S(=O)$_2$—O—, and a group represented by General Formula: —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$—, —Y$^{21}$—O—C(=O)—Y$^{22}$— or —Y$^{21}$—S(=O)$_2$—O—Y$^{22}$—[in the formulae, Y$^{21}$ and Y$^{22}$ each independently represent a divalent hydrocarbon group which may have a substituent, O represents an oxygen atom, and m" represents an integer in a range of 0 to 3].

In a case where the divalent linking group containing a hetero atom is —C(=O)—NH—, —C(=O)—NH—C(=O)—, —NH—, or —NH—C(=NH)—, H may be substituted with a substituent such as an alkyl group, an acyl group, or the like. The substituent (an alkyl group, an acyl group, or the like) preferably has 1 to 10 carbon atoms, more preferably 1 to 8 carbon atoms, and most preferably 1 to 5 carbon atoms.

In General Formulae —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$—, and —Y$^{21}$—S(=O)$_2$—O—Y$^{22}$—, Y$^{21}$, and Y$^{22}$ each independently represent a divalent hydrocarbon group which may have a substituent. Examples of the divalent hydrocarbon group include those (mentioned as the divalent hydrocarbon group which may have a substituent) in the explanation of the above-described divalent linking group.

Y$^{21}$ is preferably a linear aliphatic hydrocarbon group, more preferably a linear alkylene group, still more preferably a linear alkylene group having 1 to 5 carbon atoms, and particularly preferably a methylene group or an ethylene group.

Y$^{22}$ is preferably a linear or branched aliphatic hydrocarbon group and more preferably a methylene group, an ethylene group, or an alkylmethylene group. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula —[Y$^{21}$—C(=O)—O]$_{m''}$—Y$^{22}$—, m" represents an integer in a range of 0 to 3, preferably an integer in a range of 0 to 2, more preferably 0 or 1, and particularly preferably 1. In other words, it is particularly preferable that the group represented by Formula —[Y$^{21}$—C(=O)—O]$_{m''}$—Y$^{22}$— represent a group represented by Formula —Y$^{21}$—C(=O)—O—Y$^{22}$—. Among them, a group represented by Formula —(CH$_2$)$_{a'}$—C(=O)—O—(CH$_2$)$_{b'}$— is preferable. In the formula, a' represents an integer in a range of 1 to 10, preferably an integer in a range of 1 to 8, more preferably an integer in a range of 1 to 5, still more preferably 1 or 2, and most preferably 1. b' represents an integer in a range of 1 to 10, preferably an integer in a range of 1 to 8, more preferably an integer in a range of 1 to 5, still more preferably 1 or 2, and most preferably 1.

Suitable examples of W$^{01}$ include a group represented by a chemical formula:

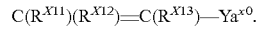

$$C(R^{X11})(R^{X12})=C(R^{X13})-Ya^{x0}.$$

In the chemical formula, R$^{X11}$, R$^{X12}$, and R$^{X13}$ each represent a hydrogen atom, an alkyl group having 1 to 5 carbon atoms, or a halogenated alkyl group having 1 to 5 carbon atoms, and Ya$^{x0}$ represents a single bond or a divalent linking group.

The alkyl group having 1 to 5 carbon atoms as R$^{X11}$, R$^{X12}$, and R$^{X13}$ is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group obtained by substituting part or all of hydrogen atoms in the alkyl group having 1 to 5 carbon atoms with a halogen atom. The halogen atom is particularly preferably a fluorine atom.

Among these, R$^{X11}$ and R$^{X12}$ are each preferably a hydrogen atom, an alkyl group having 1 to 5 carbon atoms, or a fluorinated alkyl group having 1 to 5 carbon atoms, and in terms of industrial availability, a hydrogen atom or a methyl group is more preferable, and a hydrogen atom is particularly preferable.

In addition, $R^{x13}$ is preferably a hydrogen atom, an alkyl group having 1 to 5 carbon atoms, or a fluorinated alkyl group having 1 to 5 carbon atoms, and in terms of industrial availability, a hydrogen atom or a methyl group is more preferable.

The divalent linking group as $Ya^{x0}$ is not particularly limited, and suitable examples thereof include a divalent hydrocarbon group which may have a substituent and a divalent linking group having a hetero atom, each of which is the same as that described above.

Among the above, $Ya^{x0}$ is preferably an ester bond [—C(=O)—O— or —O—C(=O)—], an ether bond (—O—), a linear or branched alkylene group, an aromatic hydrocarbon group, or a combination thereof, or a single bond. Among these, $Ya^{x0}$ is more preferably a combination of an ester bond [—C(=O)—O— or —O—C(=O)—] and a linear alkylene group or a single bond.

In General Formula (a01-1), $C^t$ represents a tertiary carbon atom, and a carbon atom at an α-position of $C^t$ constitutes a carbon-carbon unsaturated bond.

The "α-position of $C^t$" means the first carbon atom adjacent to the carbon atom ($C^t$) bonded to the oxy group (—O—) in General Formula (a01-1).

The "—$C^t(R^{11})(R^{12})(R^{13})$" in General Formula (a01-1) represents an acid-dissociable group. Such an acid-dissociable group protects the oxy group (—O—) side of the carbonyloxy group [—C(=O)—O—] in General Formula (a01-1). Here, the "acid-dissociable group" has acid dissociability, which means a bond between the acid-dissociable group and an oxygen atom (O) adjacent to the acid-dissociable group can be cleaved under action of acid. In a case where the acid-dissociable group is dissociated under action of acid, a polar group having a higher polarity than the acid-dissociable group is generated, and thus the polarity is increased. As a result, the polarity of the entire component (A1) is increased. By the increase in the polarity, the solubility in a developing solution relatively changes. The solubility in a developing solution is increased in a case where the developing solution is an alkali developing solution, whereas the solubility in a developing solution is decreased in a case where the developing solution is an organic developing solution.

In General Formula (a01-1), at least one of $R^{11}$, $R^{12}$, and $R^{13}$ represents a group in which the carbon atom at the α-position of $C^t$ constitutes a carbon-carbon unsaturated bond.

In General Formula (a01-1), $R^{11}$ represents an aromatic hydrocarbon group or a chain-like hydrocarbon group, which may have a substituent.

Examples of the aromatic hydrocarbon group as $R^{11}$ include a group obtained by removing one hydrogen atom from an aromatic hydrocarbon ring having 5 to 30 carbon atoms. Among them, $R^{11}$ is preferably a group obtained by removing one hydrogen atom from an aromatic hydrocarbon ring having 6 to 15 carbon atoms, more preferably a group obtained by removing one hydrogen atom from benzene, naphthalene, anthracene, or phenanthrene, still more preferably a group obtained by removing one hydrogen atom from benzene, naphthalene, or anthracene, particularly preferably a group obtained by removing one hydrogen atom from benzene or naphthalene, and most preferably a group obtained by removing one hydrogen atom from benzene.

Examples of the substituent which $R^{11}$ may have include a methyl group, an ethyl group, propyl group, a hydroxy group, a carboxy group, a halogen atom (a fluorine atom, a chlorine atom, a bromine atom, and the like), an alkoxy group (a methoxy group, an ethoxy group, a propoxy group, a butoxy group, and the like), and an alkyloxycarbonyl group.

The chain-like hydrocarbon group as $R^{11}$ may be a saturated hydrocarbon group or an unsaturated hydrocarbon group and may be linear or branched.

The linear saturated hydrocarbon group (the alkyl group) as $R^{11}$ preferably has 1 to 10 carbon atoms, more preferably 1 to 5 carbon atoms, still more preferably 1 or 4 carbon atoms, and particularly preferably 1 or 2 carbon atoms. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The branched alkyl group as $R^{11}$ preferably has 3 to 10 carbon atoms and more preferably 3 to 5 carbon atoms. Specific examples thereof include an isopropyl group, an isobutyl group, a tert-butyl group, an isopentyl group, a neopentyl group a 1,1-diethylpropyl group, and a 2,2-dimethylbutyl group. Among these, an isopropyl group is preferable.

Examples of the unsaturated hydrocarbon group as $R^{11}$ include an alkenyl group.

The alkenyl group as $R^{11}$ preferably has 2 to 10 carbon atoms, more preferably 2 to 5 carbon atoms, still more preferably 2 to 4 carbon atoms, and particularly preferably 3 carbon atoms. Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group. Among the above, the chain-like alkenyl group is preferably a linear alkenyl group, more preferably a vinyl group or a propenyl group, and particularly preferably a vinyl group.

In General Formula (a01-1), $R^{12}$ and $R^{13}$ each independently represent a chain-like hydrocarbon group which may have a substituent, or $R^{12}$ and $R^{13}$ are bonded to each other to form a cyclic group which may have a substituent.

The chain-like hydrocarbon groups as $R^{12}$ and $R^{13}$ are the same as the chain-like hydrocarbon groups as $R^{11}$. In addition, the substituent which the chain-like hydrocarbon groups as $R^{12}$ and $R^{13}$ may have is the same group as the substituent which the chain-like hydrocarbon groups as $R^{11}$ may have.

In a case where $R^{12}$ and $R^{13}$ are bonded to each other to form a cyclic group (a cyclic hydrocarbon group), the cyclic group may be a polycyclic group or a monocyclic group. In addition, the cyclic group may be an alicyclic hydrocarbon group or a condensed polycyclic hydrocarbon group obtained by condensing an aromatic ring with an alicyclic hydrocarbon group.

Further, in the cyclic aliphatic hydrocarbon group, a part of carbon atoms constituting the ring structure thereof may be substituted with a substituent containing a hetero atom. The substituent containing a hetero atom is preferably —O—, —C(=O)—O—, —S—, —S(=O)$_2$—, or —S(=O)$_2$—O—.

The aliphatic hydrocarbon group which is a monocyclic group is preferably a group obtained by removing one hydrogen atom from a monocycloalkane or a monocycloalkene. The monocycloalkane preferably has 3 to 6 carbon atoms, and specific examples thereof include cyclopentane and cyclohexane. The monocycloalkene preferably has 3 to 6 carbon atoms, and specific examples thereof include cyclopentene and cyclohexene.

The aliphatic hydrocarbon group which is a polycyclic group is preferably a group obtained by removing one hydrogen atom from a polycycloalkane or a polycycloalkene. The polycycloalkane preferably has 7 to 12 carbon atoms, and specific examples thereof include adamantane, norbornane, isobornane, tricyclodecane, and tetracyclododecane. In addition, the polycycloalkene is preferably a group having 7 to 12 carbon atoms. Specific examples thereof include adamantene, norbornene, isobornene, tricyclodecene, and tetracyclododecene.

Examples of the condensed polycyclic hydrocarbon group obtained by condensing an aromatic ring with an alicyclic hydrocarbon group include a group obtained by removing one hydrogen atom from an aliphatic ring of a bicyclic compound such as tetrahydronaphthalene or indane.

The cyclic group formed by bonding $R^{12}$ and $R^{13}$ to each other may have a substituent. Examples of the substituent, which the cyclic hydrocarbon group that is formed by $Xa^0$ together with $Ya^0$ may have, include —$R^{P1}$, —$R^{P2}$—O—$R^{P1}$, —$R^{P2}$—CO—$R^{P1}$, —$R^{P2}$—CO—$OR^{P1}$, —$R^{P2}$—O—CO—$R^{P1}$, —$R^{P2}$—OH, —$R^{P2}$—CN, and —$R^{P2}$—COOH (hereinafter, these substituents are also collectively referred to as "$Ra^{06}$").

Here, $R^{P1}$ represents a monovalent chain-like saturated hydrocarbon group having 1 to 10 carbon atoms, a monovalent aliphatic cyclic saturated hydrocarbon group having 3 to 20 carbon atoms, or a monovalent aromatic hydrocarbon group having 6 to 30 carbon atoms. In addition, $R^{P2}$ represents a single bond, a divalent chain-like saturated hydrocarbon group having 1 to 10 carbon atoms, a divalent aliphatic cyclic saturated hydrocarbon group having 3 to 20 carbon atoms, or a divalent aromatic hydrocarbon group having 6 to 30 carbon atoms. However, part or all of hydrogen atoms included in the chain-like saturated hydrocarbon group, the aliphatic cyclic saturated hydrocarbon group, and the aromatic hydrocarbon group of $R^{P1}$ and $R^{P2}$ may be substituted with a fluorine atom. In the aliphatic cyclic hydrocarbon group, one or more of the above-described substituents may be included as a single kind, or one or more of the above-described substituents may be included as a plurality of kinds.

Examples of the monovalent chain-like saturated hydrocarbon group having 1 to 10 carbon atoms include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms include monocyclic aliphatic saturated hydrocarbon groups such as a cyclopropyl group, a cyclobutyl group, a cyclopentyl group, a cyclohexyl group, a cycloheptyl group, a cyclooctyl group, a cyclodecyl group, and cyclododecyl group; and polycyclic aliphatic saturated hydrocarbon groups such as a bicyclolo[2.2.2]octanyl group, a tricyclo[5.2.1.02,6]decanyl group, a tricyclo[3.3.1.13,7]decanyl group, a tetracyclo [6.2.1.13,6.02,7]dodecanyl group, and an adamantyl group.

Examples of the monovalent aromatic hydrocarbon group having 6 to 30 carbon atoms include groups obtained by removing one hydrogen atom from an aromatic hydrocarbon ring such as benzene, biphenyl, fluorene, naphthalene, anthracene, and phenanthrene.

Among them, the cyclic group formed by bonding of $R^{12}$ and $R^{13}$ to each other is preferably an alicyclic hydrocarbon group which may have a substituent, more preferably an aliphatic hydrocarbon group that is a monocyclic group, which may have a substituent, still more preferably a group obtained by removing one hydrogen atom from a monocycloalkane or a monocycloalkene, and, from the viewpoint of reactivity, particularly preferably a group obtained by removing one hydrogen atom from cyclopentane or cyclopentene.

Among the above, the constitutional unit (a01) is preferably a constitutional unit derived from a compound represented by General Formula (a01-1-1).

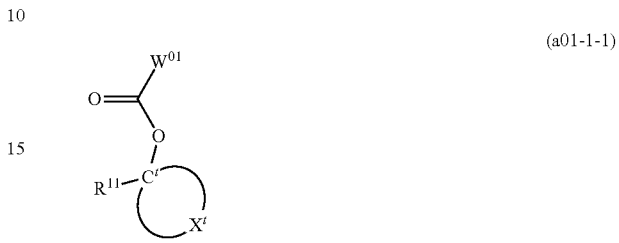

(a01-1-1)

[In the formula, $W^{01}$ represents a polymerizable group-containing group. $C^t$ represents a tertiary carbon atom, and a carbon atom at an α-position of $C^t$ constitutes a carbon-carbon unsaturated bond. $R^{11}$ represents an aromatic hydrocarbon group or a chain-like hydrocarbon group, which may have a substituent. $X^t$ represents a group that forms a cyclic hydrocarbon group together with $C^t$. Part or all of hydrogen atoms which the cyclic hydrocarbon group has may be substituted with a substituent.]

$W^{01}$ and $C^t$ in General Formula (a01-1-1) are each the same as $W^{01}$ and $C^t$ in General Formula (a01-1) described above.

Examples of the cyclic hydrocarbon group formed by $X^t$ and $C^t$ of General Formula (a01-1-1) include the same group as the cyclic group (cyclic hydrocarbon group) formed by bonding $R^{12}$ and $R^{13}$ of General Formula (a01-1) to each other.

Among the above, the constitutional unit (a01) is more preferably a constitutional unit represented by General Formula (a01-1-11).

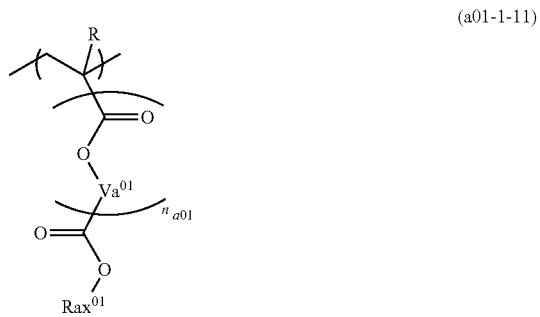

(a01-1-11)

[In the formula, R represents a hydrogen atom, an alkyl group having 1 to 5 carbon atoms, or a halogenated alkyl group having 1 to 5 carbon atoms. $Va^{01}$ represents a divalent hydrocarbon group which may have an ether bond. $n_{a01}$ represents an integer in a range of 0 to 2. $Rax^{01}$ is a group represented by General Formula (a0-r-1), a group represented by General Formula (a0-r-2), or a group represented by General Formula (a0-r-3).]

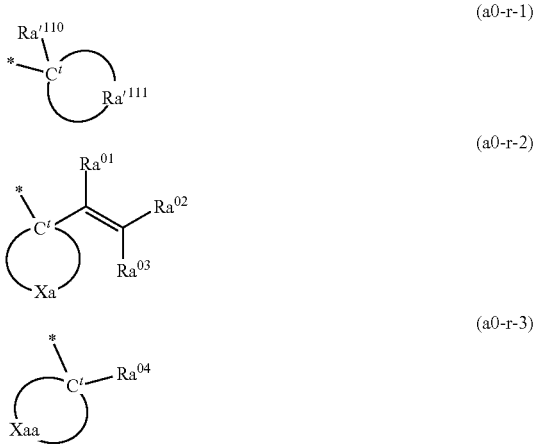

[In General Formula (a0-r-1), $C^t$ represents a tertiary carbon atom. $Ra'^{110}$ represents a linear or branched alkyl group having 1 to 12 carbon atoms, a part of which may be substituted with a halogen atom or a hetero atom-containing group. $Ra'^{111}$ represents a group that forms a monocyclic alicyclic hydrocarbon group together with $C^t$. Part or all of hydrogen atoms which the monocyclic alicyclic hydrocarbon group has may be substituted with a substituent. However, in the monocyclic alicyclic hydrocarbon group, a carbon atom at an α-position of $C^t$ constitutes a carbon-carbon unsaturated bond.

In General Formula (a0-r-2), $C^t$ represents a tertiary carbon atom. Xa represents a group that forms a monocyclic alicyclic hydrocarbon group together with $C^t$. Part or all of hydrogen atoms which the monocyclic alicyclic hydrocarbon group has may be substituted with a substituent. $Ra^{01}$ to $Ra^{03}$ each independently represent a hydrogen atom, a monovalent chain-like saturated hydrocarbon group having 1 to 10 carbon atoms, or a monovalent aliphatic cyclic saturated hydrocarbon group having 3 to 20 carbon atoms. Part or all of hydrogen atoms which the chain-like saturated hydrocarbon group and the aliphatic cyclic saturated hydrocarbon group have may be substituted with a substituent. Two or more of $Ra^{01}$ to $Ra^{03}$ may be bonded to each other to form an aliphatic ring structure but do not form a crosslinked structure.

In General Formula (a0-r-3), $C^t$ represents a tertiary carbon atom. Xaa forms a monocyclic aliphatic cyclic group together with $C^t$. Part or all of hydrogen atoms which the monocyclic aliphatic cyclic group has may be substituted with a substituent. $Ra^{04}$ represents an aromatic hydrocarbon group which may have a substituent. * represents a bond.]

In General Formula (a01-1-11), the alkyl group having 1 to 5 carbon atoms as R is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group obtained by substituting part or all of hydrogen atoms in the alkyl group having 1 to 5 carbon atoms with a halogen atom. The halogen atom is particularly preferably a fluorine atom.

R is preferably a hydrogen atom, an alkyl group having 1 to 5 carbon atoms, or a fluorinated alkyl group having 1 to 5 carbon atoms, and most preferably a hydrogen atom or a methyl group in terms of industrial availability.

In General Formula (a01-1-11), the divalent hydrocarbon group as $Va^{01}$ is the same as the divalent hydrocarbon group as $Ya^{x0}$, exemplified in the explanation of $W^{01}$ in General Formula (a01-1).

In General Formula (a01-1-11), $n_{a01}$ represents an integer in a range of 0 to 2, preferably 0 or 1, and more preferably 0.

In General Formula (a0-r-1), $Ra'^{110}$ represents a linear or branched alkyl group having 1 to 12 carbon atoms, a part of which may be substituted with a halogen atom or a hetero atom-containing group.

The linear alkyl group as $Ra'^{110}$ has 1 to 12 carbon atoms, and preferably has 1 to 10 carbon atoms and particularly preferably 1 to 5 carbon atoms. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The branched alkyl group as $Ra'^{110}$ preferably has 3 to 10 carbon atoms and particularly preferably has 3 to 6 carbon atoms. Specific examples thereof include an isopropyl group, an isobutyl group, a tert-butyl group, an isopentyl group, a neopentyl group, a 1,1-diethylpropyl group, a 1,1-dimethylbutyl group, 1,1-dimethylpentyl group, and a 2,2-dimethylbutyl group. Among these, an isopropyl group or a tert-butyl group is preferable.

A part of the alkyl group as $Ra'^{110}$ may be substituted with a halogen atom or a hetero atom-containing group. For example, a part of the hydrogen atoms constituting the alkyl group may be substituted with a halogen atom or a hetero atom-containing group. Further, a part of carbon atoms (such as methylene group) constituting the alkyl group may be substituted with a hetero atom-containing group.

Examples of the hetero atom mentioned here include an oxygen atom, a sulfur atom, and a nitrogen atom. Examples of the hetero atom-containing group include an oxygen atom (—O—), —C(=O)—O—, —O—C(=O)—, —C(=O)—, —O—C(=O)—O—, —C(=O)—NH—, —NH—, —S—, —S(=O)$_2$—, and —S(=O)$_2$—O—.

In General Formula (a0-r-1), $C^t$ represents a tertiary carbon atom.

In General Formula (a0-r-1), $Ra'^{111}$ represents a group forming a monocyclic alicyclic hydrocarbon group together with $C^t$. Part or all of hydrogen atoms which the aliphatic cyclic group has may be substituted with a substituent.

Examples of the monocyclic alicyclic hydrocarbon group that is formed by $Ra'^{111}$ and $C^t$ include a group obtained by removing two or more hydrogen atoms from a monocycloalkane. The monocycloalkane preferably has 3 to 10 carbon atoms, more preferably 3 to 8 carbon atoms, and still more preferably 3 to 6 carbon atoms. Specifically, cyclopentane or cyclohexane is preferable, and cyclopentane is more preferable.

In General Formula (a0-r-2), $C^t$ represents a tertiary carbon atom.

In General Formula (a0-r-2), Xa represents a group which forms a monocyclic alicyclic hydrocarbon group together with $C^t$. Part or all of hydrogen atoms which the aliphatic cyclic group has may be substituted with a substituent.

Examples of the monocyclic alicyclic hydrocarbon group formed by Xa and $C^t$ include the same group as $Ra'^{111}$ (the monocyclic aliphatic cyclic group formed together with C) in General Formula (a0-r-1).

Examples of the substituent, which the aliphatic cyclic group that is formed by Xa and C may have, include the same group as $Ra^{06}$ described above.

In General Formula (a0-r-2), $Ra^{01}$ to $Ra^{03}$ each independently represent a hydrogen atom, a monovalent chain-like saturated hydrocarbon group having 1 to 10 carbon atoms, or a monovalent aliphatic cyclic saturated hydrocarbon group having 3 to 20 carbon atoms. Part or all of hydrogen atoms which the chain-like saturated hydrocarbon group and the aliphatic cyclic saturated hydrocarbon group have may be substituted with a substituent. Two or more of $Ra^{01}$ to $Ra^{03}$ may be bonded to each other to form an aliphatic ring structure but do not form a crosslinked structure.

In General Formula (a0-r-2), examples of the monovalent chain-like saturated hydrocarbon group having 1 to 10 carbon atoms, as $Ra^{01}$ to $Ra^{03}$, include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms, as $Ra^{01}$ to $Ra^{03}$, include monocyclic aliphatic saturated hydrocarbon groups such as a cyclopropyl group, a cyclobutyl group, a cyclopentyl group, a cyclohexyl group, a cycloheptyl group, a cyclooctyl group, a cyclodecyl group, and a cyclododecyl group.

Among the above, $Ra^{01}$ to $Ra^{03}$ are preferably a hydrogen atom or a monovalent chain-like saturated hydrocarbon group having 1 to 10 carbon atoms, and among them, a hydrogen atom, a methyl group, and an ethyl group are more preferable, and a hydrogen atom is particularly preferable from the viewpoint of easy synthesis.

Examples of the substituent which the chain-like saturated hydrocarbon group represented by $Ra^{01}$ to $Ra^{03}$ or the aliphatic cyclic saturated hydrocarbon group has include the same group as $Ra^{06}$ described above.

Examples of the group containing a carbon-carbon double bond generated by forming a cyclic structure, which is obtained by bonding two or more of $Ra^{01}$ to $Ra^{03}$ to each other, include a cyclopentenyl group, a cyclohexenyl group, a methylcyclopentenyl group, a methylcyclohexenyl group, a cyclopentylideneethenyl group, and a cyclohexylideneethenyl group.

In General Formula (a0-r-3), $C^t$ represents a tertiary carbon atom.

In General Formula (a0-r-3), Xaa represents a group which forms a monocyclic alicyclic hydrocarbon group together with $C^t$. Part or all of hydrogen atoms which the monocyclic alicyclic hydrocarbon group has may be substituted with a substituent.

Examples of the monocyclic alicyclic hydrocarbon group formed by Xaa and $C^t$ include the same group as $Ra'^{111}$ (the monocyclic aliphatic cyclic group formed together with $C^t$) in General Formula (a0-r-1).

Examples of the substituent, which the monocyclic alicyclic hydrocarbon group that is formed by Xaa and may have, include the same group as $Ra^{06}$ described above.

In General Formula (a0-r-3), $Ra^{04}$ represents an aromatic hydrocarbon group which may have a substituent. The aromatic hydrocarbon group as $Ra^{04}$ is preferably a group obtained by removing one or more hydrogen atoms from an aromatic hydrocarbon ring having 6 to 15 carbon atoms and more preferably a group obtained by removing one or more hydrogen atoms from benzene.

Examples of the substituent which $Ra^{04}$ may have include the same group as the substituent which the aromatic hydrocarbon group as $R^{11}$ may have.

Among the above, $Rax^{01}$ in General Formula (a01-1-11) is preferably a group represented by General Formula (a0-r-2) or General Formula (a0-r-3). In a case where $Rax^{01}$ in General Formula (a01-1-11) is a group represented by General Formula (a0-r-2) or a group represented by General Formula (a0-r-3), the reactivity of deprotection of the constitutional unit (a01) is further improved, and thus all of the sensitivity, the roughness reduction property, and the pattern shape are further improved in the resist pattern formation. Further, $Rax^{01}$ in General Formula (a01-1-11) is preferably a group represented by General Formula (a0-r-2) from the viewpoint of further improving the roughness reduction property and more preferably a group represented by General Formula (a0-r-3) from the viewpoint of further improving the sensitivity.

Specific examples of the group represented by General Formula (a0-r-1) are shown below. * represents a bonding site to an oxy group (—O—) in the formula.

(a0-r-1-1)

(a0-r-1-2)

(a0-r-1-3)

(a0-r-1-4)

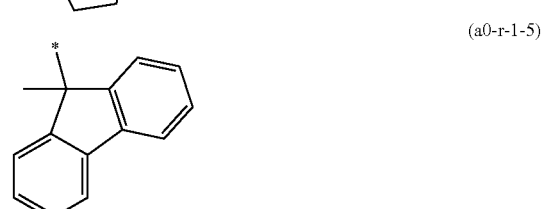
(a0-r-1-5)

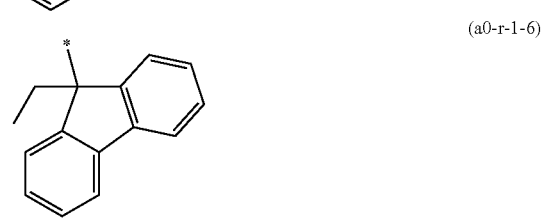
(a0-r-1-6)

(a0-r-1-7)

(a0-r-1-8)

(a0-r-1-9)
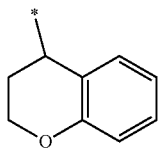
Specific examples of the group represented by General Formula (a0-r-2) are shown below. * represents a bonding site to an oxy group (—O—) in the formula.
(a0-r-2-1)
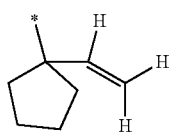
(a0-r-2-2)
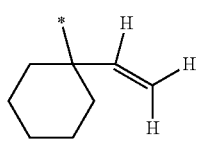
(a0-r-2-3)
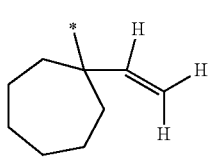
(a0-r-2-4)
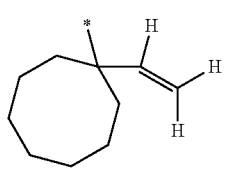
(a0-r-2-5)
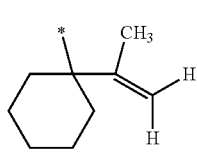
(a0-r-2-6)
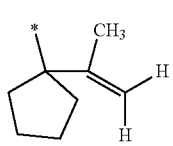
(a0-r-2-7)
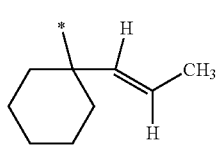
(a0-r-2-8)
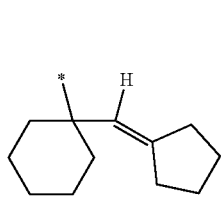
(a0-r-2-9)
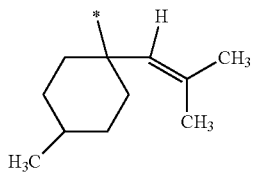
(a0-r-2-10)
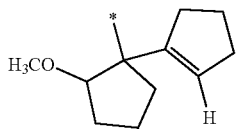
(a0-r-2-11)
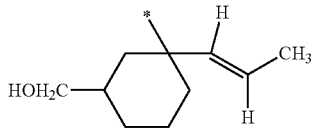
(a0-r-2-12)
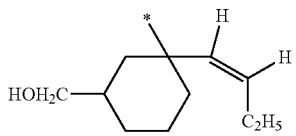
Specific examples of the group represented by General Formula (a0-r-3) are shown below. * represents a bonding site to an oxy group (—O—) in the formula.
(a0-r-3-1)
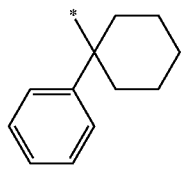
(a0-r-3-2)
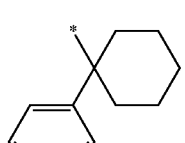
(a0-r-3-3)
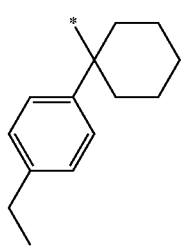
(a0-r-3-4)
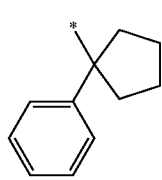

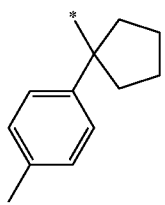 (a0-r-3-5)
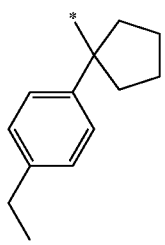 (a0-r-3-6)
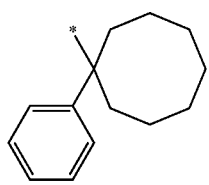 (a0-r-3-7)
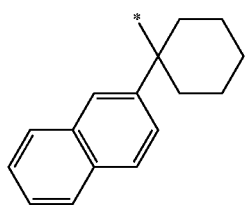 (a0-r-3-8)
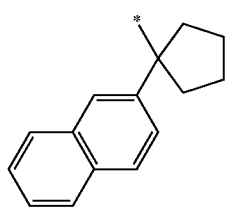 (a0-r-3-9)
Specific examples of the constitutional unit (a01) are shown below. In each of the formulae shown below, $R^\alpha$ represents a hydrogen atom, a methyl group, or a trifluoromethyl group.
(a01-1a-1)
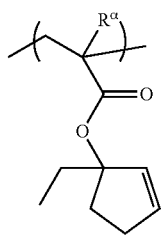 (a01-1a-2)
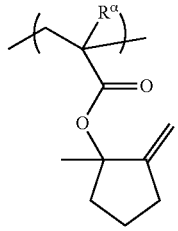 (a01-1a-3)
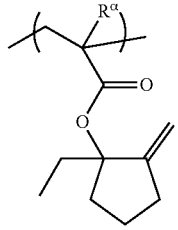 (a01-1a-4)
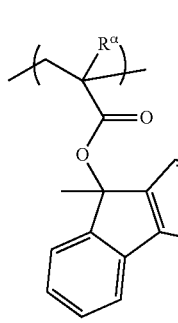 (a01-1a-5)
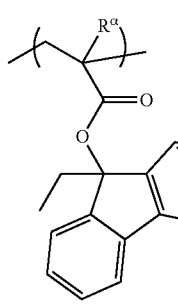 (a01-1a-6)
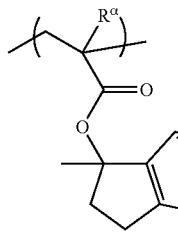 (a01-1a-7)

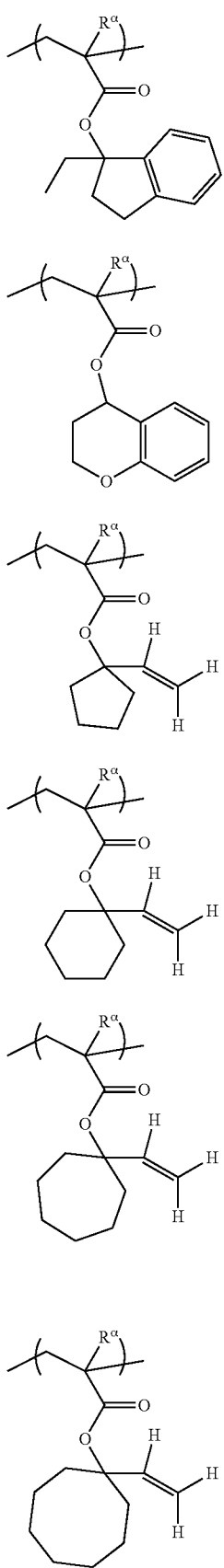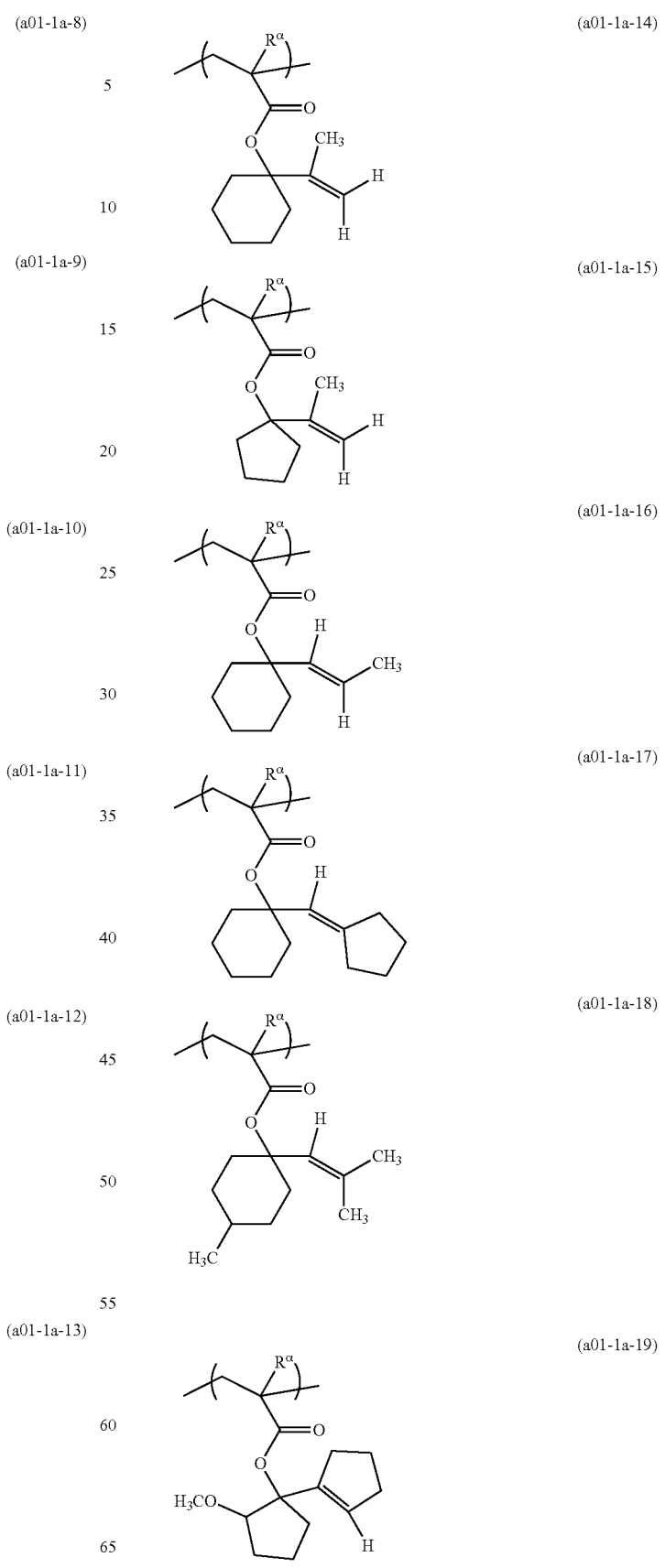

(a01-1a-20)
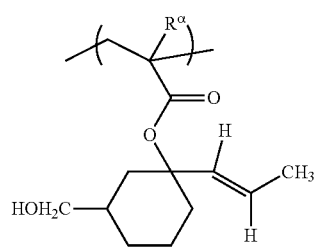
(a01-1a-21)
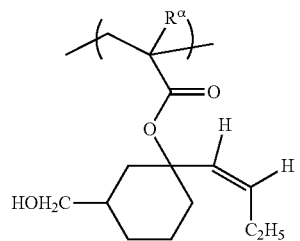
(a01-1a-22)
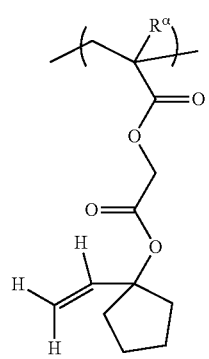
(a01-1a-23)
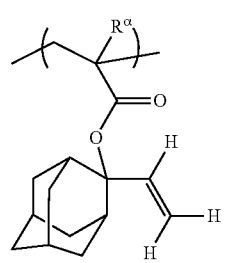
(a01-1a-24)
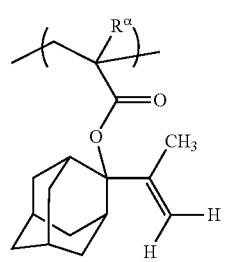
(a01-1a-25)
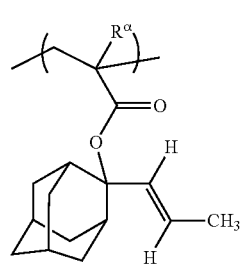
(a01-1a-26)
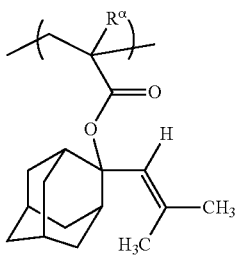
(a01-1a-27)
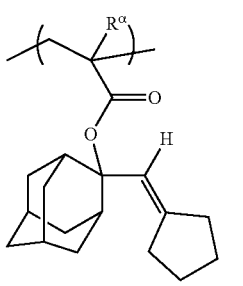
(a01-1a-28)
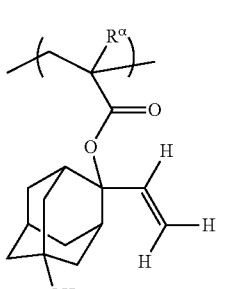
(a01-1a-29)
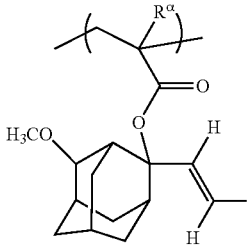
(a01-1a-30)
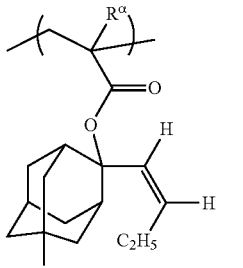
(a01-1a-31)
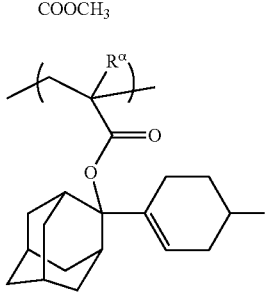

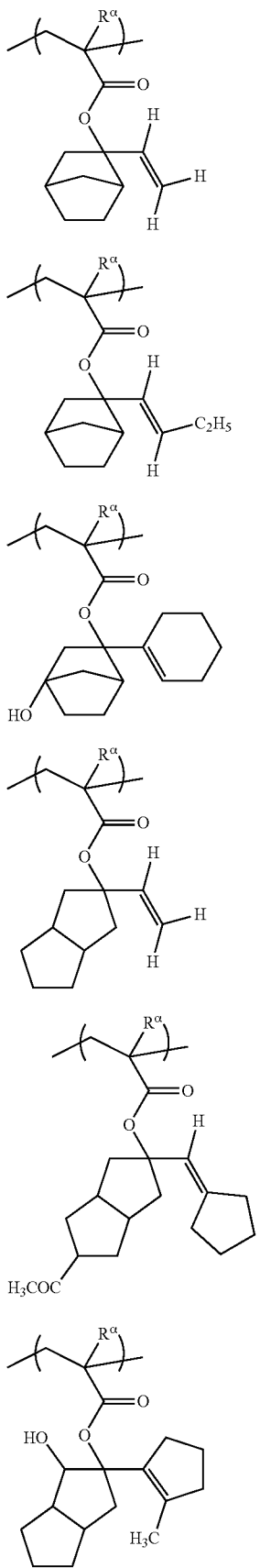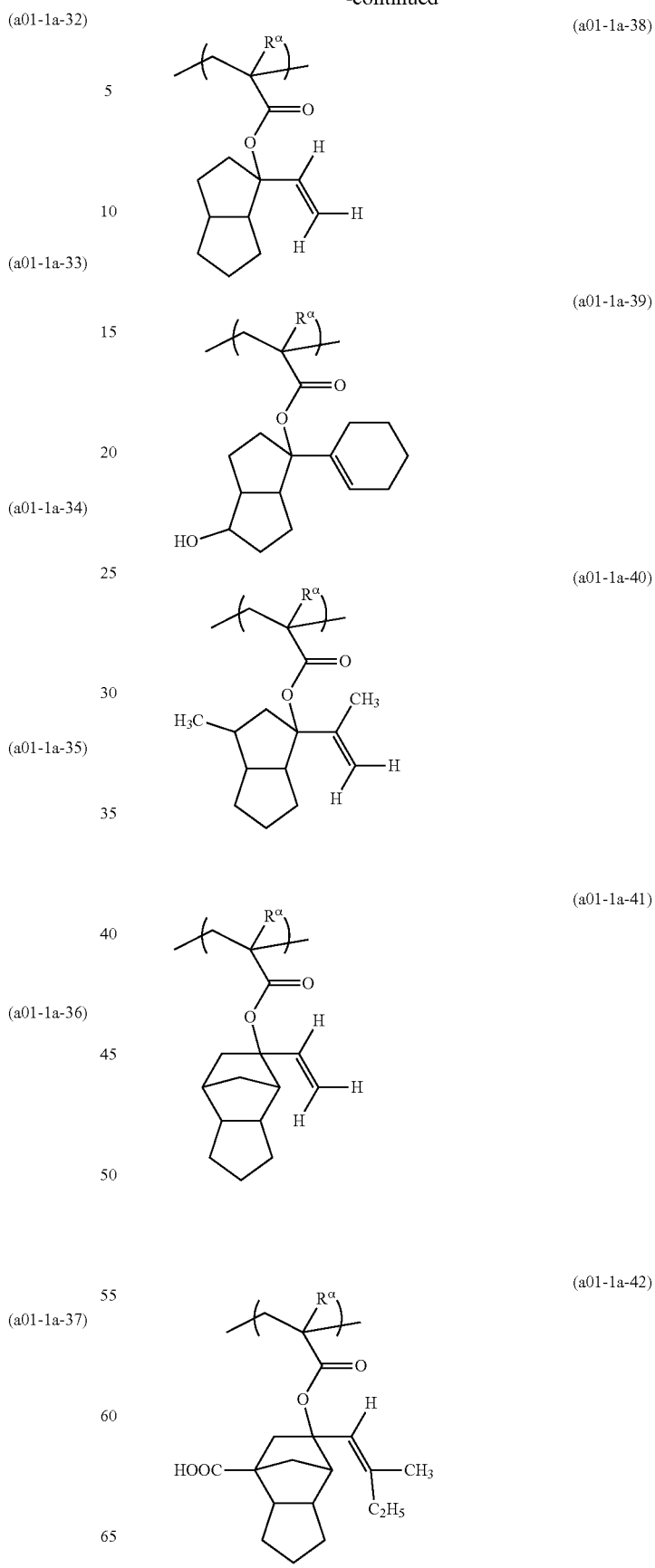

(a01-1a-43)
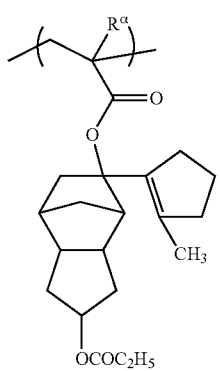
(a01-1a-44)
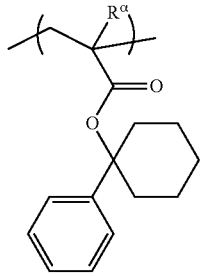
(a01-1a-45)
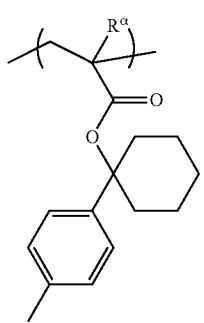
(a01-1a-46)
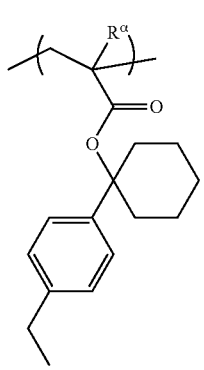
(a01-1a-47)
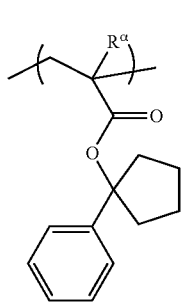
(a01-1a-48)
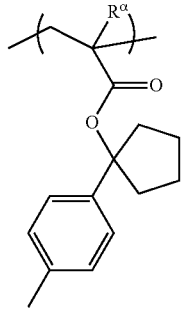
(a01-1a-49)
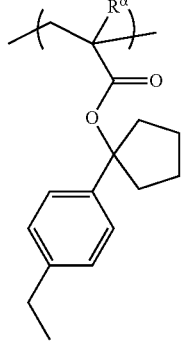
(a01-1a-50)
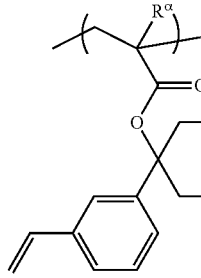
(a01-1a-51)
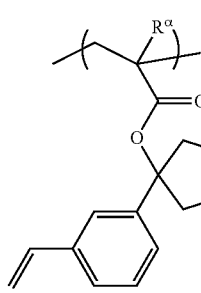
(a01-1a-52)
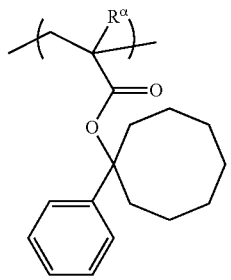

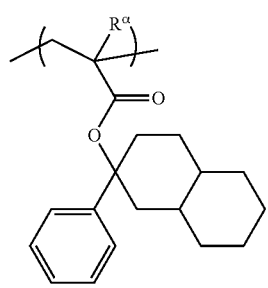 (a01-1a-53)
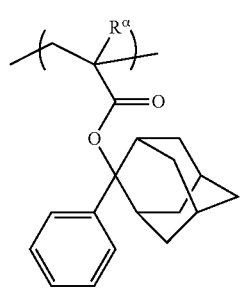 (a01-1a-54)
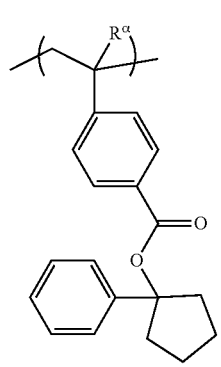 (a01-1a-55)
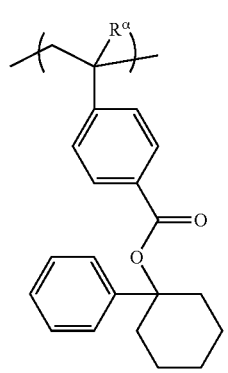 (a01-1a-56)
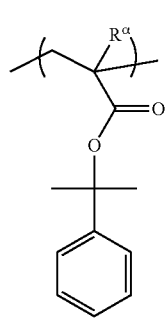 (a01-1a-57)
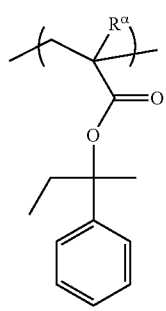 (a01-1a-58)
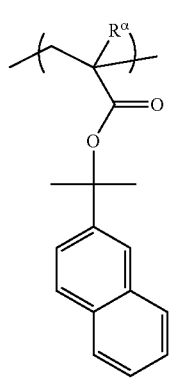 (a01-1a-59)
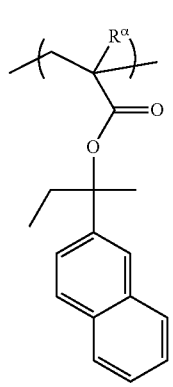 (a01-1a-60)
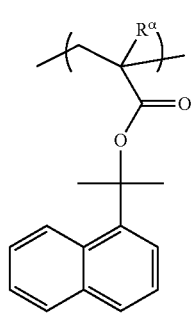 (a01-1a-61)

-continued

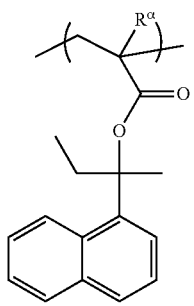

(a01-1a-62)

Among the above, the constitutional unit (a01) is preferably at least one selected from the group consisting of the constitutional units each represented by General Formulas (a01-1a-10) to (a01-1a-56), more preferably least one selected from the group consisting of the constitutional units each represented by General Formula (a01-1a-10) to (a01-1a-22) and (a01-1a-44) to (a01-1a-52), and still more preferably a constitutional unit represented by General Formula (a01-1a-10) or (a01-1a-47).

The constitutional unit (a01) that the component (A1) has may be one kind or may be two or more kinds.

The proportion of the constitutional unit (a01) in the component (A1) is preferably in a range of 20% to 80% by mole, more preferably in a range of 30% to 70% by mole, and still more preferably in a range of 40% to 60% by mole, with respect to the total amount (100% by mole) of all constitutional units constituting the component (A1).

In a case where the proportion of the constitutional unit (a01) is set within the preferred range described above, the efficiency of the deprotection reaction and the solubility of the developing solution can be appropriately ensured, and thus the effects according to the present invention can be more easily obtained.

<<Constitutional Unit (a02)>>

The constitutional unit (a02) is a constitutional unit derived from a compound represented by General Formula (a02-1).

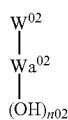

(a02-1)

[In the formula, $W^{02}$ represents a polymerizable group-containing group. $Wa^{02}$ represents an aromatic hydrocarbon group. Part or all of hydrogen atoms which the aromatic hydrocarbon group has may be substituted with a substituent other than a hydroxy group. $Wa^{02}$ may form a condensed ring with $W^{02}$. n02 is 1 or 2.]

In General Formula (a02-1), $W^{02}$ represents a polymerizable group-containing group.

The "polymerizable group" as $W^{02}$ is a group that enables a compound having the polymerizable group to be polymerized by radical polymerization or the like, and includes a group containing a multiple bond between carbon atoms, such as an ethylenic double bond.

Examples of the polymerizable group as $W^{02}$ include a vinyl group, an allyl group, acryloyl group, a methacryloyl group, a fluorovinyl group, a difluorovinyl group, a trifluorovinyl group, a difluorotrifluoromethylvinyl group, a trifluoroallyl group, a perfluoroallyl group, a trifluoromethylacryloyl group, a nonylfluorobutylacryloyl group, a vinyl ether group, a fluorine-containing vinyl ether group, an allyl ether group, a fluorine-containing allyl ether group, a styryl group, and a vinylnaphthyl group, a fluorine-containing styryl group, a fluorine-containing vinylnaphthyl group, a norbornyl group, a fluorine-containing norbornyl group, and a silyl group.

The "polymerizable group-containing group" as $W^{02}$ may be a group composed of only a polymerizable group, or a group composed of a polymerizable group and a group other than the polymerizable group. Examples of the group other than the polymerizable group include a divalent hydrocarbon group which may have a substituent and a divalent linking group containing a hetero atom.

Here, respective examples of the divalent hydrocarbon group which may have a substituent and the divalent linking group containing a hetero atom include the same groups as the divalent hydrocarbon group which may have a substituent, and the divalent linking group containing a hetero atom, which are exemplified in the explanation of "polymerizable group-containing group" as $W^{01}$ in General Formula (a01-1).

Suitable examples of $W^{02}$ include a group represented by a chemical formula:

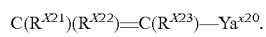

$$C(R^{X21})(R^{X22}) = C(R^{X23}) - Ya^{x20}.$$

In the chemical formula, $R^{X21}$, $R^{X22}$, and $R^{X23}$ each represent a hydrogen atom, an alkyl group having 1 to 5 carbon atoms, or a halogenated alkyl group having 1 to 5 carbon atoms, and $Ya^{x20}$ represents a single bond or a divalent linking group.

Respective examples of $R^{X21}$, $R^{X22}$, and $R^{X23}$ and $Ya^{x20}$ include those the same as $R^{X11}$, $R^{X12}$, and $R^{X13}$ and $Ya^{x0}$ explained in $W^{01}$ in General Formula (a01-1).

Among the above, $Ya^{x20}$ is preferably an ester bond [—C(=O)—O— or —O—C(=O)—] or a single bond.

In General Formula (a02-1), $Wa^{02}$ is an aromatic hydrocarbon group.

Examples of the aromatic hydrocarbon group as $Wa^{02}$ include a group obtained by removing (n02+1) hydrogen atoms from an aromatic ring. Here, the aromatic ring is not particularly limited as long as it is a cyclic conjugated system having (4n+2)π electrons, and may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms. Specific examples of the aromatic ring include aromatic hydrocarbon rings such as benzene, naphthalene, anthracene, and phenanthrene; and aromatic heterocyclic rings obtained by substituting a part of carbon atoms constituting the above-described aromatic hydrocarbon ring with a hetero atom. Examples of the hetero atom in the aromatic heterocyclic rings include an oxygen atom, a sulfur atom, and a nitrogen atom. Specific examples of the aromatic heterocyclic ring include a pyridine ring and a thiophene ring.

Examples of the aromatic hydrocarbon group as $Wa^{02}$ also include a group obtained by removing (n02+1) hydrogen atoms from an aromatic compound including an aromatic ring (for example, biphenyl and fluorene) which may have two or more substituents.

Among them, $Wa^{02}$ is preferably a group obtained by removing (n02+1) hydrogen atoms from benzene, naphthalene, anthracene, or biphenyl, and more preferably a group obtained by removing (n02+1) hydrogen atoms from benzene or naphthalene.

Part or all of hydrogen atoms which the aromatic hydrocarbon group has may be substituted with a substituent other than a hydroxy group. Examples of the substituent include a carboxy group, a halogen atom, an alkoxy group (a methoxy group, an ethoxy group, a propoxy group, a butoxy group, and the like), and an alkyloxycarbonyl group.

In General Formula (a02-1), $Wa^{02}$ may form a condensed ring with $W^{02}$.

In a case where $Wa^{02}$ and $W^{02}$ form a condensed ring, examples of the ring structure of the condensed ring include a condensed ring of an alicyclic hydrocarbon and an aromatic hydrocarbon. The condensed ring formed by $Wa^{02}$ and $W^{02}$ may have a hetero atom.

The alicyclic hydrocarbon moiety in the condensed ring formed by $Wa^{02}$ and $W^{02}$ may be a monocyclic ring or a polycyclic ring.

Examples of the condensed ring formed by $Wa^{02}$ and $W^{02}$ include a condensed ring formed by a polymerizable group as $W^{02}$ and by $Wa^{02}$, and a condensed ring formed by a group other than the polymerizable group as $W^{02}$ and by $Wa^{02}$.

The condensed ring formed by $Wa^{02}$ and $W^{02}$ may have a substituent. Examples of this substituent include a methyl group, an ethyl group, propyl group, a carboxy group, a halogen atom, an alkoxy group (a methoxy group, an ethoxy group, a propoxy group, a butoxy group, and the like), an acyl group, an alkyloxycarbonyl group, and alkyloxycarbonyloxy group.

Specific examples of the condensed ring formed by $Wa^{02}$ and $W^{02}$ are shown below. $W^{\alpha 1}$ represents a polymerizable group. ** represents a bonding site to a hydroxy group ($-(OH)_{n02}$).

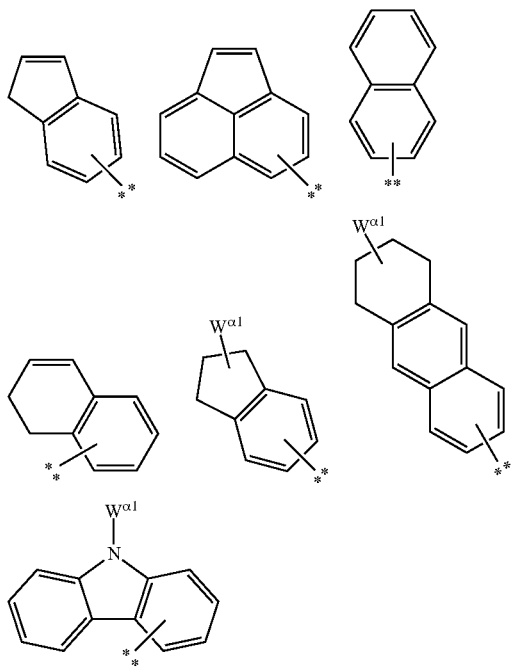

In General Formula (a02-1), n01 is 1 or 2, and 1 is preferable.

The constitutional unit (a02) is preferably a constitutional unit represented by General Formula (a02-1-1) or a constitutional unit represented by General Formula (a02-1-2).

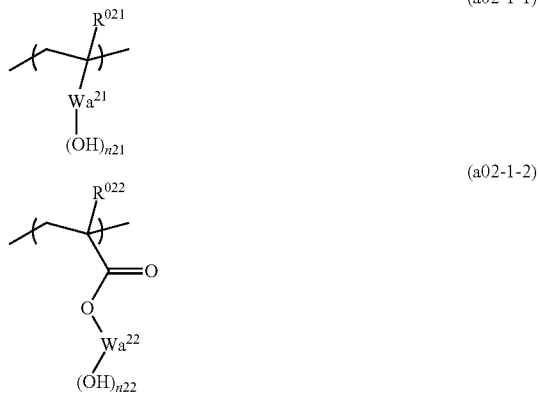

[In General Formula (a02-1-1), $R^{021}$ represents a hydrogen atom, an alkyl group having 1 to 5 carbon atoms, or a halogenated alkyl group having 1 to 5 carbon atoms. $Wa^{21}$ represents an aromatic hydrocarbon group. Part or all of hydrogen atoms which the aromatic hydrocarbon group has may be substituted with a substituent other than a hydroxy group. n21 is 1 or 2.

In General Formula (a02-1-2), $R^{022}$ represents a hydrogen atom, an alkyl group having 1 to 5 carbon atoms, or a halogenated alkyl group having 1 to 5 carbon atoms. $Wa^{22}$ represents an aromatic hydrocarbon group. Part or all of hydrogen atoms which the aromatic hydrocarbon group has may be substituted with a substituent other than a hydroxy group. n22 is 1 or 2.]

In General Formula (a02-1-1), $R^{021}$ represents a hydrogen atom, an alkyl group having 1 to 5 carbon atoms, or a halogenated alkyl group having 1 to 5 carbon atoms.

The alkyl group having 1 to 5 carbon atoms as $R^{021}$ is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group.

The halogenated alkyl group having 1 to 5 carbon atoms as $R^{021}$ is a group obtained by substituting part or all of hydrogen atoms of the above-described alkyl group having 1 to 5 carbon atoms with a halogen atom. The halogen atom is particularly preferably a fluorine atom.

$R^{021}$ is preferably a hydrogen atom, an alkyl group having 1 to 5 carbon atoms, or a fluorinated alkyl group having 1 to 5 carbon atoms, and in terms of industrial availability, R is more preferably a hydrogen atom or an alkyl group having 1 to 5 carbon atoms, still more preferably a hydrogen atom or a methyl group, and particularly preferably a hydrogen atom.

In General Formula (a02-1-1), $Wa^{21}$ represents an aromatic hydrocarbon group. Part or all of hydrogen atoms which the aromatic hydrocarbon group has may be substituted with a substituent other than a hydroxy group. The explanation of $Wa^{21}$ is the same as that of $Wa^{02}$ in General Formula (a02-1), and a group obtained by removing (n21+1) hydrogen atoms from an aromatic hydrocarbon ring is preferable, and a group obtained by removing (n21+1) hydrogen atoms from benzene or naphthalene is more preferable.

In General Formula (a02-1-1), n21 is 1 or 2 and is preferably 1.

In General Formula (a02-1-2), $R^{022}$ represents a hydrogen atom, an alkyl group having 1 to 5 carbon atoms, or a halogenated alkyl group having 1 to 5 carbon atoms.

The alkyl group having 1 to 5 carbon atoms as $R^{022}$ is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group.

The halogenated alkyl group having 1 to 5 carbon atoms as $R^{022}$ is a group obtained by substituting part or all of hydrogen atoms of the above-described alkyl group having 1 to 5 carbon atoms with a halogen atom. The halogen atom is particularly preferably a fluorine atom.

$R^{022}$ is preferably a hydrogen atom, an alkyl group having 1 to 5 carbon atoms, or a fluorinated alkyl group having 1 to 5 carbon atoms, and in terms of industrial availability, R is more preferably a hydrogen atom or an alkyl group having 1 to 5 carbon atoms, still more preferably a hydrogen atom or a methyl group, and particularly preferably a methyl group.

In General Formula (a02-1-2), $Wa^{22}$ represents an aromatic hydrocarbon group. Part or all of hydrogen atoms which the aromatic hydrocarbon group has may be substituted with a substituent other than a hydroxy group. The explanation of $Wa^{22}$ is the same as that of $Wa^{02}$ in General Formula (a02-1), and a group obtained by removing (n22+1) hydrogen atoms from an aromatic hydrocarbon ring is preferable, a group obtained by removing (n22+1) hydrogen atoms from benzene or naphthalene is more preferable, and a group obtained by removing (n22+1) hydrogen atoms from benzene is more preferable, In General Formula (a02-1-2), n22 is 1 or 2 and is preferably 1.

Specific examples of the constitutional unit (a02) are shown below.

In each of the formulae shown below, $R^\alpha$ represents a hydrogen atom, a methyl group, or a trifluoromethyl group.

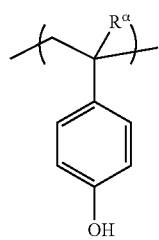

(a02-1a-11)

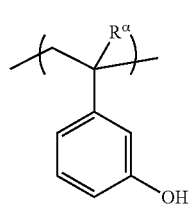

(a02-1a-12)

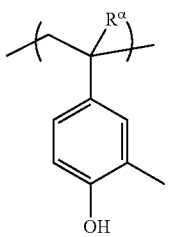

(a02-1a-13)

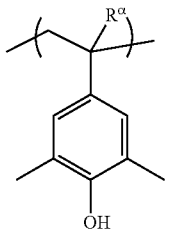

(a02-1a-14)

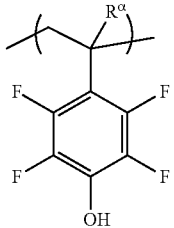

(a02-1a-15)

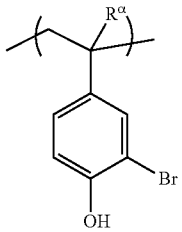

(a02-1a-16)

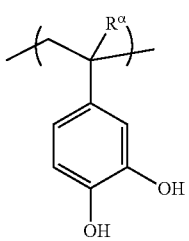

(a02-1a-17)

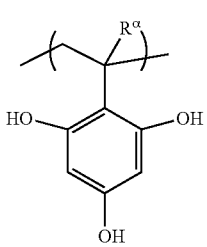

(a02-1a-18)

(a02-1a-19) 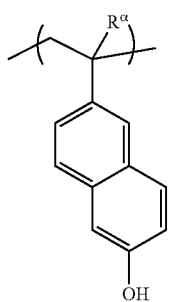
(a02-1a-20) 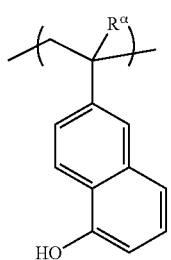
(a02-1a-21) 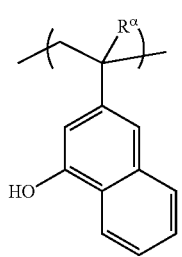
(a02-1a-22) 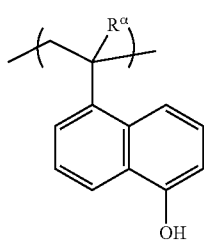
(a02-1a-23) 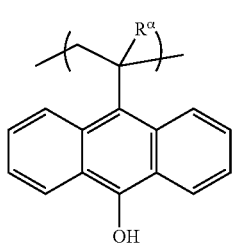
(a02-1a-24) 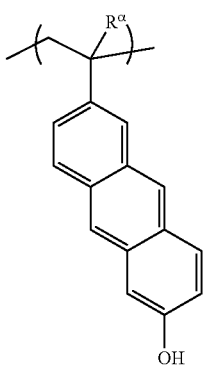
(a02-1a-25) 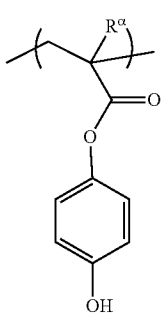
(a02-1a-26) 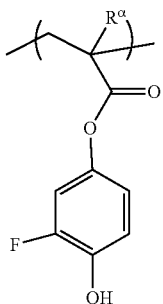
(a02-1a-27) 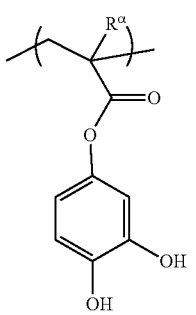

(a02-1a-28)
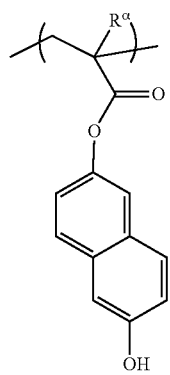
(a02-1a-29)
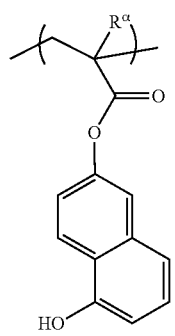
(a02-1a-30)
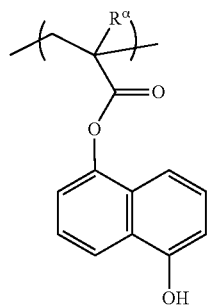
(a02-1a-31)
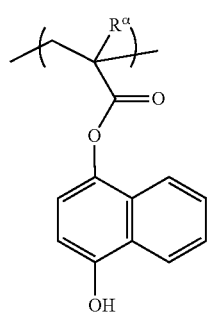
(a02-1a-32)
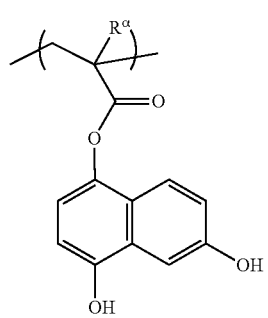
(a02-1a-33)
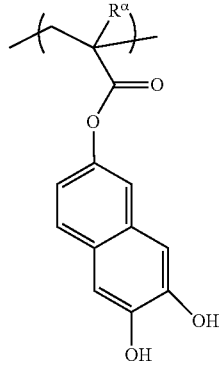
(a02-1a-34)
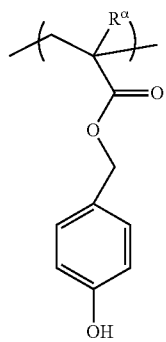
(a02-1a-35)
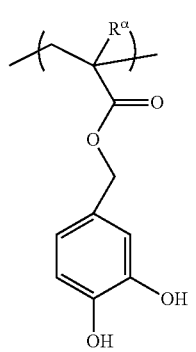
(a02-1a-36)
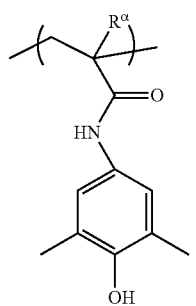

-continued (a02-1a-37) 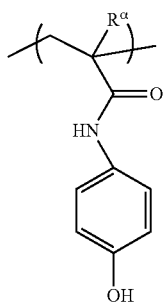

(a02-1a-38) 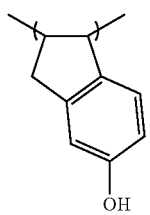

(a02-1a-39) 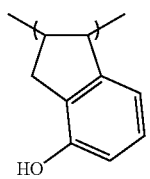

(a02-1a-40) 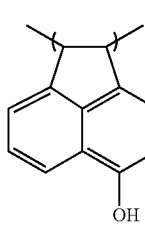

(a02-1a-41) 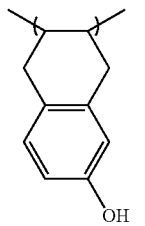

(a02-1a-42) 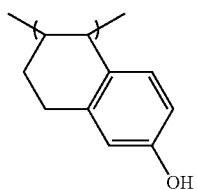

(a02-1a-43) 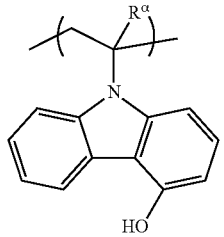

The constitutional unit (a02) that the component (A1) has may be one kind or may be two or more kinds.

Among the above, the constitutional unit (a02) is preferably at least one selected from the group consisting of the constitutional units each represented by General Formulae (a02-1a-11) to (a02-1a-33), more preferably at least one selected from the group consisting of the constitutional units each represented by General Formulae (a02-1a-11) to (a02-1a-14), (a02-1a-19) to (a02-1a-22), and (a02-1a-25), still more preferably at least one selected from the group consisting of the constitutional units each represented by General Formulae (a02-1a-11), (a02-1a-19), and (a02-1a-25).

The proportion of the constitutional unit (a02) in the component (A1) is preferably in a range of 20% to 80% by mole, more preferably in a range of 30% to 70% by mole, and still more preferably in a range of 40% to 60% by mole, with respect to the total (100% by mole) of all constitutional units constituting the component (A1).

In a case where the proportion of the constitutional unit (a02) is equal to or greater than the lower limit value of the preferred range described above, lithography characteristics such as sensitivity and roughness reduction are further improved and a resist pattern having high rectangularity is easily formed. On the other hand, in a case where the proportion of the constitutional unit (a02) is equal to or lower than the upper limit value of the preferred range described above, balance with other constitutional units is easily obtained.

<<Other Constitutional Units>>

The component (A1) may have other constitutional units as necessary in addition to the constitutional unit (a01) and the constitutional unit (a02).

Examples of other constitutional units include a constitutional unit (a1) containing an acid-decomposable group having a polarity which is increased under action of acid (provided that a constitutional unit corresponding to the constitutional unit (a01) is excluded); a constitutional unit (a2) containing a lactone-containing cyclic group, a —$SO_2$- containing cyclic group, or a carbonate-containing cyclic group (provided that a constitutional unit corresponding to the constitutional unit (a01) or the constitutional unit (a1) is excluded); a constitutional unit (a3) containing a polar group-containing aliphatic hydrocarbon group (provided that a constitutional unit corresponding to the constitutional unit (a01), the constitutional unit (a02), the constitutional unit (a1), or the constitutional unit (a2) is excluded); a constitutional unit (a4) containing an acid non-dissociable aliphatic cyclic group; and a constitutional unit (st) derived from styrene or a derivative thereof.

In Regard to Constitutional Unit (a1):

The component (A1) may further have the constitutional unit (a1) in addition to the constitutional unit (a01) and the constitutional unit (a02).

The constitutional unit (a1) is a constitutional unit (provided that a constitutional unit corresponding to the constitutional unit (a01) is excluded) containing an acid-decomposable group having a polarity which is increased under action of acid.

Examples of the acid-dissociable group that constitutes the acid-decomposable group are the same as those which have been proposed as acid-dissociable groups for the base resin of a chemical amplification-type resist composition.

Specific examples of acid-dissociable groups of the base resin proposed for a chemical amplification-type resist composition contains an "acetal-type acid-dissociable group", a "tertiary alkyl ester-type acid-dissociable group", and a "tertiary alkyloxycarbonyl acid-dissociable group" described below.

Acetal-Type Acid-Dissociable Group:

Examples of the acid-dissociable group for protecting a carboxy group or a hydroxyl group as a polar group include the acid-dissociable group represented by General Formula (a1-r-1) shown below (hereinafter, also referred to as an "acetal-type acid-dissociable group").

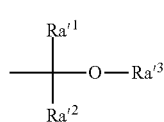

(a1-r-1)

[In the formula, $Ra'^1$ and $Ra'^2$ represent a hydrogen atom or an alkyl group. $Ra'^3$ represents a hydrocarbon group, and $Ra'^3$ may be bonded to any one of $Ra'^1$ or $Ra'^2$ to form a ring.]

In General Formula (a1-r-1), it is preferable that at least one of $Ra'^1$ and $Ra'^2$ represent a hydrogen atom and more preferable that both $Ra'^1$ and $Ra'^2$ represent a hydrogen atom.

In a case where $Ra'^1$ or $Ra'^2$ represents an alkyl group, the alkyl group is preferably an alkyl group having 1 to 5 carbon atoms. Specific examples thereof preferably include a linear or branched alkyl group. Specific examples of the alkyl group include a methyl group, an ethyl group, a propyl group, an isopropyl group, an n-butyl group, an isobutyl group, a tert-butyl group, a pentyl group, an isopentyl group, and a neopentyl group. Among these, a methyl group or an ethyl group is preferable, and a methyl group is particularly preferable.

In General Formula (a1-r-1), examples of the hydrocarbon group as $Ra'^3$ include a linear or branched alkyl group and a cyclic hydrocarbon group.

The linear alkyl group has preferably 1 to 5 carbon atoms, more preferably 1 to 4 carbon atoms, and still more preferably 1 or 2 carbon atoms. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The branched alkyl group has preferably 3 to 10 carbon atoms and more preferably 3 to 5 carbon atoms. Specific examples thereof include an isopropyl group, an isobutyl group, a tert-butyl group, an isopentyl group, a neopentyl group a 1,1-diethylpropyl group, and a 2,2-dimethylbutyl group. Among these, an isopropyl group is preferable.

In a case where $Ra'^3$ represents a cyclic hydrocarbon group, the hydrocarbon group may be an aliphatic hydrocarbon group or an aromatic hydrocarbon group and may be a polycyclic group or a monocyclic group.

The aliphatic hydrocarbon group which is a monocyclic group is preferably a group obtained by removing one hydrogen atom from a monocycloalkane. The monocycloalkane preferably has 3 to 6 carbon atoms, and specific examples thereof include cyclopentane and cyclohexane.

The aliphatic hydrocarbon group which is a polycyclic group is preferably a group obtained by removing one hydrogen atom from a polycycloalkane. The polycycloalkane preferably has 7 to 12 carbon atoms, and specific examples thereof include adamantane, norbornane, isobornane, tricyclodecane, and tetracyclododecane.

In a case where the cyclic hydrocarbon group as $Ra'^3$ is an aromatic hydrocarbon group, the aromatic hydrocarbon group is a hydrocarbon group having at least one aromatic ring.

The aromatic ring is not particularly limited as long as it is a cyclic conjugated system having $(4n+2)\pi$ electrons, and may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms.

Specific examples of the aromatic ring include aromatic hydrocarbon rings such as benzene, naphthalene, anthracene, and phenanthrene; and an aromatic heterocyclic ring obtained by substituting a part of carbon atoms constituting the above-described aromatic hydrocarbon ring with a hetero atom. Examples of the hetero atom in the aromatic heterocyclic rings include an oxygen atom, a sulfur atom, and a nitrogen atom. Specific examples of the aromatic heterocyclic ring include a pyridine ring and a thiophene ring.

Specific examples of the aromatic hydrocarbon group as $Ra'^3$ include a group obtained by removing one hydrogen atom from the above-described aromatic hydrocarbon ring or aromatic heterocyclic ring (an aryl group or a heteroaryl group); a group obtained by removing one hydrogen atom from an aromatic compound having two or more aromatic rings (biphenyl, fluorene or the like); and a group obtained by substituting one hydrogen atom of the above-described aromatic hydrocarbon ring or aromatic heterocyclic ring with an alkylene group (an arylalkyl group such as a benzyl group, a phenethyl group, a 1-naphthylmethyl group, a 2-naphthylmethyl group, a 1-naphthylethyl group, or a 2-naphthylethyl group). The number of carbon atoms in the alkylene group bonded to the aromatic hydrocarbon ring or aromatic heterocyclic ring is preferably in a range of 1 to 4, more preferably 1 or 2, and particularly preferably 1.

The cyclic hydrocarbon group as $Ra'^3$ may have a substituent. Examples of this substituent include $Ra^{x5}$ described above.

In a case where $Ra'^3$ is bonded to any one of $Ra'^1$ or $Ra'^2$ to form a ring, the cyclic group is preferably a 4- to 7-membered ring, and more preferably a 4- to 6-membered ring. Specific examples of the cyclic group include a tetrahydropyranyl group and a tetrahydrofuranyl group.

Tertiary Alkyl Ester-Type Acid-Dissociable Group:

Examples of the acid-dissociable group for protecting the carboxy group include the acid-dissociable group represented by General Formula (a1-r-2) shown below. Among the acid-dissociable groups represented by General Formula (a1-r-2), for convenience, a group which is constituted of alkyl groups is referred to as a "tertiary alkyl ester-type acid-dissociable group".

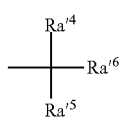

(a1-r-2)

[In the formula, $Ra'^4$ to $Ra'^6$ each represent a hydrocarbon group, and $Ra'^5$ and $Ra'^6$ may be bonded to each other to form a ring.]

Examples of the hydrocarbon group as $Ra'^4$ to $Ra'^6$ are the same as those mentioned above as $Ra'^3$.

$Ra^{t4}$ is preferably an alkyl group having 1 to 5 carbon atoms. In a case where $Ra^{t5}$ and $Ra^{t6}$ are bonded to each other to form a ring, a group represented by General Formula (a1-r2-1) can be mentioned. On the other hand, in a case where $Ra^{t4}$ to $Ra^{t6}$ are not bonded to each other and represent an independent hydrocarbon group, a group represented by General Formula (a1-r2-2) can be mentioned.

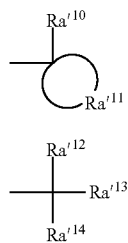

(a1-r2-1)

(a1-r2-2)

[In the formula, $Ra^{'01}$ represents an alkyl group having 1 to 10 carbon atoms, $Ra^{'11}$ represents a group that forms an alicyclic hydrocarbon group together with the carbon atom to which $Ra^{'10}$ is bonded, and $Ra^{'12}$ to $Ra^{'14}$ each independently represent a hydrocarbon group.]

In General Formula (a1-r2-1), the alkyl group having 1 to 10 carbon atoms as $Ra^{'10}$ is preferably the group exemplified as the linear or branched alkyl group as $Ra^{t3}$ in General Formula (a1-r-1). In General Formula (a1-r2-1), the alicyclic hydrocarbon group that is formed by $Ra^{'11}$ together with the carbon atom to which $Ra^{'10}$ is bonded is preferably the group mentioned as the aliphatic hydrocarbon group which is a monocyclic group or a polycyclic group as $Ra^{t3}$ in General Formula (a1-r-1).

In General Formula (a1-r2-2), $Ra^{'12}$ and $Ra^{'14}$ are each independently preferably an alkyl group having 1 to 10 carbon atoms, and the alkyl group is preferably the group exemplified as a linear or branched alkyl group as $Ra^{t3}$ in General Formula (a1-r-1), more preferably a linear alkyl group having 1 to 5 carbon atoms, and still more preferably a methyl group or an ethyl group.

In General Formula (a1-r2-2), $Ra^{'13}$ is preferably a linear or branched alkyl group exemplified as the hydrocarbon group as $Ra^{t3}$ in General Formula (a1-r-1) and an aliphatic hydrocarbon group which is a monocyclic group or a polycyclic group. Among these, the group exemplified as the aliphatic hydrocarbon group which is a monocyclic group or a polycyclic group as $Ra^{t3}$ is more preferable.

Specific examples of the group represented by General Formula (a1-r2-1) are shown below. * represents a bonding site.

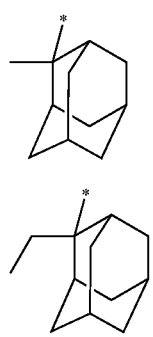

(r-pr-m1)

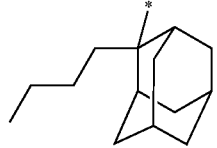

(r-pr-m2)

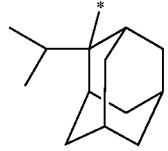

(r-pr-m3)

(r-pr-m4)

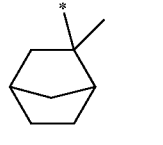

(r-pr-m5)

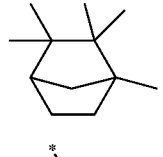

(r-pr-m6)

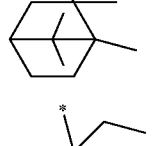

(r-pr-m7)

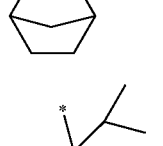

(r-pr-m8)

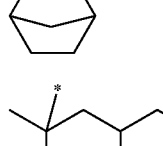

(r-pr-m9)

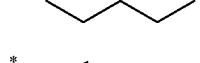

(r-pr-m10)

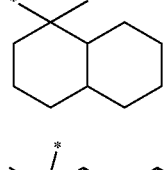

(r-pr-m11)

(r-pr-m12)

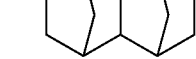

(r-pr-m13)

-continued
(r-pr-m14)
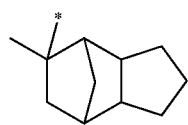
(r-pr-m15)
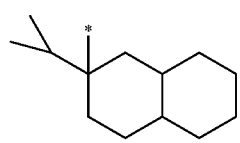
(r-pr-m16)
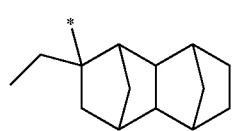
(r-pr-m17)
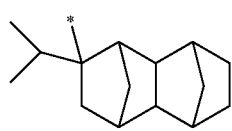
(r-pr-s1)
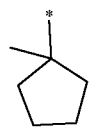
(r-pr-s2)
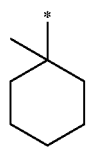
(r-pr-s3)
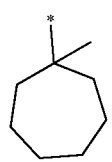
(r-pr-s4)
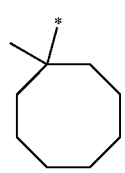
(r-pr-s5)
(r-pr-s6)
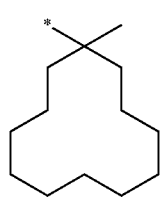
-continued
(r-pr-s7)
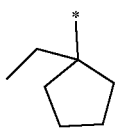
(r-pr-s8)
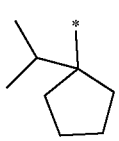
(r-pr-s9)
(r-pr-s10)
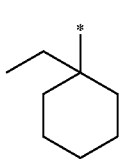
(r-pr-s11)
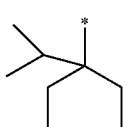
(r-pr-s12)
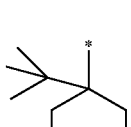
(r-pr-s13)
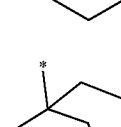
(r-pr-s14)
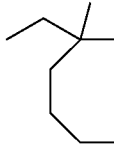
(r-pr-s15)
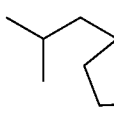
(r-pr-s16)
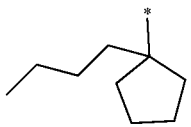

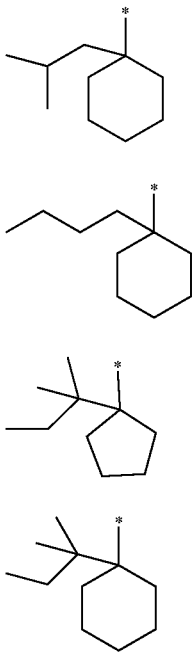

Specific examples of the group represented by General Formula (a1-r2-2) are shown below.

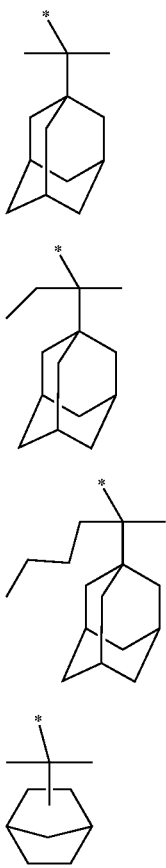

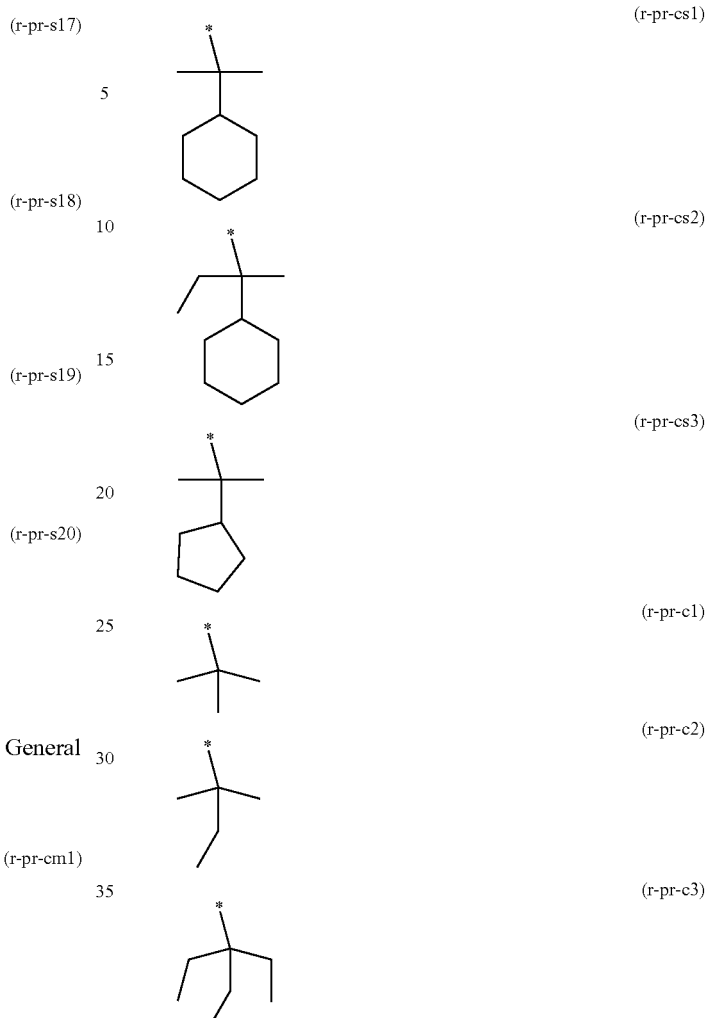

Tertiary Alkyloxycarbonyl Acid-Dissociable Group:

Examples of the acid-dissociable group for protecting a hydroxyl group include an acid-dissociable group (hereinafter, for convenience, also referred to as a "tertiary alkyloxycarbonyl acid-dissociable group") represented by General Formula (a1-r-3) shown below.

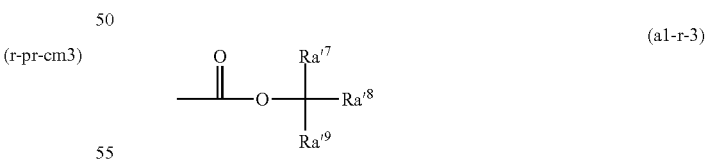

[In the formula, $Ra'^7$ to $Ra'^9$ each represent an alkyl group.]

In General Formula (a1-r-3), $Ra'^7$ to $Ra'^9$ are each preferably an alkyl group having 1 to 5 carbon atoms and more preferably an alkyl group having 1 to 3 carbon atoms.

Further, the total number of carbon atoms in each of the alkyl groups is preferably in a range of 3 to 7, more preferably in a range of 3 to 5, and most preferably 3 or 4.

Examples of the constitutional unit (a1) include a constitutional unit derived from acrylic acid ester in which the hydrogen atom bonded to the carbon atom at the α-position may be substituted with a substituent; a constitutional unit derived from acrylamide; a constitutional unit in which at least a part of hydrogen atoms in a hydroxyl group of a constitutional unit derived from hydroxystyrene or a hydroxystyrene derivative are protected by a substituent including an acid-decomposable group; and a constitutional unit in which at least a part of hydrogen atoms in —C(=O)—OH of a constitutional unit derived from vinylbenzoic acid or a vinylbenzoic acid derivative are protected by the substituent including an acid-decomposable group.

Among the above, the constitutional unit (a1) is preferably a constitutional unit derived from acrylic acid ester in which the hydrogen atom bonded to the carbon atom at the α-position may be substituted with a substituent.

Preferred specific examples of such a constitutional unit (a1) include constitutional units represented by General Formula (a1-1) or (a1-2).

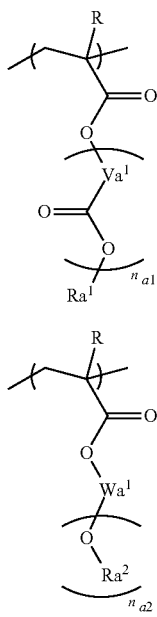

[In the formula, R represents a hydrogen atom, an alkyl group having 1 to 5 carbon atoms, or a halogenated alkyl group having 1 to 5 carbon atoms. $Va^1$ represents a divalent hydrocarbon group which may have an ether bond. $n_{a1}$ represents an integer in a range of 0 to 2. $Ra^1$ is an acid-dissociable group represented by General Formula (a1-r-1) or (a1-r-2). $Wa^1$ represents an $(n_{a2}+1)$-valent hydrocarbon group. $n_{a2}$ represents an integer in a range of 1 to 3. $Ra^e$ is an acid-dissociable group represented by General Formula (a1-r-1) or (a1-r-3).]

In General Formula (a1-1), the alkyl group having 1 to 5 carbon atoms as R is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group obtained by substituting part or all of hydrogen atoms in the alkyl group having 1 to 5 carbon atoms with a halogen atom. The halogen atom is particularly preferably a fluorine atom.

R is preferably a hydrogen atom, an alkyl group having 1 to 5 carbon atoms, or a fluorinated alkyl group having 1 to 5 carbon atoms, and most preferably a hydrogen atom or a methyl group in terms of industrial availability.

In General Formula (a1-1), the divalent hydrocarbon group as $Va^1$ is the same as the divalent hydrocarbon group as $Ya^{x0}$, exemplified in the explanation of $W^1$ in General Formula (a0-1).

In General Formula (a1-2), the $(n_{a2}+1)$-valent hydrocarbon group as $Wa^1$ may be an aliphatic hydrocarbon group or an aromatic hydrocarbon group. The aliphatic hydrocarbon group indicates a hydrocarbon group that has no aromaticity and may be saturated or unsaturated. In general, it is preferable that the aliphatic hydrocarbon group be saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof.

The valency of $(n_{a2}+1)$ is preferably divalent, trivalent, or tetravalent, and more preferably divalent or trivalent.

Specific examples of the constitutional unit represented by General Formula (a1-1) are shown below. In each of the formulae shown below, $R^\alpha$ represents a hydrogen atom, a methyl group, or a trifluoromethyl group.

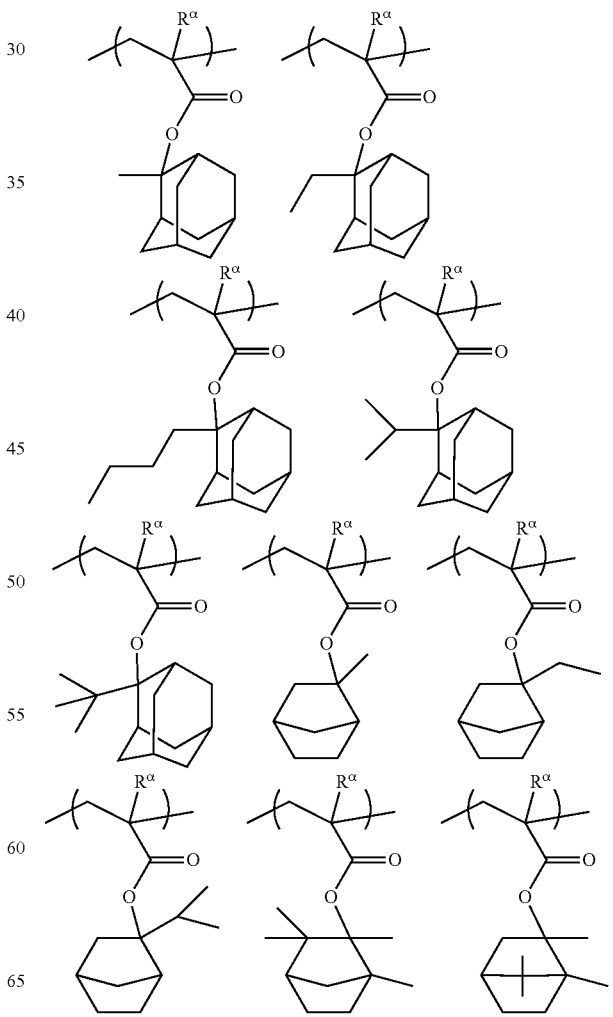

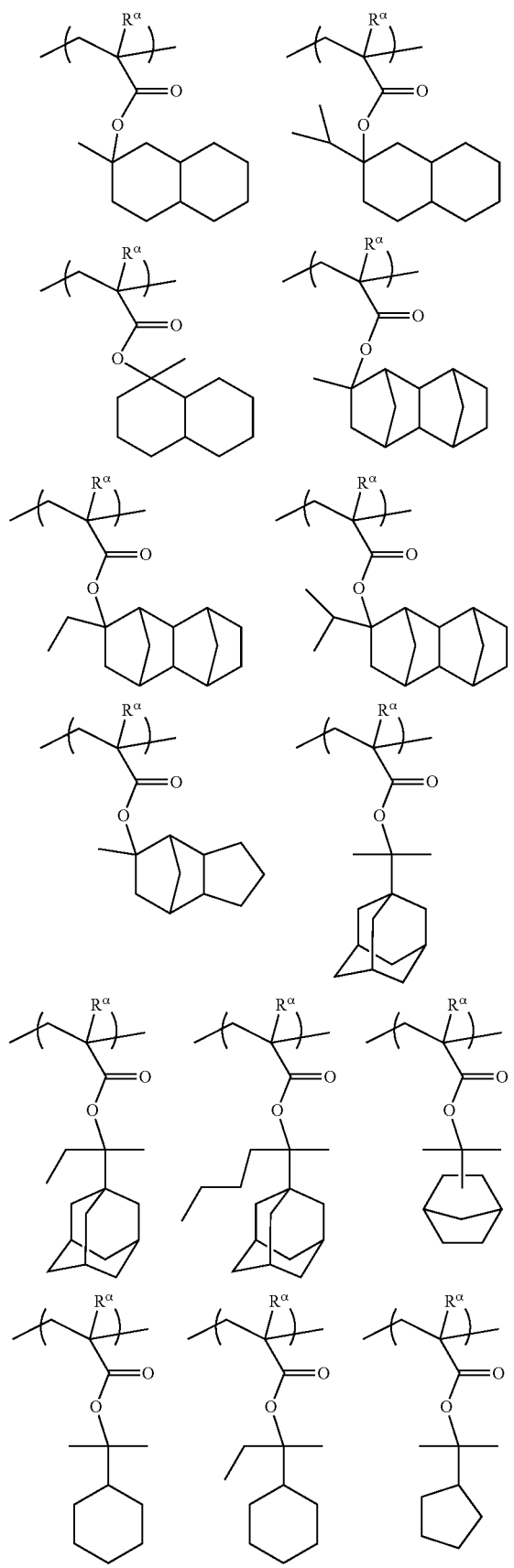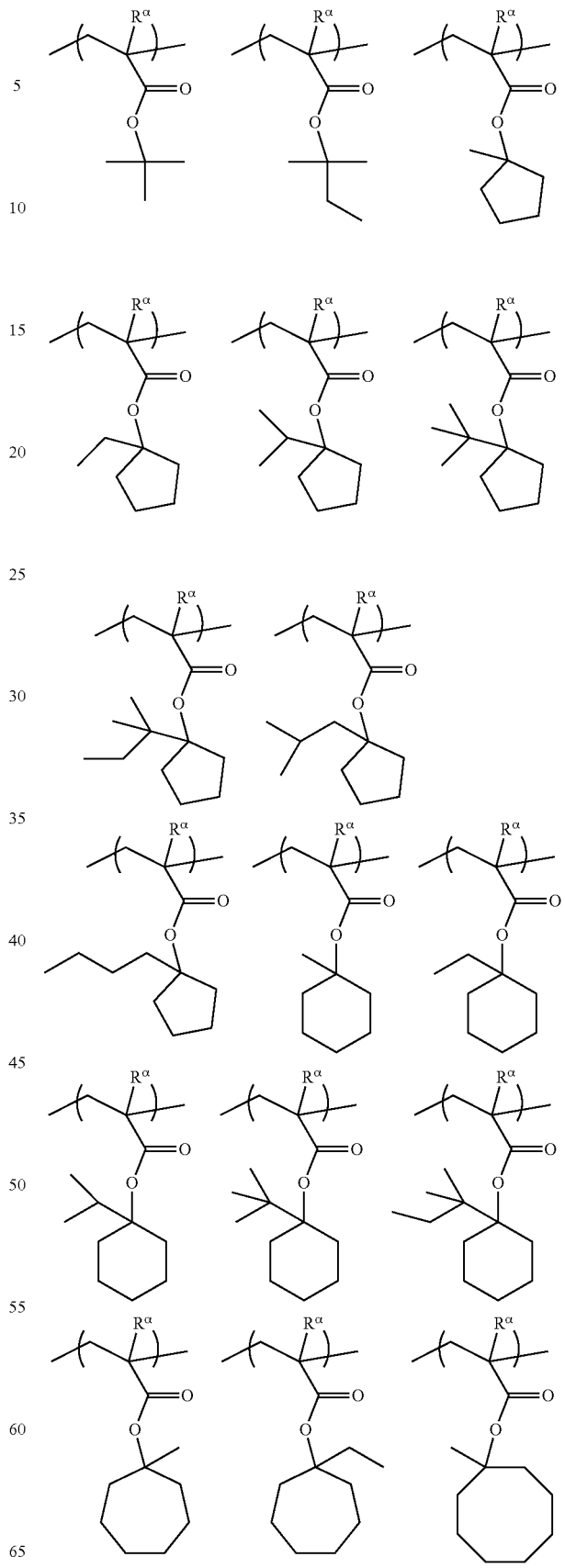

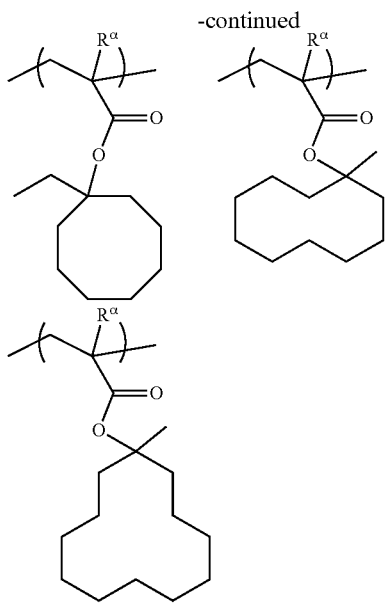

The constitutional unit (a1) which the component (A1) has may be one kind or may be two or more kinds.

In a case where the component (A1) has the constitutional unit (a1), the proportion of the constitutional unit (a1) in the component (A1) is preferably in a range of 1% to 50% by mole, more preferably in a range of 5% to 45% by mole, and still more preferably in a range of 5% to 30% by mole, with respect to the total amount (100% by mole) of all constitutional units constituting the component (A1).

In a case where the proportion of the constitutional unit (a1) is equal to or greater than the lower limit value of the preferred range, a resist pattern can be easily obtained, and lithography characteristics such as sensitivity, resolution, roughness amelioration, and an EL margin are improved. In a case where the proportion of the constitutional unit (a1) is equal to or lower than the upper limit value of the preferred range, the balance with other constitutional units can be achieved.

In Regard to Constitutional Unit (a2):

The component (A1) may further have, as necessary, a constitutional unit (a2) containing a lactone-containing cyclic group, a —$SO_2$-containing cyclic group, or a carbonate-containing cyclic group.

In a case where the component (A1) is used for forming a resist film, the lactone-containing cyclic group, the —$SO_2$-containing cyclic group, or the carbonate-containing cyclic group in the constitutional unit (a2) is effective for improving the adhesiveness of the resist film to the substrate. Further, due to having the constitutional unit (a2), lithography characteristics can be improved, for example, by the effects obtained by appropriately adjusting the acid diffusion length, increasing the adhesiveness of the resist film to the substrate, and appropriately adjusting the solubility during development.

The term "lactone-containing cyclic group" indicates a cyclic group that contains a ring (lactone ring) containing a —O—C(=O)— in the ring skeleton. In a case where the lactone ring is counted as the first ring and the group contains only the lactone ring, the group is referred to as a monocyclic group. Further, in a case where the group has other ring structures, the group is referred to as a polycyclic group regardless of the structures. The lactone-containing cyclic group may be a monocyclic group or a polycyclic group.

The lactone-containing cyclic group for the constitutional unit (a2) is not particularly limited, and any lactone-containing cyclic group may be used. Specific examples thereof include groups each represented by General Formulae (a2-r-1) to (a2-r-7) shown below.

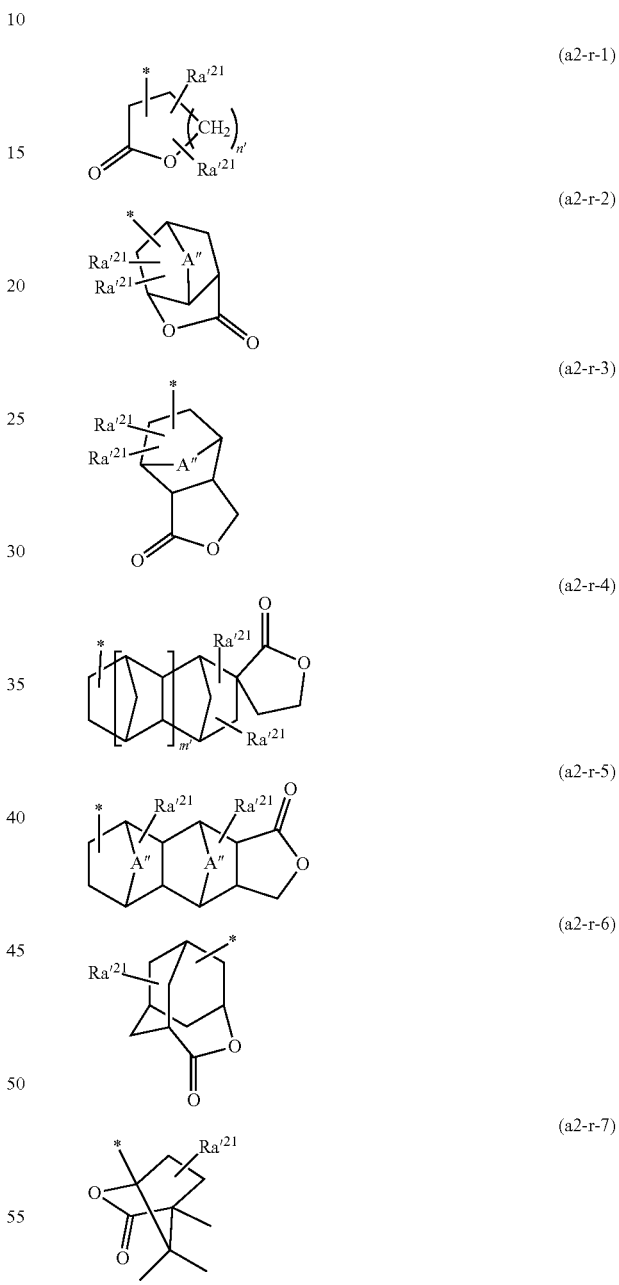

[In the formulae, $Ra'^{21}$s each independently represent a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or a —$SO_2$-containing cyclic group; A" represents an oxygen atom, a sulfur atom, or an alkylene group having 1 to 5 carbon atoms, which may contain an oxygen atom (—O—) or a sulfur atom (—S—); and n' represents an integer in a range of 0 to 2, and m' is 0 or 1.]

In General Formulae (a2-r-1) to (a2-r-7), the alkyl group as $Ra'^{21}$ is preferably an alkyl group having 1 to 6 carbon atoms. The alkyl group is preferably a linear alkyl group or a branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Among these, a methyl group or ethyl group is preferable, and a methyl group is particularly preferable.

The alkoxy group as $Ra'^{21}$ is preferably an alkoxy group having 1 to 6 carbon atoms. Further, the alkoxy group is preferably a linear or branched alkoxy group. Specific examples of the alkoxy groups include a group formed by linking the above-described alkyl group mentioned as the alkyl group represented by $Ra'^{21}$ to an oxygen atom (—O—).

The halogen atom as $Ra'^{21}$ is preferably a fluorine atom.

Examples of the halogenated alkyl group as $Ra'^{21}$ a include group obtained by substituting part or all of hydrogen atoms in the above-described alkyl group as $Ra'^{21}$ with the above-described halogen atoms. The halogenated alkyl group is preferably a fluorinated alkyl group and particularly preferably a perfluoroalkyl group.

In —COOR" and —OC(=O)R" as $Ra'^{21}$, R" represents a hydrogen atom, an alkyl group, a lactone-containing cyclic group, a carbonate-containing cyclic group, or a —$SO_2$—-containing cyclic group.

The alkyl group as R" may be linear, branched, or cyclic, and preferably has 1 to 15 carbon atoms.

In a case where R" represents a linear or branched alkyl group, it is preferably an alkyl group having 1 to 10 carbon atoms, more preferably an alkyl group having 1 to 5 carbon atoms, and particularly preferably a methyl group or an ethyl group.

In a case where R" represents a cyclic alkyl group, the cyclic alkyl group preferably has 3 to 15 carbon atoms, more preferably 4 to 12 carbon atoms, and particularly preferably 5 to 10 carbon atoms. Specific examples thereof include a group obtained by removing one or more hydrogen atoms from a monocycloalkane, which may be or may not be substituted with a fluorine atom or a fluorinated alkyl group; and a group obtained by removing one or more hydrogen atoms from a polycycloalkane such as bicycloalkane, tricycloalkane, or tetracycloalkane. More specific examples thereof include a group obtained by removing one or more hydrogen atoms from a monocycloalkane such as cyclopentane or cyclohexane; and a group obtained by removing one or more hydrogen atoms from a polycycloalkane such as adamantane, norbornane, isobornane, tricyclodecane, or tetracyclododecane.

Examples of the lactone-containing cyclic group as R" include those the same as the groups each represented by General Formulae (a2-r-1) to (a2-r-7).

The carbonate-containing cyclic group as R" has the same definition as that for the carbonate-containing cyclic group described below. Specific examples of the carbonate-containing cyclic group include groups each represented by General Formulae (ax3-r-1) to (ax3-r-3).

The —$SO_2$-containing cyclic group as R" has the same definition as that for the —$SO_2$-containing cyclic group described below. Specific examples thereof include groups each represented by General Formulae (a5-r-1) to (a5-r-4).

The hydroxyalkyl group as $Ra'^{21}$ preferably has 1 to 6 carbon atoms, and specific examples thereof include a group obtained by substituting at least one hydrogen atom in the alkyl group as $Ra'^{21}$ with a hydroxyl group.

In General Formulae (a2-r-2), (a2-r-3) and (a2-r-5), as the alkylene group having 1 to 5 carbon atoms as A", a linear or branched alkylene group is preferable, and examples thereof include a methylene group, an ethylene group, an n-propylene group, and an isopropylene group. Specific examples of the alkylene groups that contain an oxygen atom or a sulfur atom include a group obtained by interposing —O— or —S— in the terminal of the alkylene group or between the carbon atoms of the alkylene group, and examples thereof include —O—$CH_2$—, —$CH_2$—O—$CH_2$—, —S—$CH_2$—, and —$CH_2$—S—$CH_2$—. A" is preferably an alkylene group having 1 to 5 carbon atoms or —O—, more preferably an alkylene group having 1 to 5 carbon atoms, and most preferably a methylene group.

Specific examples of the groups each represented by General Formulae (a2-r-1) to (a2-r-7) are shown below.

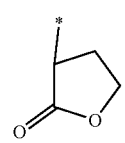

(r-lc-1-1)

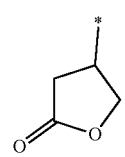

(r-lc-1-2)

(r-lc-1-3)

(r-lc-1-4)

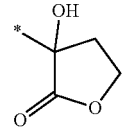

(r-lc-1-5)

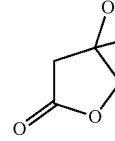

(r-lc-1-6)

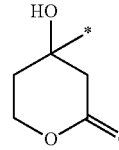

(r-lc-1-7)

-continued
(r-lc-2-1)
(r-lc-2-2)
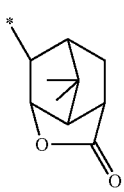
(r-lc-2-3)
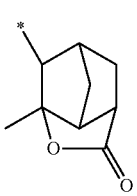
(r-lc-2-4)
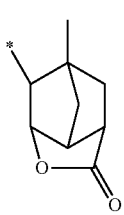
(r-lc-2-5)
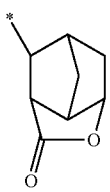
(r-lc-2-6)
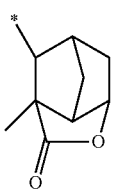
(r-lc-2-7)
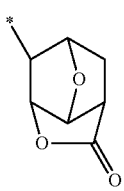
(r-lc-2-8)
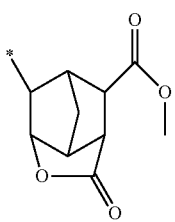
-continued
(r-lc-2-9)
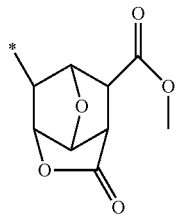
(r-lc-2-10)
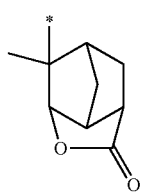
(r-lc-2-11)
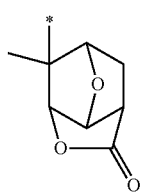
(r-lc-2-12)
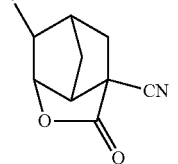
(r-lc-2-13)
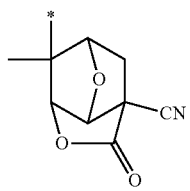
(r-lc-2-14)
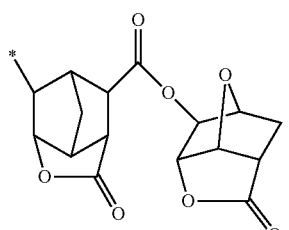
(r-lc-2-15)
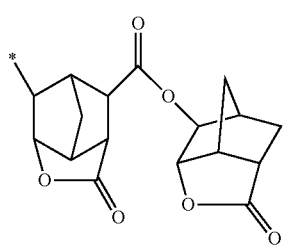

(r-lc-2-16)
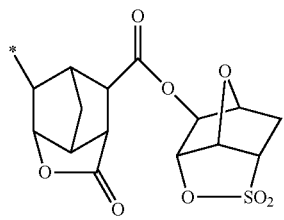
(r-lc-2-17)
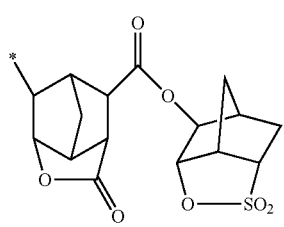
(r-lc-2-18)
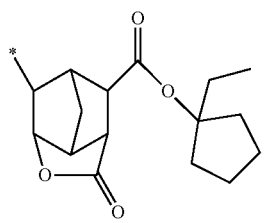
(r-lc-3-1)
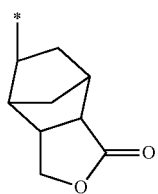
(r-lc-3-2)
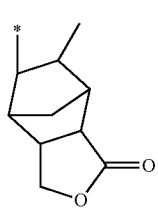
(r-lc-3-3)
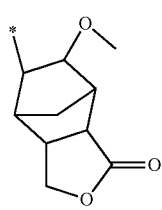
(r-lc-3-4)
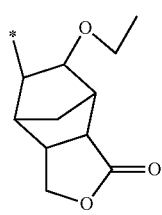
(r-lc-3-5)
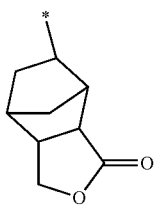
(r-lc-4-1)
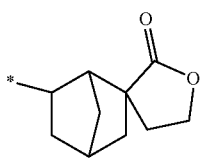
(r-lc-4-2)
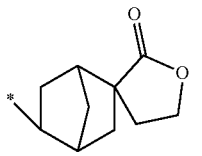
(r-lc-4-3)
(r-lc-4-4)
(r-lc-4-5)
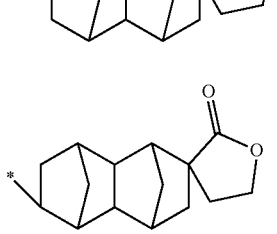
(r-lc-4-6)
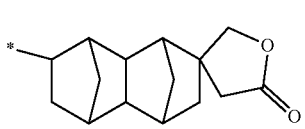
(r-lc-4-7)
(r-lc-4-8)
(r-lc-4-9)
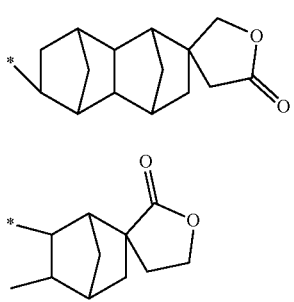

-continued (r-lc-5-1)
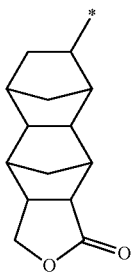

(r-lc-5-2)
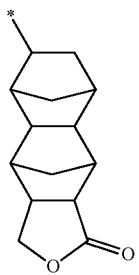

(r-lc-5-3)
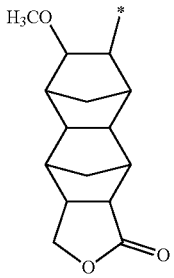

(r-lc-5-4)
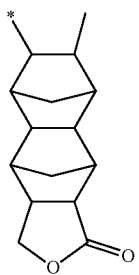

(r-lc-6-1)
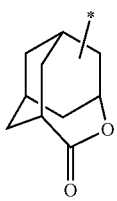

(r-lc-7-1)
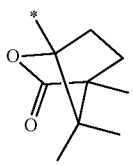

The "—$SO_2$-containing cyclic group" indicates a cyclic group having a ring containing —$SO_2$— in the ring skeleton thereof. Specifically, the —$SO_2$-containing cyclic group is a cyclic group in which the sulfur atom (S) in —$SO_2$— forms a part of the ring skeleton of the cyclic group. In a case where the ring containing —$SO_2$— in the ring skeleton thereof is counted as the first ring and the group contains only the ring, the group is referred to as a monocyclic group. In a case where the group further has other ring structures, the group is referred to as a polycyclic group regardless of the ring structures. The —$SO_2$-containing cyclic group may be a monocyclic group or a polycyclic group.

The —$SO_2$-containing cyclic group is particularly preferably a cyclic group containing —O—$SO_2$— in the ring skeleton thereof, in other words, a cyclic group containing a sultone ring in which —O—S— in the —O—$SO_2$— group forms a part of the ring skeleton thereof.

More specific examples of the —$SO_2$-containing cyclic group include groups each represented by General Formulae (a5-r-1) to (a5-r-4) shown below.

(a5-r-1)

(a5-r-2)
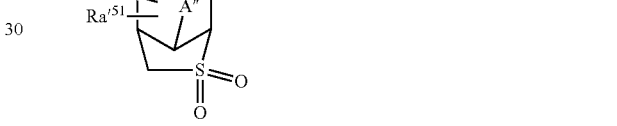

(a5-r-3)

(a5-r-4)

[In the formulae, $Ra'^{51}$s each independently represent a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or a —$SO_2$-containing cyclic group; A" represents an oxygen atom, a sulfur atom, or an alkylene group having 1 to 5 carbon atoms, which may contain an oxygen atom or a sulfur atom; and n' represents an integer in a range of 0 to 2.]

In General Formulae (a5-r-1) and (a5-r-2), A" has the same definition as that for A" in General Formulae (a2-r-2), (a2-r-3) and (a2-r-5).

Respective examples of the alkyl group, the alkoxy group, the halogen atom, the halogenated alkyl group, —COOR", —OC(=O)R", and the hydroxyalkyl group as $Ra'^{51}$ include those the same as those mentioned in the explanation of $Ra'^{21}$ in General Formulae (a2-r-1) to (a2-r-7).

Specific examples of the groups each represented by General Formulae (a5-r-1) to (a5-r-4) are shown below. In the formulae shown below, "Ac" represents an acetyl group.
(r-sl-1-1)
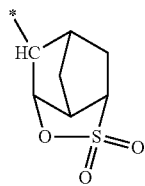
(r-sl-1-2)
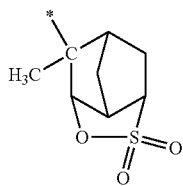
(r-sl-1-3)
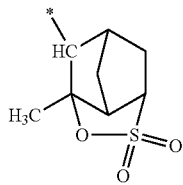
(r-sl-1-4)
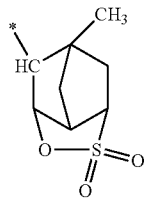
(r-sl-1-5)
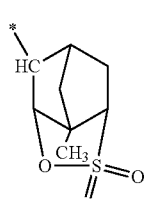
(r-sl-1-6)
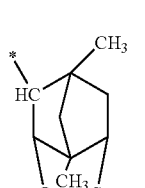
(r-sl-1-7)
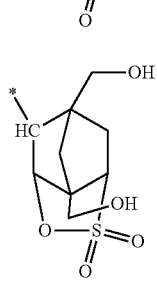
-continued
(r-sl-1-8)
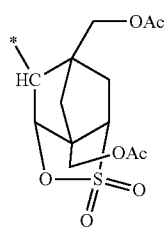
(r-sl-1-9)
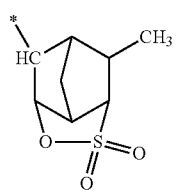
(r-sl-1-10)
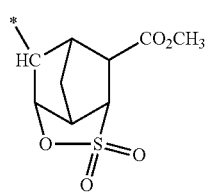
(r-sl-1-11)
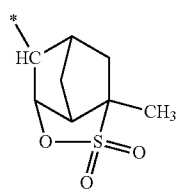
(r-sl-1-12)
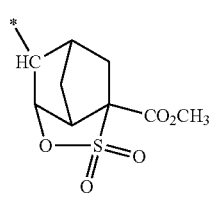
(r-sl-1-13)
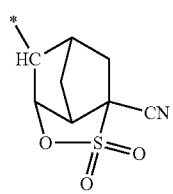
(r-sl-1-14)
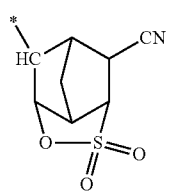
(r-sl-1-15)
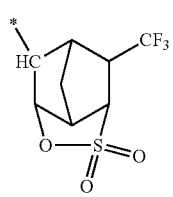

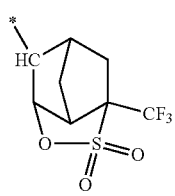 (r-sl-1-16)
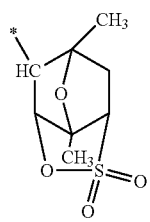 (r-sl-1-23)
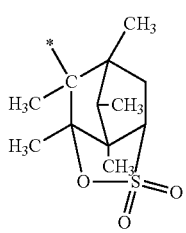 (r-sl-1-17)
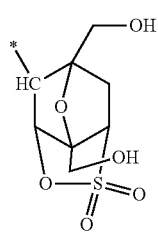 (r-sl-1-24)
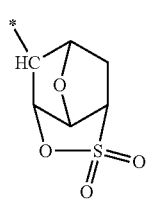 (r-sl-1-18)
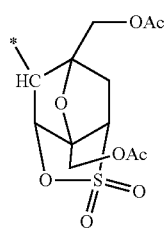 (r-sl-1-25)
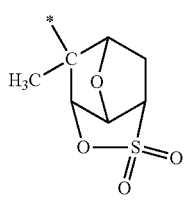 (r-sl-1-19)
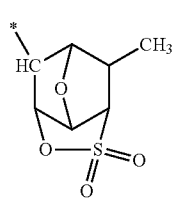 (r-sl-1-26)
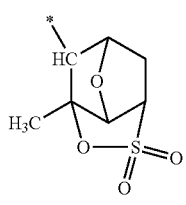 (r-sl-1-20)
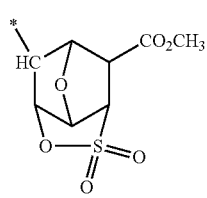 (r-sl-1-27)
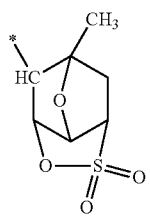 (r-sl-1-21)
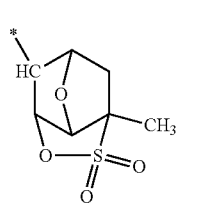 (r-sl-1-28)
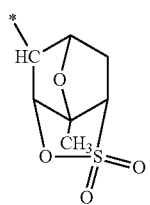 (r-sl-1-22)
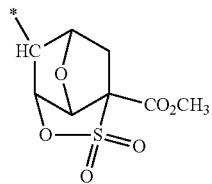 (r-sl-1-29)

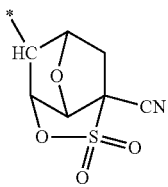
(r-sl-1-30)

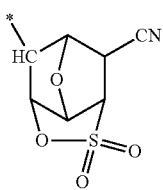
(r-sl-1-31)

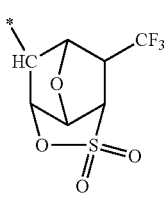
(r-sl-1-32)

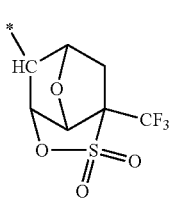
(r-sl-1-33)

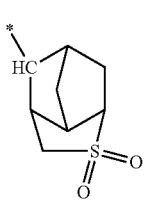
(r-sl-2-1)

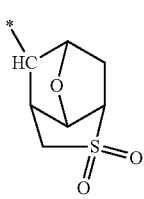
(r-sl-2-2)

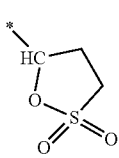
(r-sl-3-1)

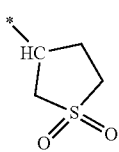
(r-sl-4-1)

The "carbonate-containing cyclic group" indicates a cyclic group having a ring (a carbonate ring) containing —O—C(=O)—O— in the ring skeleton thereof. In a case where the carbonate ring is counted as the first ring and the group contains only the carbonate ring, the group is referred to as a monocyclic group. Further, in a case where the group has other ring structures, the group is referred to as a polycyclic group regardless of the structures. The carbonate-containing cyclic group may be a monocyclic group or a polycyclic group.

The carbonate ring-containing cyclic group is not particularly limited, and any carbonate ring-containing cyclic group may be used. Specific examples thereof include groups each represented by General Formulae (ax3-r-1) to (ax3-r-3) shown below.

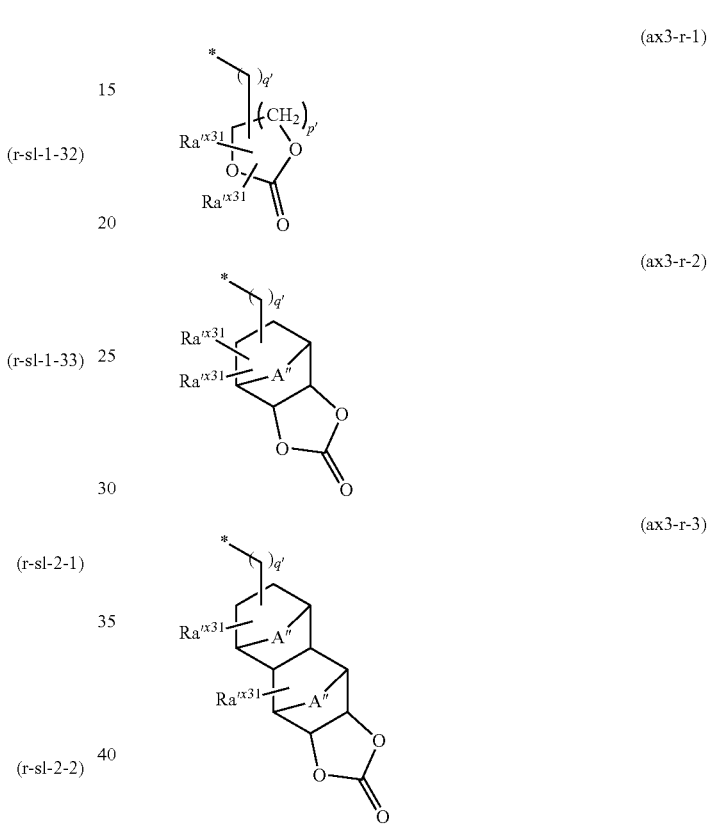

[In the formulae, $Ra'^{x31}$s independently represent a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or a —$SO_2$-containing cyclic group; A" represents an oxygen atom, a sulfur atom, or an alkylene group having 1 to 5 carbon atoms, which may contain an oxygen atom or a sulfur atom; and p' represents an integer in a range of 0 to 3, and q' is 0 or 1.]

In General Formulae (ax3-r-2) and (ax3-r-3), A" has the same definition as that for A" in General Formulae (a2-r-2), (a2-r-3) and (a2-r-5).

Respective examples of the alkyl group, the alkoxy group, the halogen atom, the halogenated alkyl group, —COOR", —OC(=O)R", and the hydroxyalkyl group as $Ra'^{31}$ include those the same as those mentioned in the explanation of $Ra'^{21}$ in General Formulae (a2-r-1) to (a2-r-7).

Specific examples of the groups each represented by General Formulae (ax3-r-1) to (ax3-r-3) are shown below.

(r-cr-1-1)
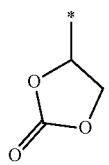
(r-cr-1-2)
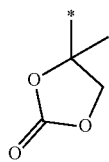
(r-cr-1-3)
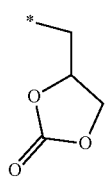
(r-cr-1-4)
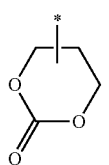
(r-cr-1-5)
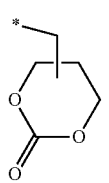
(r-cr-1-6)
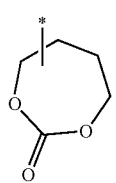
(r-cr-1-7)
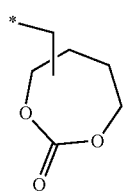
(r-cr-2-1)
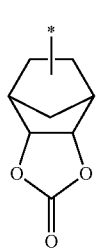
-continued
(r-cr-2-2)
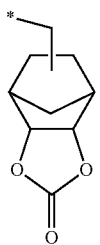
(r-cr-2-3)
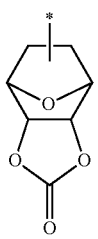
(r-cr-2-4)
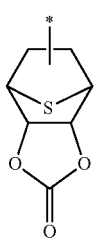
(r-cr-3-1)
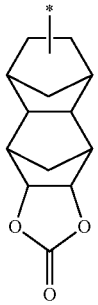
(r-cr-3-2)
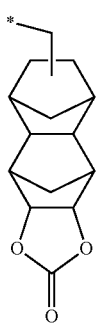

-continued (r-cr-3-3)

(r-cr-3-4)

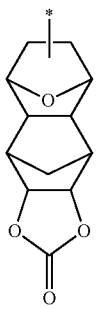

(r-cr-3-5)

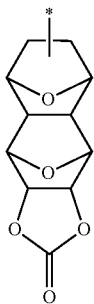

Among them, the constitutional unit (a2) is preferably a constitutional unit derived from acrylic acid ester in which the hydrogen atom bonded to the carbon atom at the α-position may be substituted with a substituent.

The constitutional unit (a2) is preferably a constitutional unit represented by General Formula (a2-1).

(a2-1)

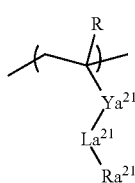

[In the formula, R represents a hydrogen atom, an alkyl group having 1 to 5 carbon atoms, or a halogenated alkyl group having 1 to 5 carbon atoms. $Ya^{21}$ represents a single bond or a divalent linking group. $La^{21}$ represents —O—, —COO—, —CON(R')—, —OCO—, —CONHCO— or —CONHCS—, and R' represents a hydrogen atom or a methyl group. However, in a case where $La^{21}$ represents —O—, $Ya^{21}$ does not represent —CO—. $Ra^{21}$ represents a lactone-containing cyclic group, a carbonate-containing cyclic group, or a —SO$_2$-containing cyclic group.]

In General Formula (a2-1), R has the same definition as described above. R is preferably a hydrogen atom, an alkyl group having 1 to 5 carbon atoms, or a fluorinated alkyl group having 1 to 5 carbon atoms, and particularly preferably a hydrogen atom or a methyl group in terms of industrial availability.

In General Formula (a2-1), the divalent linking group as $Ya^{21}$ is not particularly limited, and suitable examples thereof include a divalent hydrocarbon group which may have a substituent and a divalent linking group having a hetero atom.

Divalent Hydrocarbon Group which May have Substituent:

In a case where $Ya^{21}$ represents a divalent hydrocarbon group which may have a substituent, the hydrocarbon group may be an aliphatic hydrocarbon group or an aromatic hydrocarbon group.

Aliphatic Hydrocarbon Group as $Ya^{21}$

The aliphatic hydrocarbon group indicates a hydrocarbon group that has no aromaticity. The aliphatic hydrocarbon group may be saturated or unsaturated. In general, it is preferable that the aliphatic hydrocarbon group be saturated.

Examples of the aliphatic hydrocarbon group include a linear or branched aliphatic hydrocarbon group, and an aliphatic hydrocarbon group containing a ring in the structure thereof.

Linear or Branched Aliphatic Hydrocarbon Group

The linear aliphatic hydrocarbon group preferably has 1 to 10 carbon atoms, more preferably 1 to 6 carbon atoms, still more preferably 1 to 4 carbon atoms, and most preferably 1 to 3 carbon atoms.

The linear aliphatic hydrocarbon group is preferably a linear alkylene group, and specific examples thereof include a methylene group [—CH$_2$—], an ethylene group [—(CH$_2$)$_2$—], a trimethylene group [—(CH$_2$)$_3$—], a tetramethylene group [—(CH$_2$)$_4$—], and a pentamethylene group [—(CH$_2$)$_5$—].

The branched aliphatic hydrocarbon group has preferably 2 to 10 carbon atoms, more preferably 3 to 6 carbon atoms, still more preferably 3 or 4 carbon atoms, and most preferably 3 carbon atoms.

The branched aliphatic hydrocarbon group is preferably a branched alkylene group, and specific examples thereof include alkylalkylene groups, for example, alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. The alkyl group in the alkylalkylene group is preferably a linear alkyl group having 1 to 5 carbon atoms.

The linear or branched aliphatic hydrocarbon group may have or may not have a substituent. Examples of the substituent include a fluorine atom, a fluorinated alkyl group having 1 to 5 carbon atoms, which has been substituted with a fluorine atom, and a carbonyl group.

Aliphatic Hydrocarbon Group Containing Ring in Structure Thereof

Examples of the aliphatic hydrocarbon group containing a ring in the structure thereof include a cyclic aliphatic hydrocarbon group which may have a substituent containing a hetero atom in the ring structure thereof (a group obtained by removing two hydrogen atoms from an aliphatic hydrocarbon ring), a group obtained by bonding the cyclic aliphatic hydrocarbon group to the terminal of a linear or branched aliphatic hydrocarbon group, and a group obtained by interposing the cyclic aliphatic hydrocarbon group in a linear or branched aliphatic hydrocarbon group. Examples of the linear or branched aliphatic hydrocarbon group include the same groups as those described above.

The cyclic aliphatic hydrocarbon group preferably has 3 to 20 carbon atoms and more preferably 3 to 12 carbon atoms.

The cyclic aliphatic hydrocarbon group may be a polycyclic group or a monocyclic group. The monocyclic alicyclic hydrocarbon group is preferably a group obtained by removing two hydrogen atoms from a monocycloalkane. The monocycloalkane preferably has 3 to 6 carbon atoms, and specific examples thereof include cyclopentane and cyclohexane. The polycyclic alicyclic hydrocarbon group is preferably a group obtained by removing two hydrogen atoms from a polycycloalkane, and the polycycloalkane is preferably a group having 7 to 12 carbon atoms. Specific examples of the polycyclic alicyclic hydrocarbon group include adamantane, norbornane, isobornane, tricyclodecane, and tetracyclododecane.

The cyclic aliphatic hydrocarbon group may have or may not have a substituent. Examples of the substituent include an alkyl group, an alkoxy group, a halogen atom, a halogenated alkyl group, a hydroxyl group, and a carbonyl group.

The alkyl group as the substituent is preferably an alkyl group having 1 to 5 carbon atoms, and more preferably a methyl group, an ethyl group, a propyl group, an n-butyl group, or a tert-butyl group.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and still more preferably a methoxy group or an ethoxy group.

The halogen atom as the substituent is preferably a fluorine atom.

Examples of the halogenated alkyl group as the substituent include groups obtained by substituting part or all of hydrogen atoms in the above-described alkyl groups with the above-described halogen atoms.

In the cyclic aliphatic hydrocarbon group, a part of carbon atoms constituting the ring structure thereof may be substituted with a substituent containing a hetero atom. The substituent containing a hetero atom is preferably —O—, —C(=O)—O—, —S—, —S(=O)$_2$—, or —S(=O)$_2$—O—.

Aromatic Hydrocarbon Group as $Ya^{21}$

The aromatic hydrocarbon group is a hydrocarbon group having at least one aromatic ring.

The aromatic ring is not particularly limited as long as it is a cyclic conjugated system having $(4n+2)\pi$ electrons, and may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms. Here, the number of carbon atoms in a substituent is not included in the number of carbon atoms.

Specific examples of the aromatic ring include aromatic hydrocarbon rings such as benzene, naphthalene, anthracene, and phenanthrene; and an aromatic heterocyclic ring obtained by substituting a part of carbon atoms constituting the above-described aromatic hydrocarbon ring with a hetero atom. Examples of the hetero atom in the aromatic heterocyclic rings include an oxygen atom, a sulfur atom, and a nitrogen atom. Specific examples of the aromatic heterocyclic ring include a pyridine ring and a thiophene ring.

Specific examples of the aromatic hydrocarbon group include a group (an arylene group or a heteroarylene group) obtained by removing two hydrogen atoms from the above-described aromatic hydrocarbon ring or the above-described aromatic heterocyclic ring; a group obtained by removing two hydrogen atoms from an aromatic compound having two or more aromatic rings (such as biphenyl or fluorene); and a group (for example, a group obtained by further removing one hydrogen atom from an aryl group in arylalkyl groups such as a benzyl group, a phenethyl group, a 1-naphthylmethyl group, a 2-naphthylmethyl group, a 1-naphthylethyl group, or a 2-naphthylethyl group) obtained by substituting one hydrogen atom of a group (an aryl group or a heteroaryl group) obtained by removing one hydrogen atom from the above aromatic hydrocarbon ring or the above aromatic heterocyclic ring, with an alkylene group. The alkylene group bonded to the aryl group or the heteroaryl group preferably has 1 to 4 carbon atoms, more preferably 1 or 2 carbon atoms, and particularly preferably 1 carbon atoms.

With respect to the aromatic hydrocarbon group, the hydrogen atom which the aromatic hydrocarbon group has may be substituted with a substituent. For example, the hydrogen atom bonded to the aromatic ring in the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group having 1 to 5 carbon atoms, and more preferably a methyl group, an ethyl group, a propyl group, an n-butyl group, or a tert-butyl group.

Examples of the alkoxy group, the halogen atom, and the halogenated alkyl group, as the substituent, include those the same as those exemplified as the substituent that is substituted for a hydrogen atom which the cyclic aliphatic hydrocarbon group has.

Divalent Linking Group Containing Hetero Atom

In a case where $Ya^{21}$ represents a divalent linking group containing a hetero atom, preferred examples of the linking group include —O—, —C(=O)—O—, —O—C(=O)—, —C(=O)—, —O—C(=O)—O—, —C(=O)—NH—, —NH—, —NH—C(=NH)— (H may be substituted with a substituent such as an alkyl group, an acyl group, or the like), —S—, —S(=O)$_2$—, —S(=O)$_2$—O—, and a group represented by General Formula —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$— or —$Y^{21}$—S(=O)$_2$—O—$Y^{22}$—[in the formulae, $Y^{21}$ and $Y^{22}$ each independently represent a divalent hydrocarbon group which may have a substituent, O represents an oxygen atom, and m'' represents an integer in a range of 0 to 3].

In a case where the divalent linking group containing a hetero atom is —C(=O)—NH—, —C(=O)—NH—C(=O)—, —NH—, or —NH—C(=NH)—, H may be substituted with a substituent such as an alkyl group, an acyl group, or the like. The substituent (an alkyl group, an acyl group, or the like) preferably has 1 to 10 carbon atoms, more preferably 1 to 8 carbon atoms, and most preferably 1 to 5 carbon atoms.

In General Formulae —$Y^{21}$—O—$Y^{22}$—, —$Y^{21}$—O—, —$Y^{21}$—C(O)—O—, —C(=O)—O—$Y^{21}$—, —[$Y^{21}$—C(=O)—O]$_{m''}$—$Y^{22}$—, —$Y^{21}$—O—C(=O)—$Y^{22}$—, and —Y$^{21}$—S(=O)$_2$—O—Y$^{22}$—, Y$^{21}$, and Y$^{22}$ each independently represent a divalent hydrocarbon group which may have a substituent. Examples of the divalent hydrocarbon group include those (mentioned as the divalent hydrocarbon group which may have a substituent) in the explanation of the above-described divalent linking group as Ya$^{21}$.

Y$^{21}$ is preferably a linear aliphatic hydrocarbon group, more preferably a linear alkylene group, still more preferably a linear alkylene group having 1 to 5 carbon atoms, and particularly preferably a methylene group or an ethylene group.

Y$^{21}$ is preferably a linear or branched aliphatic hydrocarbon group and more preferably a methylene group, an ethylene group, or an alkylmethylene group. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula —[Y$^{21}$—C(=O)—O]$_{m''}$—Y$^{22}$—, m'' represents an integer in a range of 0 to 3, preferably an integer in a range of 0 to 2, more preferably 0 or 1, and particularly preferably 1. In other words, it is particularly preferable that the group represented by Formula —[Y$^{21}$—C(=O)—O]$_{m''}$—Y$^{22}$— represent a group represented by Formula —Y$^{21}$—C(=O)—O—Y$^{22}$—. Among these, a group represented by Formula —(CH$_2$)$_{a'}$—C(=O)—O—(CH$_2$)$_{b'}$— is preferable. In the formula, a' represents an integer in a range of 1 to 10, preferably an integer in a range of 1 to 8, more preferably an integer in a range of 1 to 5, still more preferably 1 or 2, and most preferably 1. b' represents an integer in a range of 1 to 10, preferably an integer in a range of 1 to 8, more preferably an integer in a range of 1 to 5, still more preferably 1 or 2, and most preferably 1.

Among the above, Ya$^{21}$ is preferably a single bond, an ester bond [—C(=O)—O—], an ether bond (—O—), a linear or branched alkylene group, or a combination thereof.

In General Formula (a2-1), Ra$^{21}$ represents a lactone-containing cyclic group, a —SO$_2$-containing cyclic group, or a carbonate-containing cyclic group.

Suitable examples of the lactone-containing cyclic group, the —SO$_2$-containing cyclic group, and the carbonate-containing cyclic group as Ra$^{21}$ include groups each represented by General Formulae (a2-r-1) to (a2-r-7), groups each represented by General Formulae (a5-r-1) to (a5-r-4), and groups each represented by General Formulae (ax3-r-1) to (ax3-r-3) described above.

Among them, a lactone-containing cyclic group or a —SO$_2$-containing cyclic group is preferable, and groups each represented by General Formula (a2-r-1), (a2-r-2), (a2-r-6), or (a5-r-1) are more preferable. Specifically, groups each represented by any of Chemical Formulae (r-1c-1-1) to (r-1c-1-7), (r-1c-2-1) to (r-1c-2-18), (r-1c-6-1), (r-s1-1-1), and (r-s1-1-18) are more preferable.

The constitutional unit (a2) which the component (A1) has may be one kind or may be two or more kinds.

In a case where the component (A1) has the constitutional unit (a2), the proportion of the constitutional unit (a2) is preferably in a range of 5% to 50% by mole and more preferably in a range of 10% to 40% by mole, with respect to the total (100% by mole) of all constitutional units constituting the component (A1).

In a case where the proportion of the constitutional unit (a2) is set within the preferred range described above, the solubility of the developing solution can be appropriately ensured, and thus the effects according to the present invention can be more easily obtained.

In Regard to Constitutional Unit (a3):

The component (A1) may further have the constitutional unit (a3) containing a polar group-containing aliphatic hydrocarbon group. In a case where the component (A1) has the constitutional unit (a3), the hydrophilicity of the component (A) is increased, which contributes to an improvement in resolution. Further, acid diffusion length can be appropriately adjusted.

Examples of the polar group include a hydroxyl group, a cyano group, a carboxy group, or a hydroxyalkyl group obtained by substituting a part of hydrogen atoms of the alkyl group with a fluorine atom, and the polar group is particularly preferably a hydroxyl group.

Examples of the aliphatic hydrocarbon group include a linear or branched hydrocarbon group (preferably an alkylene group) having 1 to 10 carbon atoms, and a cyclic aliphatic hydrocarbon group (a cyclic group). The cyclic group may be a monocyclic group or a polycyclic group. For example, these cyclic groups can be suitably selected from a large number of groups that have been proposed in resins for a resist composition for an ArF excimer laser.

In a case where the cyclic group is a monocyclic group, the monocyclic group preferably has 3 to 10 carbon atoms. Among them, a constitutional unit derived from an acrylic acid ester that includes an aliphatic monocyclic group containing a hydroxyl group, cyano group, carboxy group, or a hydroxyalkyl group obtained by substituting a part of hydrogen atoms of the alkyl group with a fluorine atom are particularly preferable. Examples of the monocyclic group include a group obtained by removing two or more hydrogen atoms from a monocycloalkane. Specific examples of the monocyclic group include a group obtained by removing two or more hydrogen atoms from a monocycloalkane such as cyclopentane, cyclohexane, or cyclooctane. Among these monocyclic groups, a group obtained by removing two or more hydrogen atoms from cyclopentane or a group obtained by removing two or more hydrogen atoms from cyclohexane are industrially preferable.

In a case where the cyclic group is a polycyclic group, the polycyclic group preferably has 7 to 30 carbon atoms. Among them, a constitutional unit derived from an acrylic acid ester that includes an aliphatic polycyclic group containing a hydroxyl group, cyano group, carboxy group, or a hydroxyalkyl group obtained by substituting a part of hydrogen atoms of the alkyl group with a fluorine atom is particularly preferable. Examples of the polycyclic group include groups obtained by removing two or more hydrogen atoms from a bicycloalkane, tricycloalkane, tetracycloalkane, or the like. Specific examples thereof include a group obtained by removing two or more hydrogen atoms from a polycycloalkane such as adamantane, norbornane, isobornane, tricyclodecane, or tetracyclododecane. Among these polycyclic groups, a group obtained by removing two or more hydrogen atoms from adamantane, a group obtained by removing two or more hydrogen atoms from norbornane, or a group obtained by removing two or more hydrogen atoms from tetracyclododecane are industrially preferable.

The constitutional unit (a3) is not particularly limited, and any constitutional unit may be used as long as the constitutional unit contains a polar group-containing aliphatic hydrocarbon group.

The constitutional unit (a3) is preferably a constitutional unit derived from an acrylic acid ester in which the hydrogen atom bonded to the carbon atom at the α-position may be substituted with a substituent, where the constitutional unit contains a polar group-containing aliphatic hydrocarbon group.

In a case where the hydrocarbon group in the polar group-containing aliphatic hydrocarbon group is a linear or branched hydrocarbon group having 1 to 10 carbon atoms, the constitutional unit (a3) is preferably a constitutional unit derived from a hydroxyethyl ester of acrylic acid.

Further, as the constitutional unit (a3), in a case where the hydrocarbon group in the polar group-containing aliphatic hydrocarbon group is a polycyclic group, a constitutional unit represented by General Formula (a3-1), a constitutional unit represented by General Formula (a3-2), or a constitutional unit represented by General Formula (a3-3) is preferable, and in a case where the hydrocarbon group is a monocyclic group, a constitutional unit represented by General Formula (a3-4) is preferable.

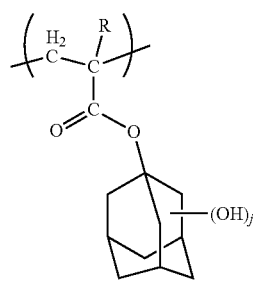
(a3-1)

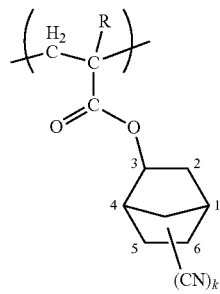
(a3-2)

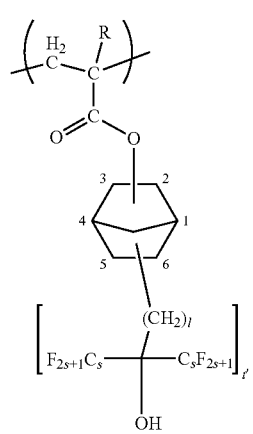
(a3-3)

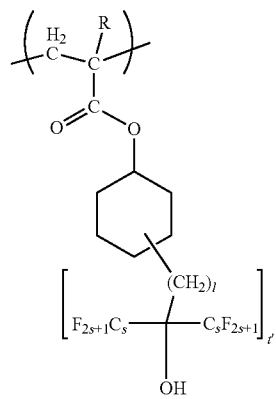
(a3-4)

[In the formulae, R has the same definition as described above, j represents an integer in a range of 1 to 3, k represents an integer in a range of 1 to 3, t' represents an integer in a range of 1 to 3, l represents an integer in a range of 0 to 5, and s represents an integer in a range of 1 to 3.]

In General Formula (a3-1), j preferably represents 1 or 2 and more preferably 1. In a case where j represents 2, it is preferable that the hydroxyl groups be bonded to the 3- and 5-positions of the adamantyl group. In a case where j represents 1, it is preferable that the hydroxyl group be bonded to the 3-position of the adamantyl group.

It is preferable that j represent 1, and it is particularly preferable that the hydroxyl group be bonded to the 3-position of the adamantyl group.

In General Formula (a3-2), k preferably represents 1. The cyano group is preferably bonded to the 5- or 6-position of the norbornyl group.

In General Formula (a3-3), it is preferable that t' represent 1. It is preferable that l represent 1. It is preferable that s represent 1. Further, it is preferable that a 2-norbornyl group or 3-norbornyl group be bonded to the terminal of the carboxy group of the acrylic acid. It is preferable that the fluorinated alkyl alcohol be bonded to the 5- or 6-position of the norbornyl group.

In General Formula (a3-4), it is preferable that t' represent 1 or 2. It is preferable that l represent 0 or 1. It is preferable that s represent 1. It is preferable that the fluorinated alkyl alcohol be bonded to the 3- or 5-position of the cyclohexyl group.

The constitutional unit (a3) which the component (A1) has may be one kind or may be two or more kinds.

In a case where the component (A1) has the constitutional unit (a3), the proportion of the constitutional unit (a3) is preferably in a range of 1% to 30% by mole, more preferably in a range of 2% to 25% by mole, and still more preferably in a range of 5% to 20% by mole, with respect to the total amount (100% by mole) of all constitutional units constituting the component (A1).

In a case where the proportion of the constitutional unit (a3) is equal to or greater than the lower limit value of the preferred range, the effect obtained by allowing the component (A1) to contain the constitutional unit (a3) can be sufficiently achieved by the effect described above. In a case where the proportion of the constitutional unit (a3) is equal to or lower than the upper limit value of the preferred range, balance with other constitutional units can be obtained, and various lithography characteristics are improved.

In Regard to Constitutional Unit (a4):

The component (A1) may further have a constitutional unit (a4) containing an acid non-dissociable aliphatic cyclic group.

In a case where the component (A1) has the constitutional unit (a4), the dry etching resistance of the formed resist pattern is improved. Further, the hydrophobicity of the component (A) increases. The improvement in hydrophobicity contributes to the improvement in resolution, a resist pattern shape, and the like, particularly in the case of a solvent developing process.

The "acid non-dissociable cyclic group" in the constitutional unit (a4) is a cyclic group that remains in the constitutional unit without being dissociated even when an acid acts in a case where the acid is generated in the resist composition by exposure (for example, in a case where an acid is generated from the constitutional unit generating an acid upon exposure or the component (B)).

Examples of the constitutional unit (a4) preferably include a constitutional unit derived from an acrylic acid ester including an acid non-dissociable aliphatic cyclic group. As the cyclic group, many cyclic groups conventionally known as cyclic groups used as a resin component of a resist composition for ArF excimer laser, KrF excimer laser (preferably ArF excimer laser), or the like can be used.

The cyclic group is particularly preferably at least one selected from a tricyclodecyl group, an adamantyl group, a tetracyclododecyl group, an isobornyl group, and a norbornyl group, from the viewpoint of industrial availability. These polycyclic groups may have, as a substituent, a linear or branched alkyl group having 1 to 5 carbon atoms.

Specific examples of the constitutional unit (a4) include constitutional units each represented by General Formulae (a4-1) to (a4-7).

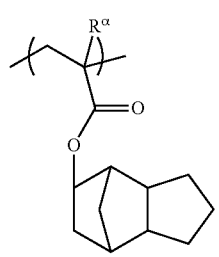
(a4-1)

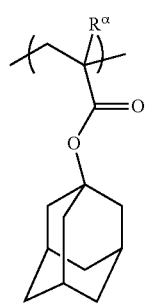
(a4-2)

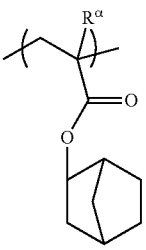
(a4-3)

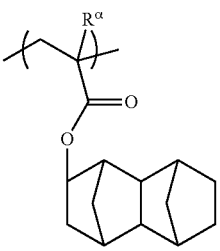
(a4-4)

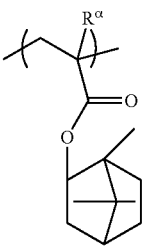
(a4-5)

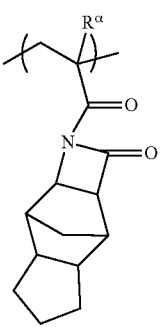
(a4-6)

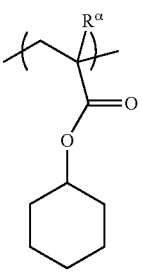
(a4-7)

[In the formula, $R^\alpha$ is the same as above.]

The constitutional unit (a4) which the component (A1) has may be one kind or may be two or more kinds.

In a case where the component (A1) has the constitutional unit (a4), the proportion of the constitutional unit (a4) is preferably in a range of 1% to 40% by mole and more preferably in a range of 5% to 20% by mole, with respect to the total (100% by mole) of all constitutional units constituting the component (A1).

In a case where the proportion of the constitutional unit (a4) is equal to or greater than the lower limit value of the preferred range, the effect obtained by allowing the component (A1) to contain the constitutional unit (a4) can be sufficiently achieved. In a case where the proportion of the constitutional unit (a4) is equal to or lower than the upper limit value of the preferred range, the balance with other constitutional units is obtained easily.

In Regard to Constitutional Unit (St):

The constitutional unit (st) is a constitutional unit derived from styrene or a styrene derivative. A "constitutional unit derived from styrene" means a constitutional unit that is formed by the cleavage of an ethylenic double bond of styrene. A "constitutional unit derived from a styrene derivative" means a constitutional unit (provided that a constitutional unit corresponding to the constitutional unit (a10) is excluded) formed by the cleavage of an ethylenic double bond of a styrene derivative.

The "styrene derivative" means a compound obtained by substituting at least a part of hydrogen atoms of styrene with a substituent. Examples of the styrene derivative include a derivative obtained by substituting a hydrogen atom at the α-position of styrene with a substituent, a derivative obtained by substituting one or more hydrogen atoms of the benzene ring of styrene with a substituent, and a derivative obtained by substituting a hydrogen atom at the α-position of styrene and one or more hydrogen atoms of the benzene ring with a substituent.

Examples of the substituent that is substituted for the hydrogen atom at the α-position of styrene include an alkyl group having 1 to 5 carbon atoms or a halogenated alkyl group having 1 to 5 carbon atoms.

The alkyl group having 1 to 5 carbon atoms is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group.

The halogenated alkyl group having 1 to 5 carbon atoms is a group obtained by substituting part or all of hydrogen atoms in the alkyl group having 1 to 5 carbon atoms with a halogen atom. The halogen atom is particularly preferably a fluorine atom.

The substituent that is substituted for the hydrogen atom at the α-position of styrene is preferably an alkyl group having 1 to 5 carbon atoms or a fluorinated alkyl group having 1 to 5 carbon atoms, more preferably an alkyl group having 1 to 3 carbon atoms or a fluorinated alkyl group having 1 to 3 carbon atoms, and still more preferably a methyl group from the viewpoint of industrial availability.

Examples of the substituent that is substituted for the hydrogen atom of the benzene ring of styrene include an alkyl group, an alkoxy group, a halogen atom, and a halogenated alkyl group.

The alkyl group as the substituent is preferably an alkyl group having 1 to 5 carbon atoms, and more preferably a methyl group, an ethyl group, a propyl group, an n-butyl group, or a tert-butyl group.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and still more preferably a methoxy group or an ethoxy group.

The halogen atom as the substituent is preferably a fluorine atom.

Examples of the halogenated alkyl group as the substituent include groups obtained by substituting part or all of hydrogen atoms in the above-described alkyl groups with the above-described halogen atoms.

The substituent that is substituted for the hydrogen atom of the benzene ring of styrene is preferably an alkyl group having 1 to 5 carbon atoms, more preferably a methyl group or an ethyl group, and still more preferably a methyl group.

The constitutional unit (st) is preferably a constitutional unit derived from styrene or a constitutional unit derived from a styrene derivative obtained by substituting a hydrogen atom at the α-position of styrene with an alkyl group having 1 to 5 carbon atoms or a halogenated alkyl group having 1 to 5 carbon atoms, more preferably a constitutional unit derived from styrene, or a constitutional unit derived from a styrene derivative obtained by substituting a hydrogen atom at the α-position of styrene with a methyl group, and still more preferably a constitutional unit derived from styrene.

The constitutional unit (st) which the component (A1) has may be one kind or may be two or more kinds.

In a case where the component (A1) has the constitutional unit (st), the proportion of the constitutional unit (st) is preferably in a range of 1% to 30% by mole and more preferably in a range of 3% to 20% by mole with respect to the total (100% by mole) of all constitutional units constituting the component (A1).

The component (A1) contained in the resist composition may be used alone or in a combination of two or more kinds thereof.

The resist composition according to the present embodiment, the component (A1) is a resin component that contains the constitutional unit (a01) and the constitutional unit (a02) Examples of the component (A1) include a mixture of a polymer compound having a repeating structure of the constitutional unit (a01) and a polymer compound having a repeating structure of the constitutional unit (a02); and a copolymer having a repeating structure of the constitutional unit (a01) and the constitutional unit (a02).

Examples of the preferred component (A1) include a copolymer that has a repeating structure of the constitutional unit (a01) and the constitutional unit (a02).

The proportion of the constitutional unit (a01) as the copolymer that has a repeating structure of the constitutional unit (a01) and the constitutional unit (a02) is preferably 20% by mole or more and 80% by mole or less, more preferably 30% by mole or more and 70% by mole or less, and still more preferably 40% by mole or more and 60% by mole or less, with respect to the total (100% by mole) of all constitutional units constituting the copolymer.

The proportion of the constitutional unit (a02) is preferably 20% by mole or more and 80% by mole or less, more preferably 30% by mass or more and 70% by mole or less, and still more preferably 40% by mass or more and 60% by mole or less, with respect to the total (100% by mole) of all constitutional units constituting the copolymer.

In a case where the proportion of each of the constitutional units is set within the preferred range described above, the effects of the present invention can be more easily obtained.

The component (A1) can be produced by dissolving, in a polymerization solvent, each monomer from which the constitutional unit is derived, adding thereto a radical polymerization initiator such as azobisisobutyronitrile (AIBN) or dimethyl azobisisobutyrate (for example, V-601) to perform polymerization.

Alternatively, the component (A1) can be produced by dissolving, in a polymerization solvent, a compound represented by General Formula (a01-1), a precursor of a compound represented by General Formula (a02-1), and, as necessary, a monomer from which a constitutional unit other than the constitutional unit (a01) and the constitutional unit (a02) is derived, and adding thereto a radical polymerization initiator such as described above to perform polymerization and then performing a deprotection reaction.

Further, a —C(CF$_3$)$_2$—OH group may be introduced into the terminal of the component (A1) during the polymerization using a chain transfer agent such as HS—CH$_2$—CH$_2$—CH$_2$—C(CF$_3$)$_2$—OH in combination. As described above, a copolymer into which a hydroxyalkyl group, formed by substitution of a part of hydrogen atoms in the alkyl group with fluorine atoms, has been introduced is effective for reducing development defects and reducing line edge roughness (LER: uneven irregularities of a line side wall).

The weight-average molecular weight (Mw) (based on the polystyrene-equivalent value determined by gel permeation chromatography (GPC)) of the component (A1), which is not particularly limited, is preferably in a range of 1,000 to 50,000, more preferably in a range of 2,000 to 30,000, and still more preferably in a range of 3,000 to 20,000.

In a case where Mw of the component (A1) is equal to or lower than the upper limit value of this preferred range, a resist solvent solubility sufficient to be used as a resist is exhibited. On the other hand, in a case where Mw of the component (A1) is equal to or greater than the lower limit value of this preferred range, dry etching resistance and the cross-sectional shape of the resist pattern become excellent.

Further, the dispersity (Mw/Mn) of the component (A1) is not particularly limited, but is preferably in a range of 1.0 to 4.0, more preferably in a range of 1.0 to 3.0, and particularly preferably in a range of 1.0 to 2.0. Mn represents the number-average molecular weight.

In Regard to Component (A2)

In the resist composition according to the present embodiment, a base material component (hereinafter, referred to as a "component (A2)") exhibiting changed solubility in a developing solution under action of acid, which does not correspond to the component (A1), may be used in combination as the component (A).

The component (A2) is not particularly limited and may be freely selected and used from a large number of conventionally known base material components for the chemical amplification-type resist composition.

As the component (A2), a polymer compound or a low-molecular-weight compound may be used alone or in a combination of two or more kinds thereof.

The proportion of the component (A1) in the component (A) is preferably 25% by mass or more, more preferably 50% by mass or more, still more preferably 75% by mass or more, and may be 100% by mass with respect to the total mass of the component (A). In a case where the proportion is 25% by mass or more, a resist pattern having various excellent lithography characteristics such as high sensitivity, resolution, and roughness reduction, and having a good shape is easily formed.

The content of the component (A) in the resist composition according to the present embodiment may be adjusted depending on the resist film thickness to be formed and the like.

<Acid Generator Component (B)>

The resist composition according to the present embodiment may further contain an acid generator component (B) generating an acid upon exposure in addition to the component (A). In the present embodiment, the component (B) contains a compound (B1) (hereinafter, also referred to as a "component (B1)") represented by General Formula (b1).

<In Regard to Component (B1)>

The component (B1) is a compound represented by General Formula (b1).

[In the formula, Rb$^1$ represents a hydrocarbon group which may have a substituent. However, Rb$^1$ does not contain a fluorine atom. m represents an integer of 1 or greater, and M$^{m+}$ represents an m-valent organic cation.]

{Anion Moiety}

In General Formula (b1), R$^{b1}$ represents a hydrocarbon group which may have a substituent. However, Rb$^1$ does not contain a halogen atom. Since Rb$^1$ does not contain a halogen atom, the acidity of the acid generated from the component (B1) upon exposure is suitably controlled, and it is hard for the acid to act on the unexposed part of the resist film. Examples of the hydrocarbon group as Rb$^1$ include a cyclic group which may have a substituent, a chain-like alkyl group which may have a substituent, and a chain-like alkenyl group which may have a substituent.

Cyclic Group which May have Substituent:

The cyclic group may be an aromatic hydrocarbon group or may be an aliphatic hydrocarbon group. The aliphatic hydrocarbon group indicates a hydrocarbon group that has no aromaticity. The aliphatic hydrocarbon group may be saturated or unsaturated. In general, it is preferable that the aliphatic hydrocarbon group be saturated.

The aromatic hydrocarbon group as Rb$^1$ is a hydrocarbon group having an aromatic ring. The aromatic hydrocarbon group preferably has 3 to 30 carbon atoms, more preferably 5 to 30 carbon atoms, still more preferably 5 to 20 carbon atoms, particularly preferably 6 to 15 carbon atoms, and most preferably 6 to 10 carbon atoms. Here, the number of carbon atoms in a substituent is not included in the number of carbon atoms.

Specific examples of the aromatic ring the aromatic hydrocarbon group has as Rb$^1$ include benzene, fluorene, naphthalene, anthracene, phenanthrene, biphenyl, or an aromatic heterocyclic ring obtained by substituting part of carbon atoms constituting this aromatic ring with a hetero atom. Examples of the hetero atom in the aromatic heterocyclic rings include an oxygen atom, a sulfur atom, and a nitrogen atom.

Specific examples of the aromatic hydrocarbon group as Rb$^1$ include a group (an aryl group such as a phenyl group or a naphthyl group) obtained by removing one hydrogen atom from the above-described aromatic ring and a group (an arylalkyl group such as a benzyl group, a phenethyl group, a 1-naphthylmethyl group, a 2-naphthylmethyl group, 1-naphthylethyl group, or a 2-naphthylethyl group) obtained by substituting one hydrogen atom in the aromatic ring with an alkylene group. The alkylene group (an alkyl chain in the arylalkyl group) preferably has 1 to 4 carbon atoms, more preferably 1 or 2 carbon atoms, and particularly preferably 1 carbon atom.

Examples of the cyclic aliphatic hydrocarbon group as Rb$^1$ include aliphatic hydrocarbon groups containing a ring in the structure thereof.

Examples of the aliphatic hydrocarbon group containing a ring in the structure thereof include an alicyclic hydrocarbon group (a group obtained by removing one hydrogen atom from an aliphatic hydrocarbon ring), a group obtained by bonding the alicyclic hydrocarbon group to the terminal of a linear or branched aliphatic hydrocarbon group, and a group obtained by interposing the alicyclic hydrocarbon group is in a linear or branched aliphatic hydrocarbon group.

The alicyclic hydrocarbon group preferably has 3 to 20 carbon atoms and more preferably 3 to 12 carbon atoms.

The alicyclic hydrocarbon group may be a polycyclic group or a monocyclic group.

The monocyclic alicyclic hydrocarbon group is preferably a group obtained by removing one or more hydrogen atoms from a monocycloalkane. The monocycloalkane preferably has 3 to 6 carbon atoms, and specific examples thereof include cyclopentane and cyclohexane.

The polycyclic alicyclic hydrocarbon group is preferably a group obtained by removing one or more hydrogen atoms from a polycycloalkane, and the polycycloalkane preferably has 7 to 30 carbon atoms. Among polycycloalkanes, a polycycloalkane having a cross-linked ring-based polycyclic skeleton, such as adamantane, norbornane, isobornane, tricyclodecane, or tetracyclododecane, and a polycycloalkane having a condensed ring-based polycyclic skeleton, such as a cyclic group having a steroid skeleton are preferable.

Among them, the cyclic aliphatic hydrocarbon group as $Rb^1$ is preferably a group obtained by removing one or more hydrogen atoms from a monocycloalkane or a polycycloalkane, more preferably a group obtained by removing one hydrogen atom from a polycycloalkane, and still more preferably an adamantyl group or a norbornyl group.

The linear or branched aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and particularly preferably 1 to 3 carbon atoms.

The linear aliphatic hydrocarbon group is preferably a linear alkylene group, and specific examples thereof include a methylene group [—$CH_2$—], an ethylene group [—($CH_2$)$_2$—], a trimethylene group [—($CH_2$)$_3$—], a tetramethylene group [—($CH_2$)$_4$—], and a pentamethylene group [—($CH_2$)$_5$—].

The branched aliphatic hydrocarbon group is preferably a branched alkylene group, and specific examples thereof include alkylalkylene groups, for example, alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; alkylethylene groups such as —CH($CH_3$)$CH_2$—, —CH($CH_3$)CH($CH_3$)—, —C($CH_3$)$_2CH_2$—, —CH($CH_2CH_3$)$CH_2$—, and —C($CH_2CH_3$)$_2$—$CH_2$—; alkyltrimethylene groups such as —CH($CH_3$)$CH_2CH_2$—, and —$CH_2$CH($CH_3$)$CH_2$—; and alkyltetramethylene groups such as —CH($CH_3$)$CH_2CH_2CH_2$—, and —$CH_2$CH($CH_3$)$CH_2CH_2$—. The alkyl group in the alkylalkylene group is preferably a linear alkyl group having 1 to 5 carbon atoms.

In the linear or branched aliphatic hydrocarbon group which may be bonded to the alicyclic hydrocarbon group, parts of carbon atoms constituting the aliphatic hydrocarbon chain may be substituted with a divalent linking group containing a hetero atom. Examples of the hetero atom include an oxygen atom, a nitrogen atom, and a sulfur atom. Examples of the divalent linking group containing the above hetero atom include —O—, —C(=O)—O—, —O—C(=O)—, —C(=O)—, —O—C(=O)—O—, —C(=O)—NH—, —NH—, —NH—C(=NH)— (H may be substituted with a substituent such as an alkyl group and an acyl group), —S—, —S(=O)$_2$—, and —S(=O)$_2$—O—. Among these, —O—, —C(=O)—O—, —O—C(=O)—, —C(=O)—, or —O—C(=O)—O— is more preferable, and —C(=O)—O— or —O—C(=O)— is more preferable.

The cyclic hydrocarbon group as $Rb^1$ may contain a hetero atom such as a heterocyclic ring. Specific examples thereof include lactone-containing cyclic groups each represented by General Formulae (a2-r-1) to (a2-r-7), —$SO_2$-containing cyclic groups each represented by General Formulae (a5-r-1) to (a5-r-4), and other heterocyclic groups each represented by Chemical Formulae (r-hr-1) to (r-hr-16).

(r-hr-1)

(r-hr-2)

(r-hr-3)

(r-hr-4)

(r-hr-5)

(r-hr-6)

(r-hr-7)

(r-hr-8)

(r-hr-9)

(r-hr-10)

 (r-hr-11)

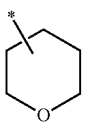 (r-hr-12)

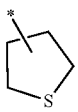 (r-hr-13)

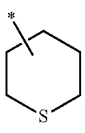 (r-hr-14)

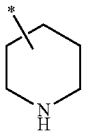 (r-hr-15)

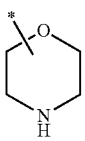 (r-hr-16)

Examples of the substituent of the cyclic group as $Rb^1$ include an alkyl group, an alkoxy group, a hydroxyl group, a carbonyl group, and a nitro group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

The carbonyl group as the substituent is a group that substitutes a methylene group (—$CH_2$—) constituting the cyclic hydrocarbon group.

Chain-Like Alkyl Group which May have Substituent:

The chain-like alkyl group as $Rb^1$ may be linear or branched.

The linear alkyl group preferably has 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group.

The branched alkyl group preferably has 3 to 20 carbon atoms, more preferably 3 to 15 carbon atoms, and most preferably 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-Like Alkenyl Group which May have Substituent:

The alkenyl group as $Rb^1$ may be linear or branched, preferably has 2 to 10 carbon atoms, more preferably 2 to 5 carbon atoms, still more preferably 2 to 4 carbon atoms, and particularly preferably 3 carbon atoms. Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group.

Among the above, the chain-like alkenyl group is preferably a linear alkenyl group, more preferably a vinyl group or a propenyl group, and particularly preferably a vinyl group.

Examples of the substituent in the chain-like alkyl group or alkenyl group as $Rb^1$ include an alkoxy group, a hydroxyl group, a carbonyl group, a nitro group, an amino group, a cyclic group as Rb'.

Among the above, $Rb^1$ is preferably a cyclic aliphatic hydrocarbon group which may have a substituent.

The cyclic aliphatic hydrocarbon group is preferably a polycyclic alicyclic hydrocarbon group, more preferably a group (a cross-linked ring-type alicyclic hydrocarbon group) obtained by removing one or more hydrogen atoms from a polycycloalkane having a cross-linked ring-based polycyclic skeleton or a lactone-containing cyclic group represented by General Formula (a2-r-7), and still more preferably a group obtained by removing one or more hydrogen atoms from adamantane or norbornane, or a lactone-containing cyclic group represented by General Formula (a2-r-7).

The substituent is preferably an alkyl group or a carbonyl group.

Suitable specific examples of $Rb^1$ include a group obtained by removing one or more hydrogen atoms from adamantane or norbornane, which may have a substituent (an alkyl group and/or a carbonyl group), or a lactone-containing cyclic group represented by General Formula (a2-r-7).

Examples of the anion moiety of the component (B1) include a compound represented by General Formula (b1-1).

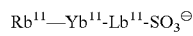 (b1-1)

[In the formula, $Lb^{11}$ represents an alkylene group which may have a substituent. $Yb^{11}$ represents a single bond or a divalent linking group containing an oxygen atom. $Rb^{11}$ represents an alicyclic hydrocarbon group which may have a substituent. However, $Lb^{11}$, $Yb^{11}$, and RV do not contain a halogen atom.]

In General Formula (b1-1), $Lb^{11}$ represents an alkylene group which may have a substituent. The alkylene group has preferably 1 to 10 carbon atoms, more preferably 1 to 5 carbon atoms, still more preferably 1 to 3 carbon atoms, and particularly preferably 1 or 2 carbon atoms. The alkylene group may be linear or branched.

Specific examples of the alkylene group as $Lb^{11}$ include a methylene group [—$CH_2$—]; an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, or —$C(CH_2CH_3)_2$—; an ethylene group [—$CH_2CH_2$—]; an alkylethylene group such as —$CH(CH_3)CH_2$—, —CH (CH₃)CH(CH₃)—, —C(CH₃)₂CH₂—, or —CH(CH₂CH₃)CH₂—; a trimethylene group (n-propylene group) [—CH₂CH₂CH₂—]; an alkyltrimethylene group such as —CH(CH₃)CH₂CH₂— or —CH₂CH(CH₃)CH₂—; a tetramethylene group [—CH₂CH₂CH₂CH₂—]; an alkyltetramethylene group such as —CH(CH₃)CH₂CH₂CH₂—, or —CH₂CH(CH₃)CH₂CH₂—; and a pentamethylene group [—CH₂CH₂CH₂CH₂CH₂—].

The alkylene group as $Lb^{11}$ may have or may not have a substituent; however, it preferably does not have a substituent. Examples of the substituent that the alkylene group as $Lb^{11}$ may have include an alkoxy group, a hydroxyl group, a carbonyl group, a nitro group, and an amino group.

The alkylene group as $Lb^{11}$ is preferably a linear alkylene group having 1 to 5 carbon atoms, more preferably a linear alkylene group having 1 to 3 carbon atoms, and still more preferably a methylene group or an ethylene group.

In General Formula (b-1), $Yb^{11}$ represents a single bond or a divalent linking group containing an oxygen atom.

In a case where $Yb^{11}$ represents a divalent linking group containing an oxygen atom, $Yb^{11}$ may contain an atom other than an oxygen atom. Examples of atoms other than an oxygen atom include a carbon atom, a hydrogen atom, a sulfur atom, and a nitrogen atom.

Examples of divalent linking groups containing an oxygen atom include non-hydrocarbon-based oxygen atom-containing linking groups such as an oxygen atom (an ether bond; —O—), an ester bond (—C(=O)—O—), an oxycarbonyl group (—O—C(=O)—), an amide bond (—C(=O)—NH—), a carbonyl group (—C(=O)—), or a carbonate bond (—O—C(=O)—O—); and combinations of the above-described non-hydrocarbon-based oxygen atom-containing linking groups with an alkylene group. Furthermore, a sulfonyl group (—SO₂—) may be linked to the combination. Examples of such a divalent linking group containing an oxygen atom include linking groups each represented by General Formulae (y-a1-1) to (y-a1-7) shown below.

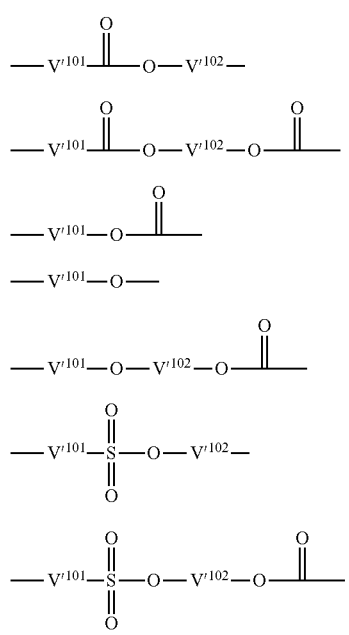

(y-a1-1)
(y-a1-2)
(y-a1-3)
(y-a1-4)
(y-a1-5)
(y-a1-6)
(y-a1-7)

[In the formulae, $V'^{101}$ represents a single bond or an alkylene group having 1 to 5 carbon atoms, and $V'^{102}$ represents a divalent saturated hydrocarbon group having 1 to 30 carbon atoms.]

The divalent saturated hydrocarbon group as $V'^{102}$ is preferably an alkylene group having 1 to 30 carbon atoms, more preferably an alkylene group having 1 to 10 carbon atoms, and still more preferably an alkylene group having 1 to 5 carbon atoms.

The alkylene group as $V'^{101}$ and $V'^{102}$ may be a linear alkylene group or a branched alkylene group, and a linear alkylene group is preferable.

Specific examples of the alkylene group as $V'^{101}$ and $V'^{102}$ include the same as those mentioned as the alkylene group as $Lb^{11}$.

$Yb^{11}$ preferably represents a divalent linking group containing an ester bond, a divalent linking group containing an ether bond, or a single bond, and more preferably linking groups each represented by General Formulae (y-a1-1) to (y-a1-5) or a single bond. Among them, $Yb^{11}$ is preferably —O—, —C(=O)—O—, —O—C(=O)—, —C(=O)—, —O—C(=O)—O—, or a single bond and is more preferably —C(=O)—O—, —O—C(=O)—, or a single bond.

In General Formula (b1-1), $Rb^{11}$ represents an alicyclic hydrocarbon group which may have a substituent.

Examples of the alicyclic hydrocarbon group as $Rb^{11}$ include the same as those mentioned as the alicyclic hydrocarbon group as $Rb^1$. Among them, the alicyclic hydrocarbon group as $Rb^{11}$ is preferably a polycyclic alicyclic hydrocarbon group, more preferably a group (a cross-linked ring-type alicyclic hydrocarbon group) obtained by removing one or more hydrogen atoms from a polycycloalkane having a cross-linked ring-based polycyclic skeleton or a lactone-containing cyclic group represented by General Formula (a2-r-7), and still more preferably a group obtained by removing one or more hydrogen atoms from adamantane or norbornane, or a lactone-containing cyclic group represented by General Formula (a2-r-7).

The substituent is preferably an alkyl group or a carbonyl group.

Preferred specific examples of the anion moiety of the component (B1) are shown below.

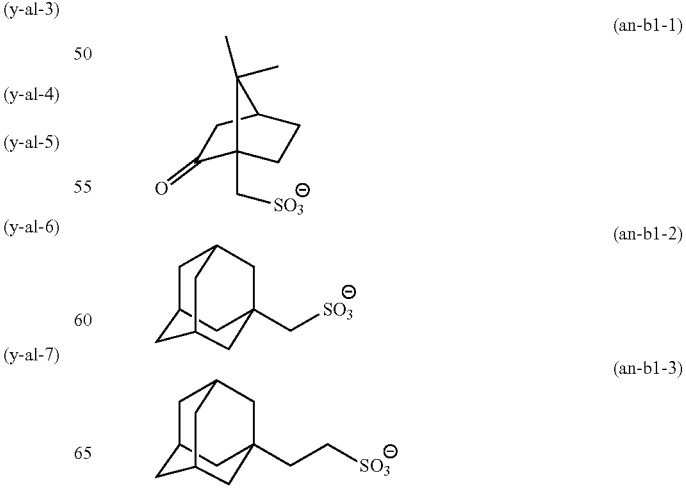

(an-b1-1)
(an-b1-2)
(an-b1-3)

(an-b1-4) 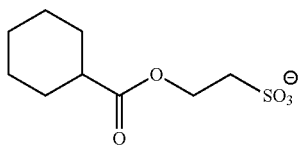

(an-b1-5) 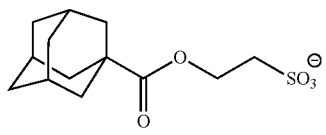

(an-b1-6) 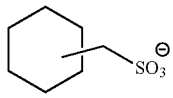

(an-b1-7) 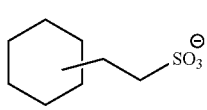

(an-b1-8) 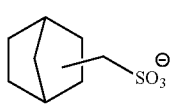

(an-b1-9) 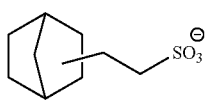

(an-b1-10) 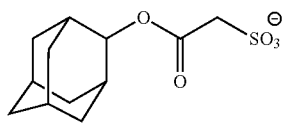

(an-b1-11) 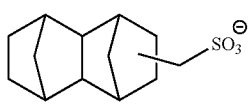

(an-b1-12) 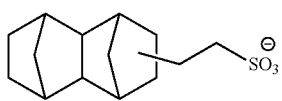

(an-b1-13) 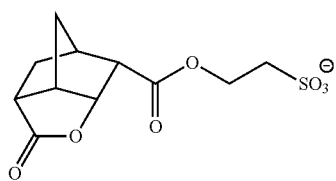

(an-b1-14) 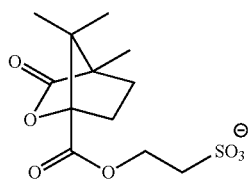

(an-b1-15) 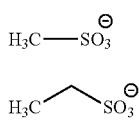

(an-b1-16) H$_3$C—CH$_2$—SO$_3^\ominus$ (an-b1-17) $C_aH_{2a+1}SO_3^-$
(a = 3~10)

(an-b1-18) 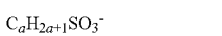

(an-b1-19) 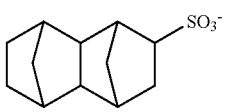

(an-b1-20) 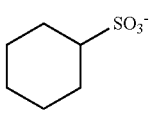

(an-b1-21) 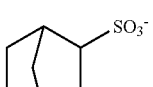

(an-b1-22) 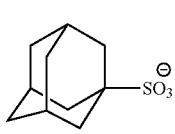

(an-b1-23) 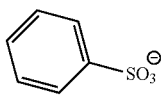

Among the above, the anion moiety of the component (B1) is preferably anions each represented by Chemical Formulae (an-b1-1), (an-b1-10), or (an-b1-14).

{Cation Moiety}

In General Formula (b1), $M^{m+}$ represents an m-valent onium cation. Among them, a sulfonium cation and an iodonium cation are preferable. m represents an integer of 1 or greater.

Preferred examples of the cation moiety $((M^{m+})_{1/m})$ include organic cations each represented by General Formulae (ca-1) to (ca-5).

(ca-1) 

(ca-2) 

(ca-3) 

(ca-4) 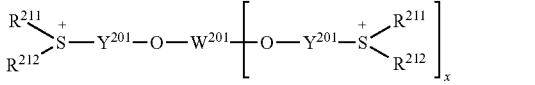

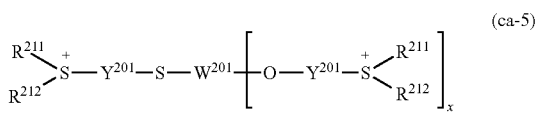

(ca-5)

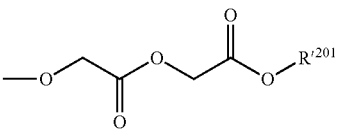

[ca-r-7]

[In the formula, $R^{201}$ to $R^{207}$, $R^{211}$, and $R^{212}$ each independently represent an aryl group, an alkyl group, or an alkenyl group, each of which may have a substituent. $R^{201}$ to $R^{203}$, $R^{206}$ and $R^{207}$, or $R^{211}$ and $R^{212}$ may be bonded to each other to form a ring together with the sulfur atoms in the formulae. $R^{208}$ and $R^{209}$ each independently represent a hydrogen atom or an alkyl group having 1 to 5 carbon atoms. $R^{210}$ represents an aryl group which may have a substituent, an alkyl group which may have a substituent, an alkenyl group which may have a substituent, or a —SO$_2$-containing cyclic group which may have a substituent. $L^{201}$ represents —C(=O)— or —C(=O)—O—. $Y^{201}$s each independently represent an arylene group, an alkylene group, or an alkenylene group. x represents 1 or 2. $W^{201}$ represents an (x+1)-valent linking group.]

In General Formulae (ca-1) to (ca-5), examples of the aryl group as $R^{201}$ to $R^{207}$, $R^{211}$, and $R^{212}$ include an unsubstituted aryl group having 6 to 20 carbon atoms, and a phenyl group or a naphthyl group is preferable.

The alkyl group as $R^{201}$ to $R^{207}$, $R^{211}$ and $R^{212}$ is preferably a chain-like or cyclic alkyl group preferably has 1 to 30 carbon atoms.

The alkenyl group as $R^{201}$ to $R^{207}$, $R^{211}$, and $R^{212}$ preferably has 2 to 10 carbon atoms.

Examples of the substituent which may be included in $R^{201}$ to $R^{207}$ and $R^{210}$ to $R^{212}$ include an alkyl group, a halogen atom, a halogenated alkyl group, a carbonyl group, a cyano group, an amino group, an aryl group, and groups each represented by General Formulae (ca-r-1) to (ca-r-7) shown above.

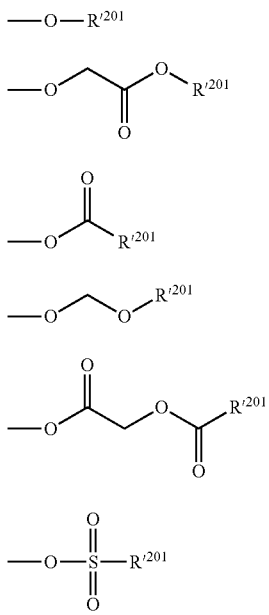

[ca-r-1]

[ca-r-2]

[ca-r-3]

[ca-r-4]

[ca-r-5]

[ca-r-6]

[In the formulae, $R'^{201}$s each independently represent a hydrogen atom, a cyclic group which may have a substituent, a chain-like alkyl group which may have a substituent, or a chain-like alkenyl group which may have a substituent.]

Cyclic Group which May have Substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. The aliphatic hydrocarbon group may be saturated or unsaturated. In general, it is preferable that the aliphatic hydrocarbon group be saturated.

The aromatic hydrocarbon group as $R'^{2111}$ is a hydrocarbon group having an aromatic ring. The aromatic hydrocarbon group preferably has 3 to 30 carbon atoms, more preferably 5 to 30 carbon atoms, still more preferably 5 to 20 carbon atoms, particularly preferably 6 to 15 carbon atoms, and most preferably 6 to 10 carbon atoms. Here, the number of carbon atoms in a substituent is not included in the number of carbon atoms.

Specific examples of the aromatic ring which the aromatic hydrocarbon group has as $R'^{2111}$ include benzene, fluorene, naphthalene, anthracene, phenanthrene, biphenyl, and an aromatic heterocyclic ring obtained by substituting part of carbon atoms constituting any one of these aromatic rings with a hetero atom. Examples of the hetero atom in the aromatic heterocyclic rings include an oxygen atom, a sulfur atom, and a nitrogen atom.

Specific examples of the aromatic hydrocarbon group as $R'^{201}$ include a group (an aryl group such as a phenyl group or a naphthyl group) obtained by removing one hydrogen atom from the above-described aromatic ring and a group (an arylalkyl group such as a benzyl group, a phenethyl group, a 1-naphthylmethyl group, a 2-naphthylmethyl group, 1-naphthylethyl group, or a 2-naphthylethyl group) obtained by substituting one hydrogen atom in the aromatic ring with an alkylene group. The alkylene group (an alkyl chain in the arylalkyl group) preferably has 1 to 4 carbon atoms, more preferably 1 or 2 carbon atoms, and particularly preferably 1 carbon atom.

Examples of the cyclic aliphatic hydrocarbon group as $R'^{201}$ include aliphatic hydrocarbon groups containing a ring in the structure thereof.

Examples of the aliphatic hydrocarbon group containing a ring in the structure thereof include an alicyclic hydrocarbon group (a group obtained by removing one hydrogen atom from an aliphatic hydrocarbon ring), a group obtained by bonding the alicyclic hydrocarbon group to the terminal of a linear or branched aliphatic hydrocarbon group, and a group obtained by interposing the alicyclic hydrocarbon group is in a linear or branched aliphatic hydrocarbon group.

The alicyclic hydrocarbon group preferably has 3 to 20 carbon atoms and more preferably 3 to 12 carbon atoms.

The alicyclic hydrocarbon group may be a polycyclic group or a monocyclic group. The monocyclic alicyclic hydrocarbon group is preferably a group obtained by removing one or more hydrogen atoms from a monocycloalkane. The monocycloalkane preferably has 3 to 6 carbon atoms, and specific examples thereof include cyclopentane and cyclohexane. The polycyclic alicyclic hydrocarbon group is preferably a group obtained by removing one or more hydrogen atoms from a polycycloalkane, and the polycycloalkane preferably has 7 to 30 carbon atoms. Among polycycloalkanes, a polycycloalkane having a cross-linked ring-based polycyclic skeleton, such as adamantane, norbornane, isobornane, tricyclodecane, or tetracyclododecane, and a polycycloalkane having a condensed ring-based polycyclic skeleton, such as a cyclic group having a steroid skeleton are preferable.

Among them, the cyclic aliphatic hydrocarbon group as $R'^{201}$ is preferably a group obtained by removing one or more hydrogen atoms from a monocycloalkane or a polycycloalkane, more preferably a group obtained by removing one hydrogen atom from a polycycloalkane, particularly preferably an adamantyl group or a norbornyl group, and most preferably an adamantyl group.

The linear or branched aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and particularly preferably 1 to 3 carbon atoms.

The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group is preferably a branched alkylene group, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. The alkyl group in the alkylalkylene group is preferably a linear alkyl group having 1 to 5 carbon atoms.

The cyclic hydrocarbon group as $R'^{2111}$ may contain a hetero atom such as a heterocyclic ring. Specific examples thereof include lactone-containing cyclic groups each represented by General Formulae (a2-r-1) to (a2-r-7), —$SO_2$-containing cyclic groups each represented by General Formulae (a5-r-1) to (a5-r-4), and other heterocyclic groups each represented by Chemical Formulae (r-hr-1) to (r-hr-16).

Examples of the substituent of the cyclic group as $R'^{2111}$ include an alkyl group, an alkoxy group, a halogen atom, a halogenated alkyl group, a hydroxyl group, a carbonyl group, and a nitro group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

The halogen atom as the substituent is preferably a fluorine atom.

Examples of the above-described halogenated alkyl group as the substituent include a group obtained by substituting part or all of hydrogen atoms in an alkyl group having 1 to 5 carbon atoms such as a methyl group, an ethyl group, a propyl group, an n-butyl group, or a tert-butyl group, with the above-described halogen atom.

The carbonyl group as the substituent is a group that substitutes a methylene group (—$CH_2$—) constituting the cyclic hydrocarbon group.

Chain-Like Alkyl Group which May have Substituent:
The chain-like alkyl group as $R'^{2111}$ may be linear or branched.

The linear alkyl group preferably has 1 to 20 carbon atoms, more preferably 1 to 15 carbon atoms, and most preferably 1 to 10 carbon atoms.

The branched alkyl group preferably has 3 to 20 carbon atoms, more preferably 3 to 15 carbon atoms, and most preferably 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-Like Alkenyl Group which May have Substituent:
Such a chain-like alkenyl group as $R'^{2111}$ may be linear or branched, preferably has 2 to 10 carbon atoms, more preferably 2 to 5 carbon atoms, still more preferably 2 to 4 carbon atoms, and particularly preferably 3 carbon atoms. Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group.

Among the above, the chain-like alkenyl group is preferably a linear alkenyl group, more preferably a vinyl group or a propenyl group, and particularly preferably a vinyl group.

Examples of the substituent in the chain-like alkyl group or alkenyl group as $R'^{201}$, an alkoxy group, a halogen atom, a halogenated alkyl group, a hydroxyl group, a carbonyl group, a nitro group, an amino group, a cyclic group as $R^{9201}$ or the like may be used.

As the cyclic group which may have a substituent, the chain-like alkyl group which may have a substituent, or the chain-like alkenyl group which may have a substituent, as $R'^{201}$, a group that is the same as the acid-dissociable group represented by above-described General Formula (a1-r-2) can be mentioned as the cyclic group which may have a substituent or the chain-like alkyl group which may have a substituent, in addition to the groups described above.

Among them, $W^{201}$ is preferably a cyclic group which may have a substituent and more preferably a cyclic hydrocarbon group which may have a substituent. More specific examples thereof preferably include a phenyl group; a naphthyl group; a group obtained by removing one or more hydrogen atoms from a polycycloalkane; lactone-containing cyclic groups each represented by any of General Formulae (a2-r-1) to (a2-r-7); and —$SO_2$-containing cyclic groups each represented by any of General Formulae (a5-r-1) to (a5-r-4).

In General Formulae (ca-1) to (ca-5), in a case where $R^{201}$ to $R^{203}$, $R^{206}$ and $R^{207}$, or $R^{211}$ and $R^{212}$ are bonded to each other to form a ring with a sulfur atom in the formula, these groups may be bonded to each other via a hetero atom such as a sulfur atom, an oxygen atom or a nitrogen atom, or a functional group such as a carbonyl group, —SO—, —SO$_2$—, —SO$_3$—, —COO—, —CONH—, or —N(R$_N$)— (here, R$_N$ represents an alkyl group having 1 to 5 carbon atoms). Regarding the ring to be formed, a ring containing a sulfur atom in a formula in the ring skeleton thereof is preferably a 3- to 10-membered ring and particularly preferably a 5- to 7-membered ring containing a sulfur atom. Specific examples of the ring to be formed include a thiophene ring, a thiazole ring, a benzothiophene ring, a benzothiophene ring, a dibenzothiophene ring, a 9H-thioxanthene ring, a thioxanthone ring, a thianthrene ring, a phenoxathiin ring, a tetrahydrothiophenium ring, and a tetrahydrothiopyranium ring.

R$^{208}$ and R$^{209}$ each independently represent a hydrogen atom or an alkyl group having 1 to 5 carbon atoms and are preferably a hydrogen atom or an alkyl group having 1 to 3 carbon atoms. In a case where R$^{208}$ and R$^{209}$ each independently represent an alkyl group, R$^{208}$ and R$^{209}$ may be bonded to each other to form a ring.

R$^{210}$ represents an aryl group which may have a substituent, an alkyl group which may have a substituent, an alkenyl group which may have a substituent, or a —SO$_2$-containing cyclic group which may have a substituent.

Examples of the aryl group as R$^{210}$ include an unsubstituted aryl group having 6 to 20 carbon atoms, and a phenyl group or a naphthyl group is preferable.

The alkyl group as R$^{210}$, a chain-like or cyclic alkyl group having 1 to 30 carbon atoms is preferable.

The alkenyl group as R$^{210}$ preferably has 2 to 10 carbon atoms.

The —SO$_2$-containing cyclic group which may have a substituent, as R$^{210}$, is preferably a "—SO$_2$-containing polycyclic group", and more preferably a group represented by General Formula (a5-r-1).

Y$^{201}$s each independently represent an arylene group, an alkylene group, or an alkenylene group.

Examples of the arylene group as Y$^{201}$ include groups obtained by removing one hydrogen atom from an aryl group mentioned as the aromatic hydrocarbon group represented by R$^{101}$ in General Formula (b-1) described above.

Examples of the alkylene group and alkenylene group as Y$^{201}$ include groups obtained by removing one hydrogen atom from the chain-like alkyl group or the chain-like alkenyl group as R$^{101}$ in General Formula (b-1) described above.

In General Formula (ca-4), x represents 1 or 2.

W$^{201}$ represents an (x+1)-valent linking group, that is, a divalent or trivalent linking group.

The divalent linking group as W$^{201}$ is preferably a divalent hydrocarbon group which may have a substituent, and as examples thereof include the same divalent hydrocarbon group, which may have a substituent, as Ya$^{21}$ in General Formula (a2-1). The divalent linking group as W$^{201}$ may be linear, branched, or cyclic and is preferably cyclic. Among these, a group obtained by combining two carbonyl groups at both terminals is preferable. Examples of the arylene group include a phenylene group and a naphthylene group, and a phenylene group is particularly preferable.

Examples of the trivalent linking group as W$^{201}$ include a group obtained by removing one hydrogen atom from the above-described divalent linking group as W$^{201}$ and a group obtained by bonding the divalent linking group to another divalent linking group. The trivalent linking group as W$^{201}$ is preferably a group obtained by bonding two carbonyl groups to an arylene group.

Specific examples of the suitable cation represented by General Formula (ca-1) include cations each represented by Chemical Formulae (ca-1-1) to (ca-1-70) shown below.

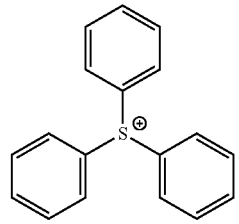

(ca-1-1)

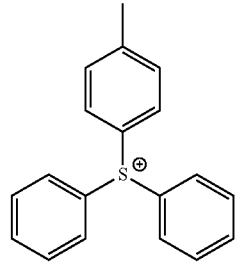

(ca-1-2)

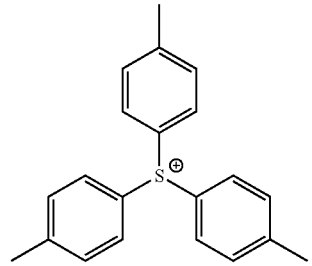

(ca-1-3)

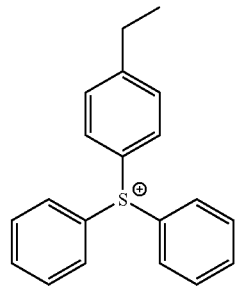

(ca-1-4)

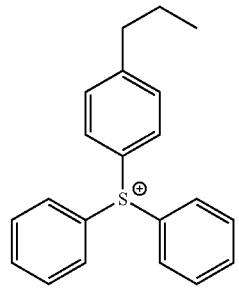

(ca-1-5)

(ca-1-6)
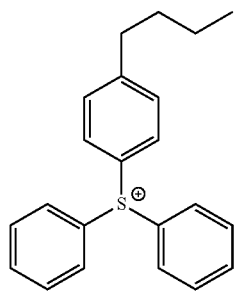
(ca-1-7)
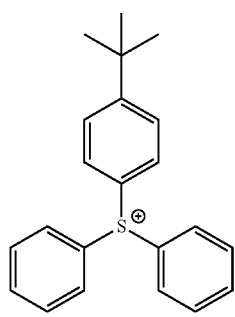
(ca-1-8)
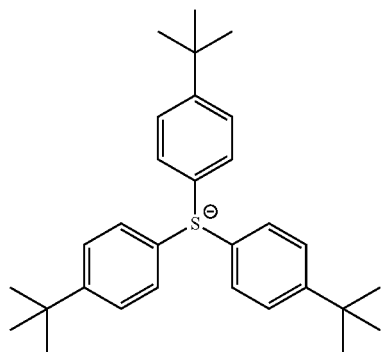
(ca-1-9)
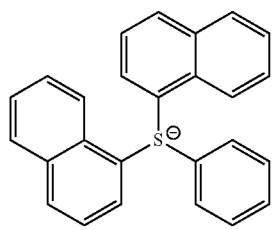
(ca-1-10)
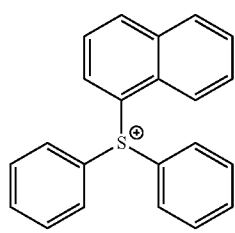
(ca-1-11)
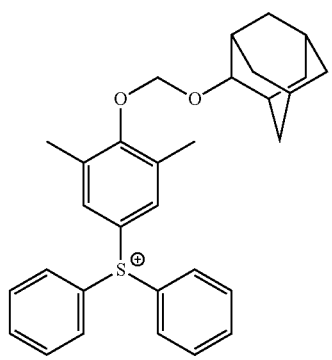
(ca-1-12)
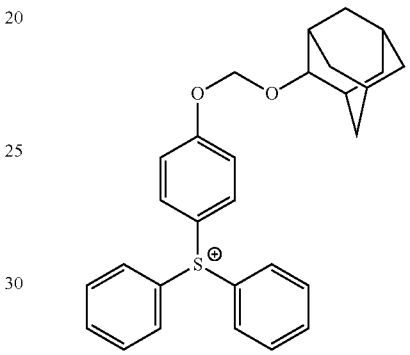
(ca-1-13)
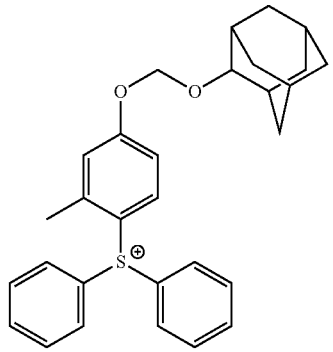
(ca-1-14)
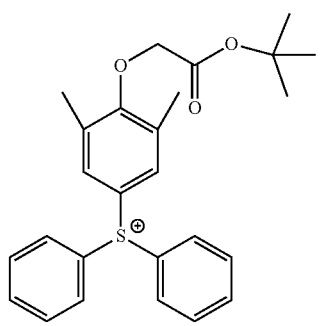

(ca-1-15)
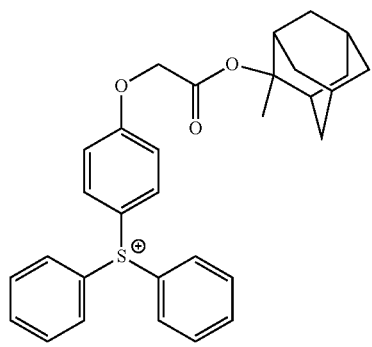
(ca-1-16)
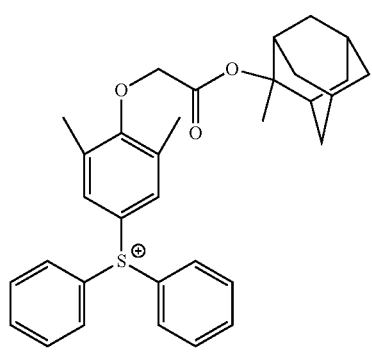
(ca-1-17)
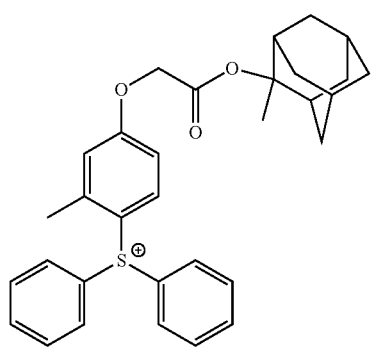
(ca-1-18)
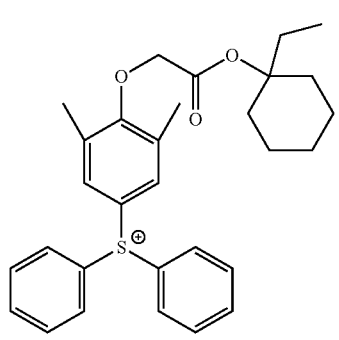
(ca-1-19)
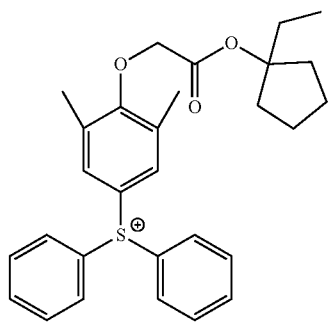
(ca-1-20)
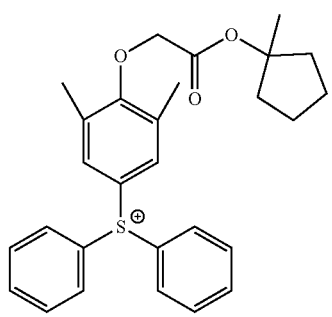
(ca-1-21)
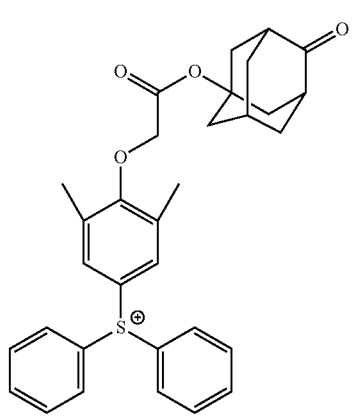
(ca-1-22)
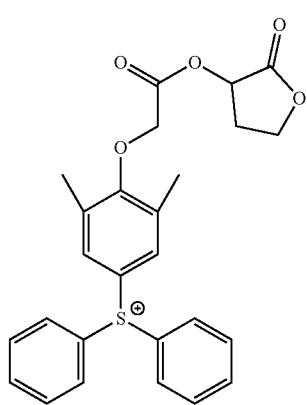

(ca-1-23)
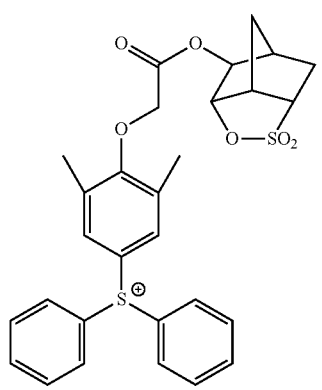
(ca-1-24)
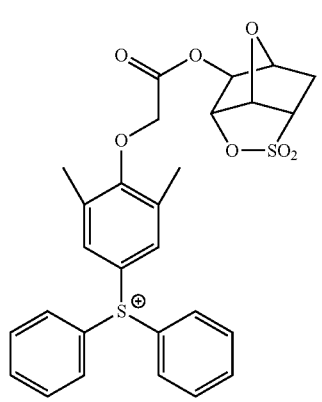
(ca-1-25)
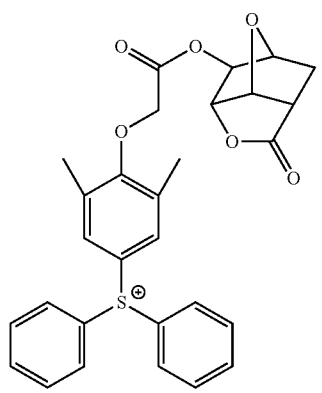
(ca-1-26)
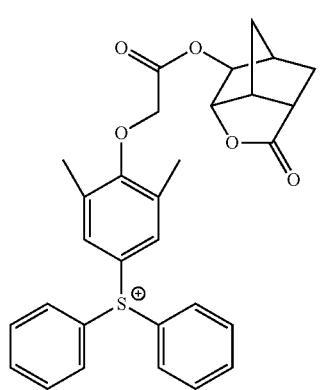
(ca-1-27)
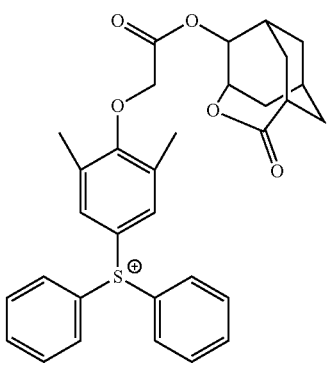
(ca-1-28)
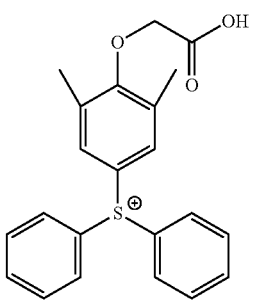
(ca-1-29)
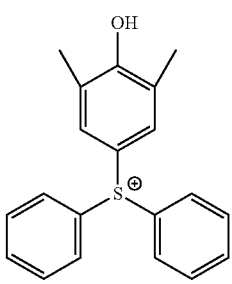
(ca-1-30)
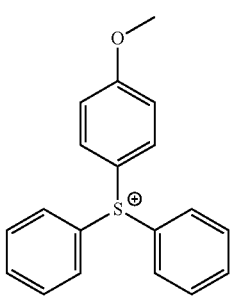
(ca-1-31)
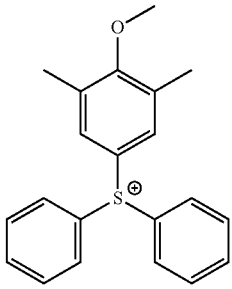

(ca-1-32) 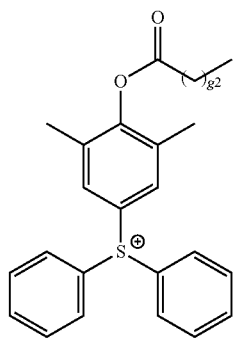
(ca-1-33) 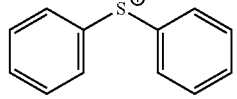
(ca-1-34)
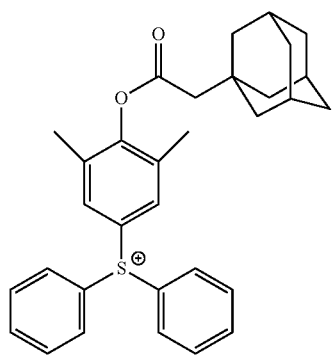
(ca-1-36)
(ca-1-37) 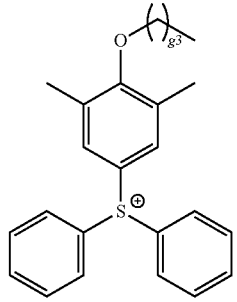
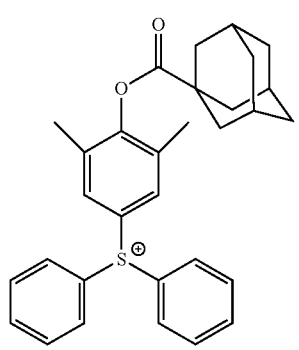
(ca-1-38)
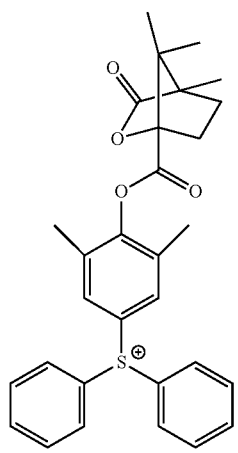
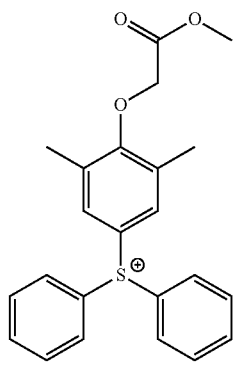
(ca-1-35)
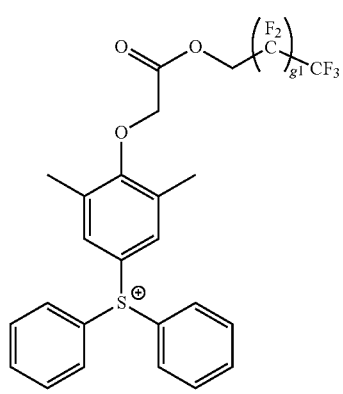
(ca-1-39)
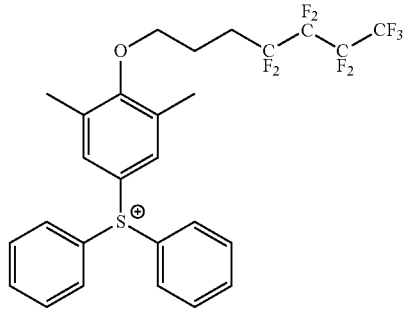

(ca-1-40)
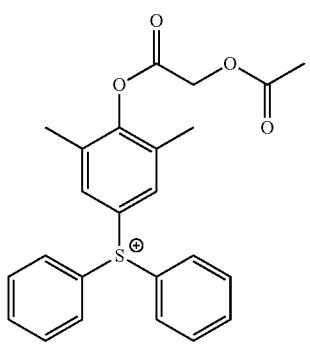
(ca-1-41)
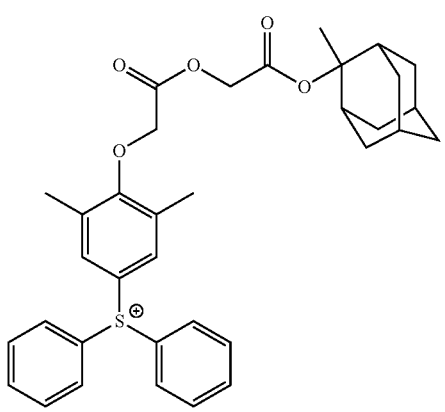
(ca-1-42)
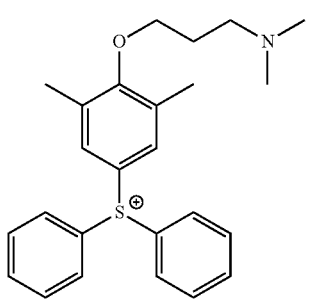
(ca-1-43)
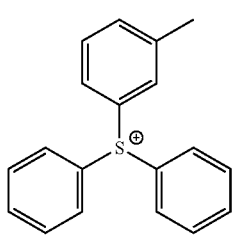
(ca-1-44)
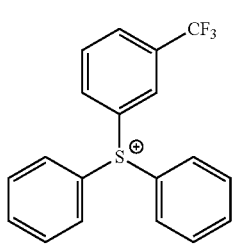
(ca-1-45)
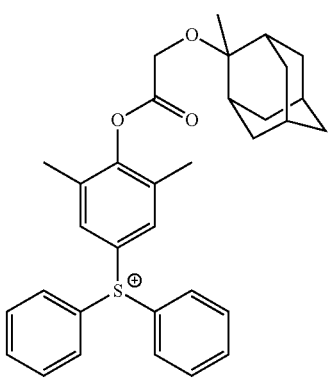
(ca-1-46)
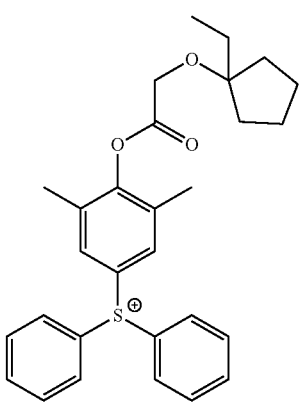
(ca-1-47)
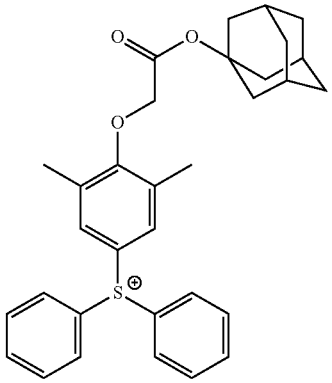
[In the formula, g1, g2, and g3 represent the numbers of repetitions, g1 is an integer in a range of 1 to 5, g2 is an integer in a range of 0 to 20, and g3 is an integer in a range of 0 to 20.]
(ca-1-48)
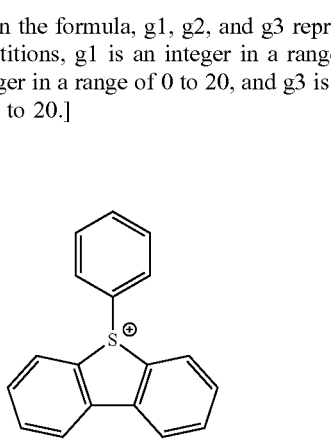

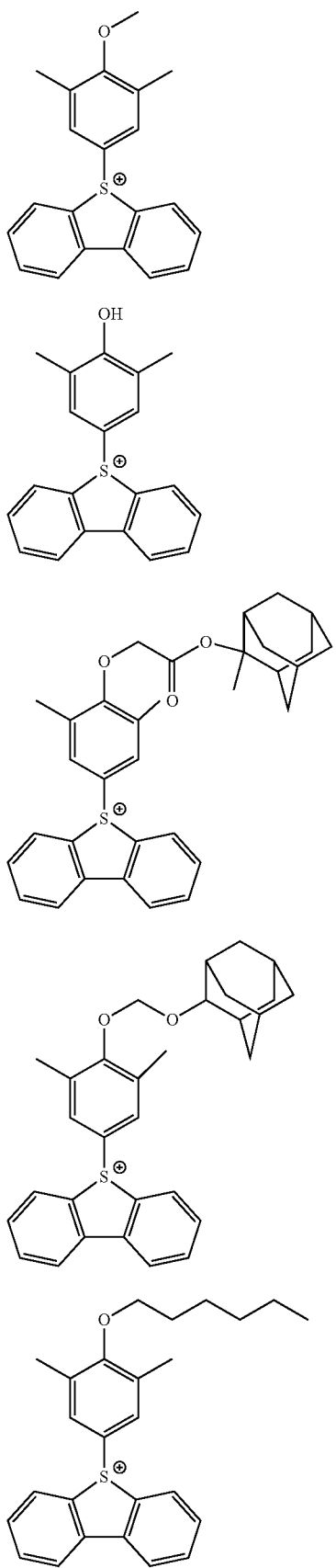
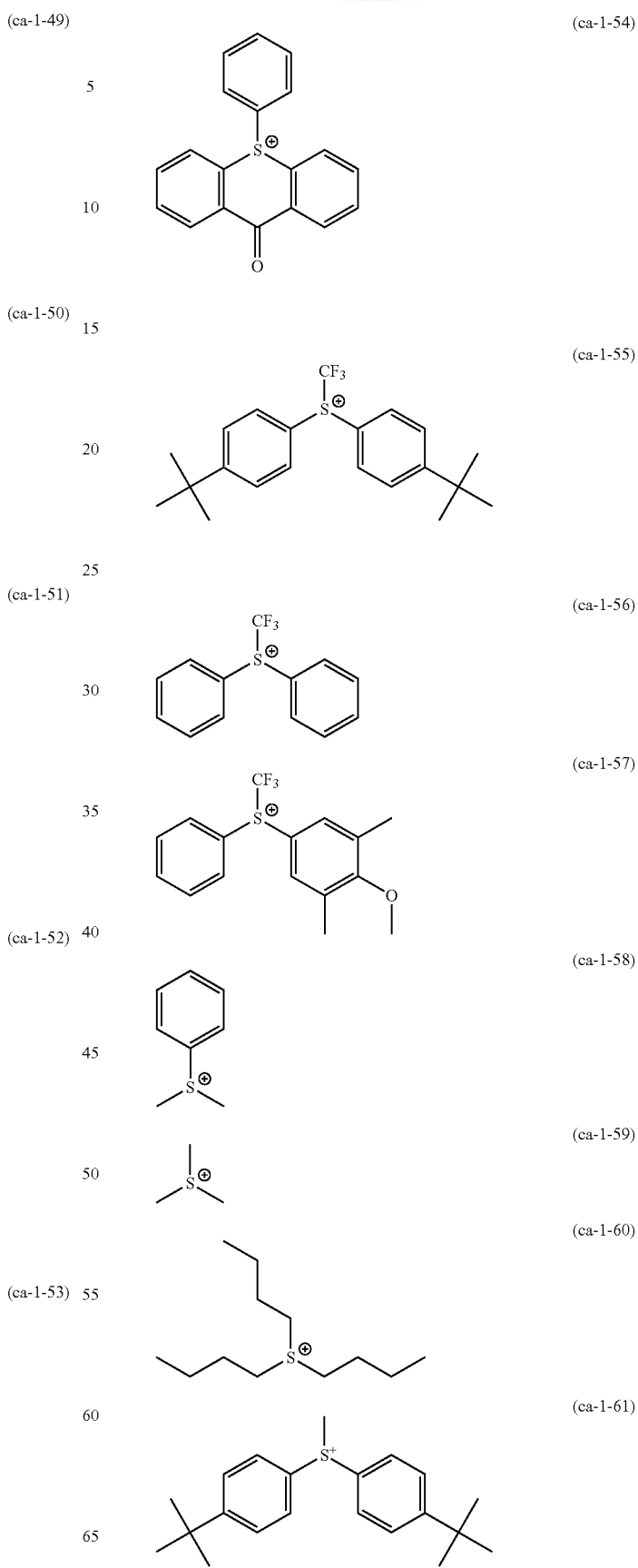

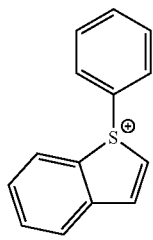 (ca-1-62)
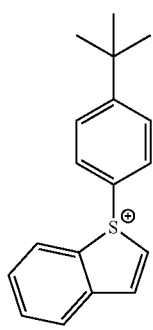 (ca-1-63)
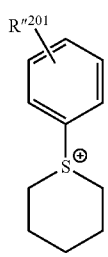 (ca-1-64)
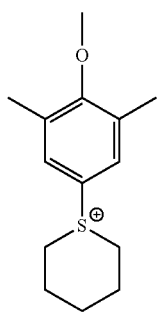 (ca-1-65)
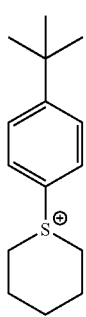 (ca-1-66)
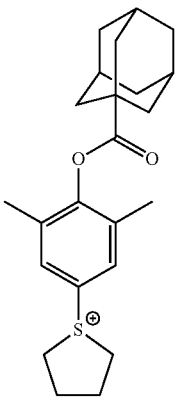 (ca-1-67)
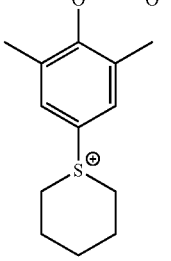 (ca-1-68)
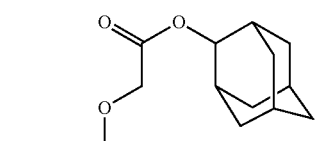 (ca-1-69)
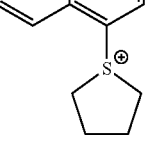 (ca-1-70)
[In the formula, $R''^{201}$ represents a hydrogen atom or a substituent, and examples of the substituent include the same substituent as that exemplified as the substituent which $R^{201}$ to $R^{207}$ and $R^{210}$ to $R^{212}$ may have.]

Specific examples of the suitable cation represented by General Formula (ca-2) include a diphenyliodonium cation and a bis(4-tert-butylphenyl)iodonium cation.

Specific examples of the suitable cation represented by General Formula (ca-3) include cations each represented by General Formulae (ca-3-1) to (ca-3-6).

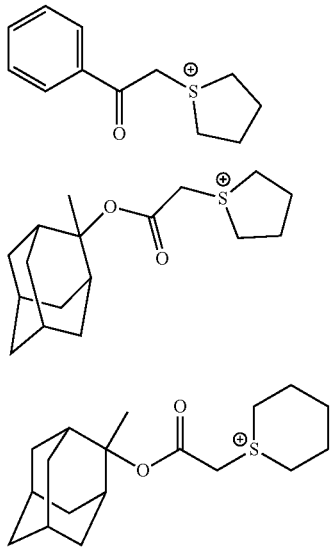

(ca-3-1)

(ca-3-2)

(ca-3-3)

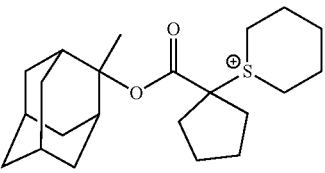

(ca-3-4)

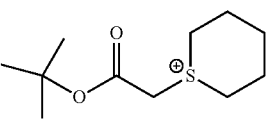

(ca-3-5)

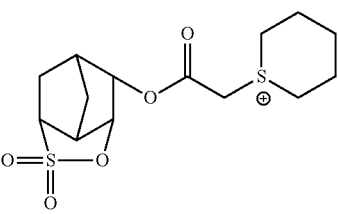

(ca-3-6)

Specific examples of the suitable cation represented by General Formula (ca-4) include cations each represented by General Formulae (ca-4-1) and (ca-4-2).

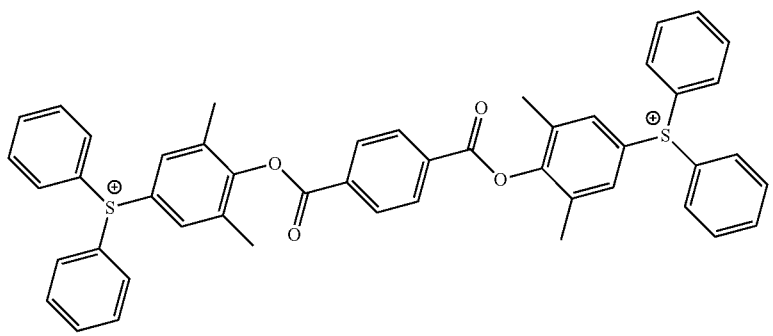

(ca-4-1)

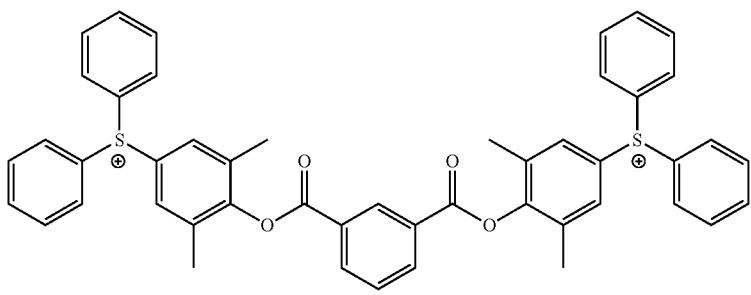

(ca-4-2)

Specific examples of the suitable cation represented by General Formula (ca-5) include cations each represented by General Formulae (ca-5-1) to (ca-5-3).
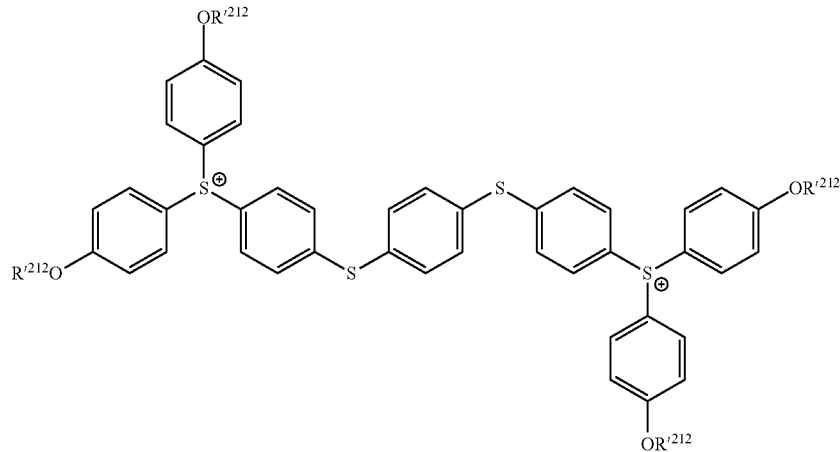
(ca-5-1)
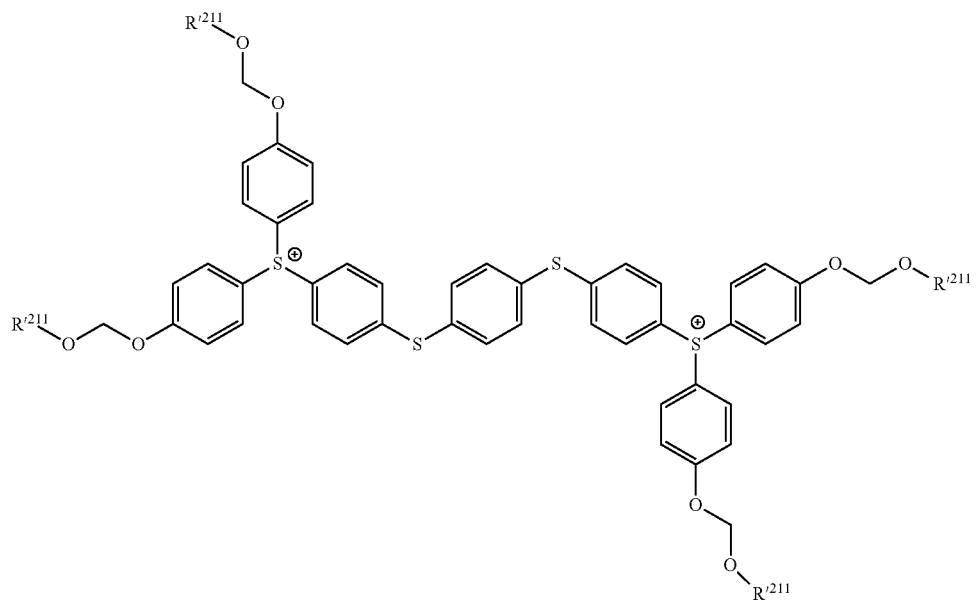
(ca-5-2)
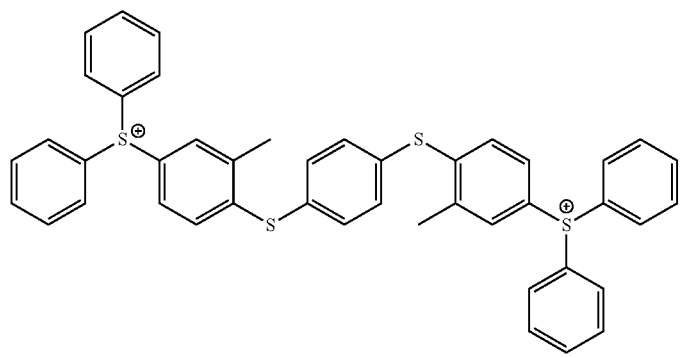
(ca-5-3)

Among the above cations, the cation moiety (($M^{m+}$)$_{1/m}$) is preferably a cation represented by General Formula (ca-1).

Specific examples of the suitable component (B1) include the followings.

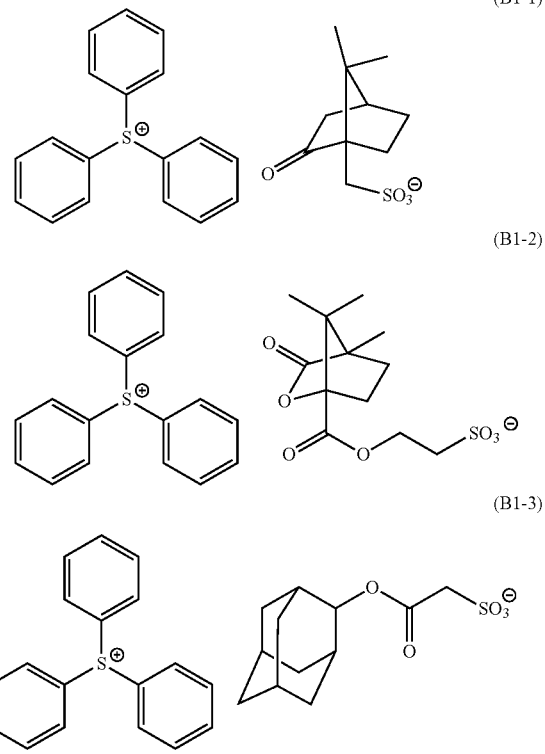

(B1-1)

(B1-2)

(B1-3)

In the resist composition according to the present embodiment, the component (B1) may be used alone or in a combination of two or more kinds thereof.

The content of the component (B1) in the resist composition according to the present embodiment is preferably in a range of 1 to 40 parts by mass, more preferably 5 to 30 parts by mass, and still more preferably 5 to 25 parts by mass, with respect to 100 parts by mass of the component (A).

In a case where the content of the component (B1) is equal to or greater than the lower limit value of the preferred range described above, a resist pattern having a better roughness reduction property and a better pattern shape can be formed.

On the other hand, in a case where the content thereof is equal to or lower than the upper limit value of the preferred range, a uniform solution is easily obtained when each of the components of the resist composition is dissolved in an organic solvent, and the storage stability as a resist composition is further improved.

In Regard to Component (B2)

In the resist composition according to the present embodiment, the component (B) may contain an acid generator component (hereinafter, also referred to as a "component (B2)") other than the component (B1) as long as the effects of the present invention are not impaired.

The component (B2) is not particularly limited, and those which have been proposed as an acid generator for a chemical amplification-type resist composition in the related art can be used.

Examples of such an acid generator are numerous and include onium salt-based acid generators such as an iodonium salt having a fluorine atom in anion moiety and a sulfonium salt; an oxime sulfonate-based acid generator; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

In the resist composition according to the present embodiment, the component (B2) may be used alone or in a combination of two or more kinds thereof.

The proportion of the component (B2) in the total component (B) contained in the resist composition is, for example, 60% by mass or less, preferably 40% by mass or less, and more preferably 10% by mass or less.

In a case where the content of the component (B2) is equal to or lower than the preferred upper limit value described above, a resist pattern having a better pattern shape can be formed.

The proportion of the component (B1) in the component (B) in the resist composition according to the present embodiment is preferably 45% by mass or more, more preferably 50% by mass or more, and still more preferably 90% by mass or more with respect to the total mass of the component (B), and it is particularly preferable for the component (B) to be composed of only the component (B1).

In a case where the proportion of the component (B1) in the component (B) is equal to or greater than the lower limit value of the preferred range described above, a resist pattern having a better roughness reduction property and a better pattern shape can be formed. Further, in a case where the component (B) is composed of only the component (B1), for example, the rectangularity can be further improved, and thus it is possible to form a resist pattern having a better pattern shape.

<Base Component (D)>

The resist composition according to the present embodiment may further contain, in addition to the components (A) and (B), a base component (component (D)) that traps (that is, controls the acid diffusion) an acid generated from the component (B) upon exposure. Further, as the component (D), a photo-degradable base (D1) is contained. The component (D1) contains a compound (hereinafter, also referred to as a "component (d1-1)") represented by General Formula (d1-1) or a compound (hereinafter, also referred to as a "component (d1-2)") represented by General Formula (d1-2).

(d1-1)

(d1-2)

[In General Formula (d1-1), $Rd^1$ represents a cyclic group which may have a substituent, a chain-like alkyl group which may have a substituent, or a chain-like alkenyl group which may have a substituent. m represents an integer of 1 or greater, and $M'^{o1+}$ represents an m-valent organic cation.

In General Formula (d1-2), $Rd^3$ and $Rd^4$ represent a cyclic group which may have a substituent, a chain-like alkyl group which may have a substituent, or chain-like alkenyl group which may have a substituent. $Yd^1$ represents a single bond or a divalent linking group. m represents an integer of 1 or greater, and $M'^{m+}$ represents an m-valent organic cation.]

{Component (d1-1)}
Anion Moiety

In General Formula (d1-1), $Rd^1$ represents a cyclic group which may have a substituent, a chain-like alkyl group which may have a substituent, or a chain-like alkenyl group which may have a substituent, and respective examples thereof include the same group as $R'^{201}$.

Among these, $Rd^1$ is preferably an aromatic hydrocarbon group which may have a substituent, an aliphatic cyclic group which may have a substituent, or a chain-like alkyl group which may have a substituent. Examples of the substituent which these groups may have include a hydroxyl group, an oxo group, an alkyl group, an aryl group, a fluorine atom, a fluorinated alkyl group, lactone-containing cyclic groups each represented by any of General Formulae (a2-r-1) to (a2-r-7), an ether bond, an ester bond, and a combination thereof. In a case where an ether bond or an ester bond is included as the substituent, the substituent may be bonded via an alkylene group, and linking groups each represented by any of General Formulae (y-a1-1) to (y-a1-5) are preferable as the substituent.

The aromatic hydrocarbon group is preferably a phenyl group, a naphthyl group, or a polycyclic structure (a polycyclic structure composed of a bicyclooctane skeleton and a ring structure other than the bicyclooctane skeleton) containing a bicyclooctane skeleton and more preferably a phenyl group.

The aliphatic cyclic group is preferably a group obtained by removing one or more hydrogen atoms from a polycycloalkane such as adamantane, norbornane, isobornane, tricyclodecane, or tetracyclododecane.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl group, or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group.

In a case where the chain-like alkyl group is a fluorinated alkyl group having a fluorine atom or a fluorinated alkyl group as a substituent, the fluorinated alkyl group preferably has 1 to 11 carbon atoms, more preferably 1 to 8 carbon atoms, and still more preferably 1 to 4 carbon atoms. The fluorinated alkyl group may contain an atom other than a fluorine atom. Examples of the atom other than a fluorine atom include an oxygen atom, a sulfur atom, and a nitrogen atom.

Among the above, in General Formula (d1-1), $Rd^1$ is preferably an aromatic hydrocarbon group which may have a substituent and more preferably an aromatic hydrocarbon group which has a hydroxyl group.

Preferred specific examples of the anion moiety of the component (d1-1) are shown below.

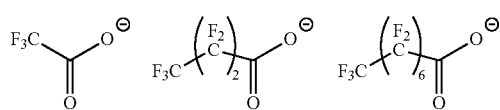

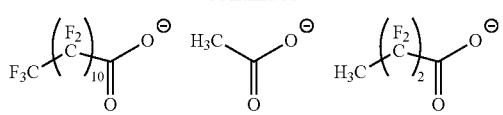

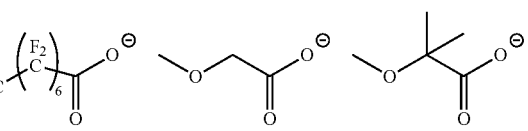

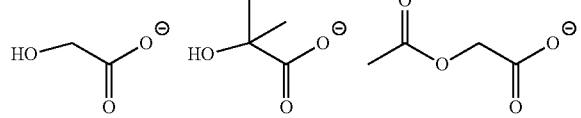

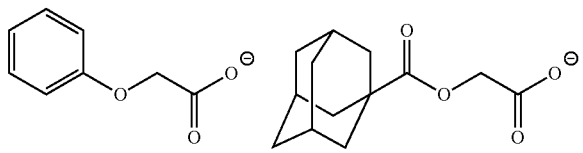

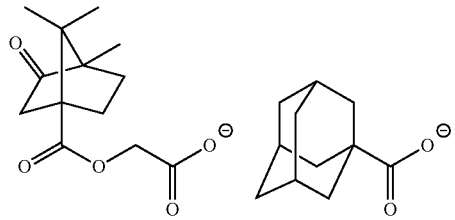

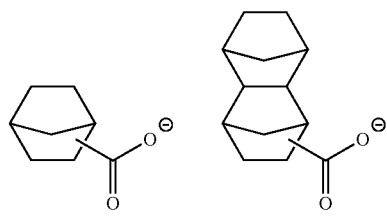

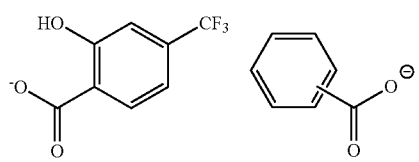

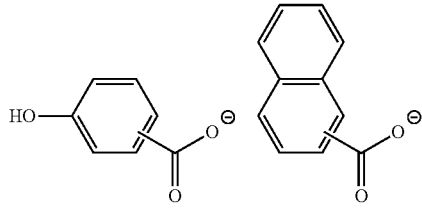

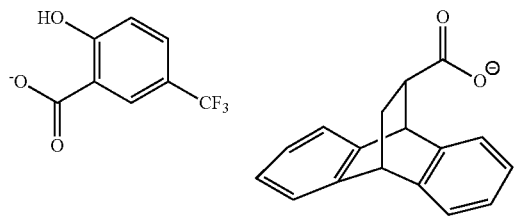

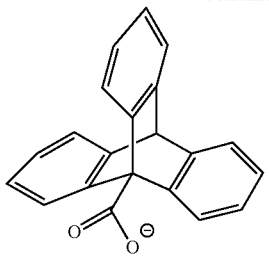 [SMILES: O=C([O-])C12c3ccccc3C(c3ccccc31)c1ccccc12]

Cation Moiety

In General Formula (d1-1), $M^{m+}$ represents an m-valent organic cation. The suitable examples of the organic cation as $M^{m+}$ include the same cations as the cations each represented by General Formulae (ca-1) to (ca-5), the cations each represented by General Formula (ca-1) are preferable, and cations each represented by General Formulae (ca-1-1) to (ca-1-70) are more preferable.

The component (d1-1) may be used alone or in a combination of two or more kinds thereof.

{Component (d1-2)}

Anion Moiety

In General Formula (d1-2), $Rd^3$ represents a cyclic group which may have a substituent, a chain-like alkyl group which may have a substituent, or a chain-like alkenyl group which may have a substituent, examples thereof include the same group as $R'^{201}$, and a cyclic group containing a fluorine atom, a chain-like alkyl group, or a chain-like alkenyl group is preferable. Among them, a fluorinated alkyl group is preferable, and the same fluorinated alkyl group as that described above as $Rd^1$ is more preferable.

In General Formula (d1-3), $Rd^4$ represents a cyclic group which may have a substituent, a chain-like alkyl group which may have a substituent, or a chain-like alkenyl group which may have a substituent, and examples thereof include the same group as $R'^{201}$.

Among them, an alkyl group which may have a substituent, an alkoxy group which may have a substituent, an alkenyl group which may have a substituent, or a cyclic group which may have a substituent is preferable.

The alkyl group as $Rd^4$ is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. Part of hydrogen atoms in the alkyl group as $Rd^4$ may be substituted with a hydroxyl group, a cyano group, or the like.

The alkoxy group as $Rd^4$ is preferably an alkoxy group having 1 to 5 carbon atoms, and specific examples of the alkoxy group having 1 to 5 carbon atoms include a methoxy group, an ethoxy group, an n-propoxy group, an iso-propoxy group, an n-butoxy group, and a tert-butoxy group. Among these, a methoxy group and an ethoxy group are preferable.

Examples of the alkenyl group as $Rd^4$ include the same group as $R'^{201}$, and a vinyl group, a propenyl group (an allyl group), a 1-methylpropenyl group, or a 2-methylpropenyl group is preferable. These groups may have an alkyl group having 1 to 5 carbon atoms or a halogenated alkyl group having 1 to 5 carbon atoms as a substituent.

As the cyclic group as $Rd^4$, the same group as the cyclic group described above as $R'^{201}$ can be mentioned. Among these, as the cyclic group, an alicyclic group obtained by removing one or more hydrogen atoms from a cycloalkane such as cyclopentane, cyclohexane, adamantane, norbornane, isobornane, tricyclodecane, or tetracyclododecane, or an aromatic group such as a phenyl group or a naphthyl group is preferable. In a case where $Rd^4$ represents an alicyclic group, the resist composition can be satisfactorily dissolved in an organic solvent, thereby improving lithography characteristics. In a case where $Rd^4$ is an aromatic group, the resist composition is excellent in light absorption efficiency and thus has good sensitivity and lithography characteristics in the lithography using EUV or the like as a light source for exposure.

In General Formula (d1-2), $Yd^1$ represents a single bond or a divalent linking group.

The divalent linking group as $Yd^1$ is not particularly limited, and examples thereof include a divalent hydrocarbon group (an aliphatic hydrocarbon group or an aromatic hydrocarbon group) which may have a substituent and a divalent linking group containing a hetero atom. Respective examples of these divalent linking groups include the same divalent linking groups as the divalent hydrocarbon group which may have a substituent and the divalent linking group containing a hetero atom, which are mentioned in the explanation of the divalent linking group as $Ya^{21}$ in General Formula (a2-1).

$Yd^1$ is preferably a carbonyl group, an ester bond, an amide bond, an alkylene group, or a combination of these. The alkylene group is more preferably a linear or branched alkylene group and still more preferably a methylene group or an ethylene group.

Preferred specific examples of the anion moiety of the component (d1-2) are shown below.

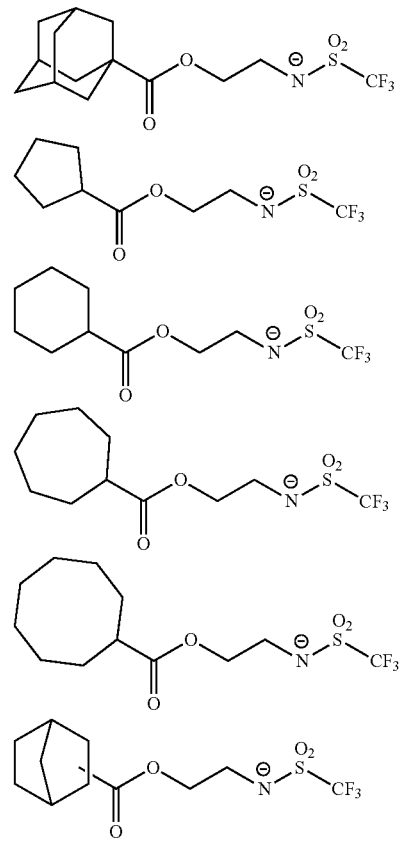

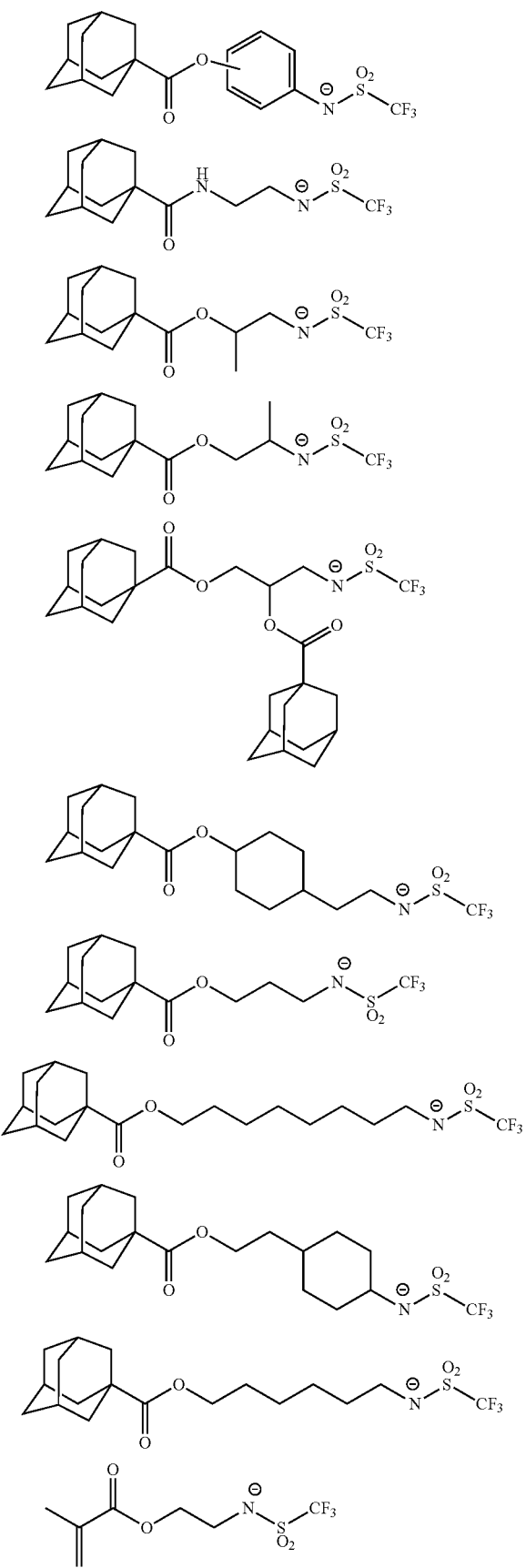
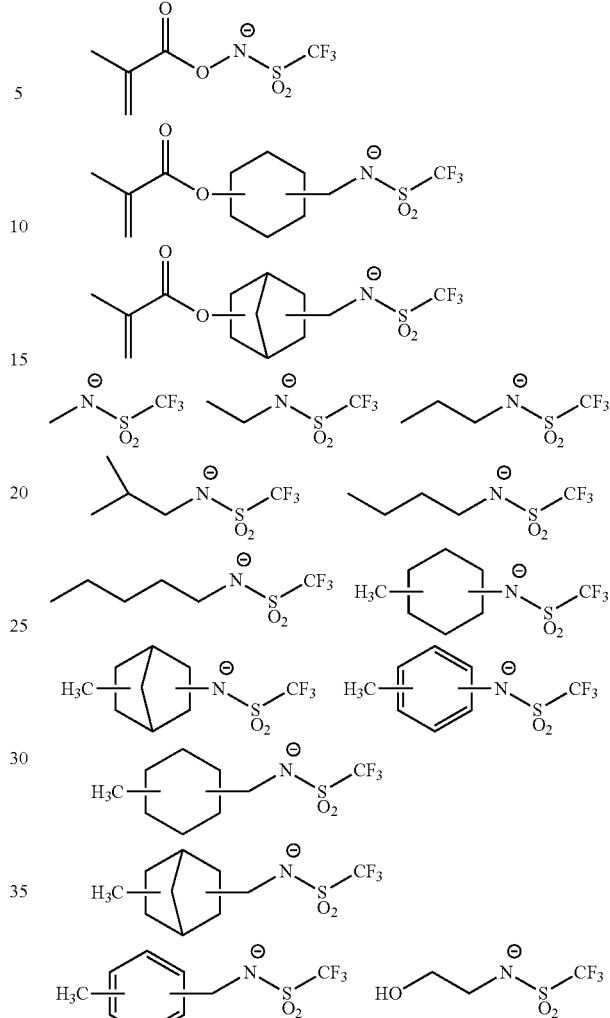

Cation Moiety

In General Formula (d1-2), $M'^{01+}$ represents an m-valent organic cation and has the same definition as that for $M'^{m+}$ in General Formula (d1-1).

The component (d1-2) may be used alone or in a combination of two or more kinds thereof.

As the component (D1), only one of the components (d1-1) or (d1-2) may be used, or a combination of two or more kinds thereof may be used. From the viewpoint of improving lithography characteristics, the component (D1) preferably contains the component (d1-1).

The content of the component (D1) in the present embodiment is preferably in a range of 0.5 to 20 parts by mass, more preferably in a range of 1 to 10 parts by mass, and still more preferably in a range of 2 to 6 parts by mass, with respect to 100 parts by mass of the component (A).

In a case where the content of the component (D1) is equal to or greater than the preferred lower limit value, particularly excellent lithography characteristics and an excellent resist pattern shape are easily obtained. On the other hand, in a case where the content of the component (D1) is equal to or lower than the upper limit value, the sensitivity can be maintained satisfactorily.

In the resist composition according to the present embodiment, the ratio of the content of the above-described component (B) to the content of the component (D1) (the content of the component (B)/the content of the component (D1)) is preferably in a range of 1.5 to 8, more preferably in a range of 2 to 6, and still more preferably in a range of 3 to 5.

In a case where the ratio of the content of the above-described component (B) to the content of the component (D1) (the content of the component (B)/the content of the component (D1)) is within the preferred range described above, the acid diffusion can be suitably suppressed, and thus the sensitivity, the roughness reduction property, and the pattern shape can be further improved.

Method of Producing Component (D1):

The method of producing the components (d1-1) is not particularly limited, and the component (d1-1) can be produced by a conventionally known method.

Further, the method of producing the component (d1-2) is not particularly limited, and the component (d1-2) can be produced in the same manner as disclosed in United States Patent Application, Publication No. 2012-0149916.

In Regard to Component (D2)

The component (D) may contain a nitrogen-containing organic compound component (hereinafter, referred to as a "component (D2)") which does not correspond to the above-mentioned component (D1).

The component (D2) is not particularly limited as long as it acts as an acid diffusion controlling agent and does not correspond to the component (D1), and any known compound may be used. Among the above, aliphatic amines are preferable, and among the aliphatic amines, a secondary aliphatic amine or a tertiary aliphatic amine is more preferable.

An aliphatic amine is an amine having one or more aliphatic groups, and the aliphatic groups preferably have 1 to 12 carbon atoms.

Examples of these aliphatic amines include an amine obtained by substituting at least one hydrogen atom of ammonia ($NH_3$) with an alkyl group or hydroxyalkyl group having 12 or fewer carbon atoms (alkyl amines or alkyl alcohol amines) and a cyclic amine.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkyl amines of 5 to 10 carbon atoms are preferable, and tri-n-pentyl amine and tri-n-octyl amine are particularly preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris {2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris [2-{2-(2-hydroxyethoxy)ethoxy}ethyl] amine and triethanolamine triacetate, and triethanolamine triacetate is preferable.

In addition, as the component (D2), an aromatic amine may be used.

Examples of aromatic amines include 4-dimethylaminopyridine, pyrrole, indole, pyrazole, imidazole, and derivatives thereof, tribenzylamine, 2,6-diisopropylaniline, and N-tert-butoxycarbonylpyrrolidine.

The component (D2) may be used alone or in a combination of two or more kinds thereof.

In a case where the resist composition contains the component (D2), the content of the component (D2) in the resist composition is typically in a range of 0.01 to 5 parts by mass with respect to 100 parts by mass of the component (A). By setting the content within the above range, the resist pattern shape, the post-exposure temporal stability, and the like are improved.

<Other Components>

The resist composition according to the present embodiment may further contain other components in addition to the component (A), the component (B), and the component (D) described above. Examples of the other components include a component (E), a component (F), and a component (S), described below.

<<At Least One Compound (E) Selected from the Group Consisting of Organic Carboxylic Acid, Phosphorus Oxo Acid, and Derivatives Thereof>>

For the purpose of preventing any deterioration in sensitivity, and improving the resist pattern shape and the post-exposure temporal stability, the resist composition according to the present embodiment may contain at least one compound (E) (hereinafter referred to as a component (E)) selected from the group consisting of an organic carboxylic acid, and a phosphorus oxo acid and a derivative thereof, as an optional component.

Examples of suitable organic carboxylic acids include acetic acid, malonic acid, citric acid, malic acid, succinic acid, benzoic acid, and salicylic acid.

Examples of phosphorus oxo acid include phosphoric acid, phosphonic acid, and phosphinic acid. Among these, phosphonic acid is particularly preferable.

Examples of phosphorus oxo acid derivative include an ester obtained by substituting a hydrogen atom in the above-described oxo acid with a hydrocarbon group. Examples of the hydrocarbon group include an alkyl group having 1 to 5 carbon atoms and an aryl group having 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate, and dibenzyl phosphonate.

Examples of phosphinic acid derivatives include phosphinic acid esters and phenylphosphinic acid.

In the resist composition according to the present embodiment, the component (E) may be used alone or in a combination of two or more kinds thereof.

In a case where the resist composition contains the component (E), the content of the component (E) is typically in a range of 0.01 to 5 parts by mass with respect to 100 parts by mass of the component (A).

<<Fluorine Additive Component (F)>>

The resist composition according to the present embodiment may further include a fluorine additive component (hereinafter, referred to as a "component (F)") in order to impart water repellency to the resist film or to improve lithography characteristics.

As the component (F), a fluorine-containing polymer compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be mentioned.

Specific examples of the component (F) include polymers having a constitutional unit (f1) represented by General Formula (f1-1) shown below. This polymer is preferably a polymer (homopolymer) consisting of a constitutional unit (f1) represented by General Formula (f1-1) shown below; a copolymer of the constitutional unit (f1) and the constitutional unit (a1); and a copolymer of the constitutional unit (f1), a constitutional unit derived from acrylic acid or methacrylic acid, and the above-described constitutional unit (a1). The constitutional unit (a1) to be copolymerized with the constitutional unit (f1) is preferably a constitutional unit derived from 1-ethyl-1-cyclooctyl (meth)acrylate or a constitutional unit derived from 1-methyl-1-adamantyl (meth)acrylate.

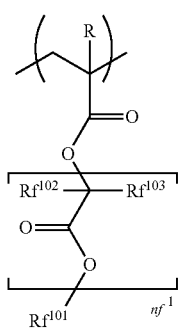

(f1-1)

[In the formula, R has the same definition as described above. $Rf^{102}$ and $Rf^{103}$ each independently represent a hydrogen atom, a halogen atom, an alkyl group having 1 to 5 carbon atoms, or a halogenated alkyl group having 1 to 5 carbon atoms, and $Rf^{102}$ and $Rf^{103}$ may be the same or different from each other. $nf^1$ represents an integer in a range of 0 to 5 and $Rf^{101}$ represents an organic group containing a fluorine atom.]

In General Formula (f1-1), R bonded to the carbon atom at the α-position has the same definition as described above. R is preferably a hydrogen atom or a methyl group.

In General Formula (f1-1), the halogen atom as $Rf^{102}$ and $Rf^{103}$ is preferably a fluorine atom. Examples of the alkyl group having 1 to 5 carbon atoms as $Rf^{102}$ and $Rf^{103}$ include the same group as the alkyl group having 1 to 5 carbon atoms as R, and a methyl group or an ethyl group is preferable. Specific examples of the halogenated alkyl group having 1 to 5 carbon atoms as $Rf^{102}$ and $Rf^{103}$ include a group obtained by substituting part or all of hydrogen atoms of the above-described alkyl group having 1 to 5 carbon atoms with a halogen atom. The halogen atom is preferably a fluorine atom. Among the above, $Rf^{102}$ and $Rf^{103}$ is preferably a hydrogen atom, a fluorine atom, or an alkyl group having 1 to 5 carbon atoms and more preferably a hydrogen atom, a fluorine atom, a methyl group, or an ethyl group.

In General Formula (f1-1), $nf^1$ represents an integer in a range of 0 to 5, preferably an integer in a range of 0 to 3, and more preferably an integer of 1 or 2.

In General Formula (f1-1), $Rf^{101}$ represents an organic group containing a fluorine atom and is preferably a hydrocarbon group containing a fluorine atom.

The hydrocarbon group containing a fluorine atom may be linear, branched, or cyclic, and preferably has 1 to 20 carbon atoms, more preferably 1 to 15 carbon atoms, and particularly preferably 1 to 10 carbon atoms.

In addition, in the hydrocarbon group containing a fluorine atom, 25% or more of the hydrogen atoms in the hydrocarbon group are preferably fluorinated, more preferably 50% or more are fluorinated, and particularly preferably 60% or more are fluorinated since the hydrophobicity of the resist film at the time of dipping exposure increases.

Among them, $Rf^{101}$ is preferably a fluorinated hydrocarbon group having 1 to 6 carbon atoms, more preferably a trifluoromethyl group, and particularly preferably —$CH_2$—$CF_3$, —$CH_2$—$CF_2$—$CF_3$, or —$CH(CF_3)_2$, —$CH_2$—$CH_2$—$CF_3$, or —$CH_2$—$CH_2$—$CF_2$—$CF_2$—$CF_2$—$CF_3$.

The weight-average molecular weight (Mw) (based on the polystyrene-equivalent value determined by gel permeation chromatography) of the component (F) is preferably in a range of 1,000 to 50,000, more preferably in a range of 5,000 to 40,000, and most preferably in a range of 10,000 to 30,000. In a case where the weight-average molecular weight is equal to or lower than the upper limit value of this range, a resist solvent solubility sufficient to be used as a resist is exhibited. On the other hand, in a case where the weight-average molecular weight is equal to or greater than the lower limit value of this range, the water repellency of the resist film is excellent.

Further, the dispersity (Mw/Mn) of the component (F) is preferably in a range of 1.0 to 5.0, more preferably in a range of 1.0 to 3.0, and most preferably in a range of 1.0 to 2.5.

In the resist composition according to the present embodiment, the component (F) may be used alone or in a combination of two or more kinds thereof.

In a case where the resist composition contains the component (F), the content of the component (F) to be used is typically at a proportion of 0.5 to 10 parts by mass, with respect to 100 parts by mass of the component (A).

<<Organic Solvent Component (S)>>

The resist composition according to the present embodiment may be produced by dissolving the resist materials in an organic solvent component (hereinafter, referred to as a "component (S)").

The component (S) may be any organic solvent which can dissolve the respective components to be used to obtain a uniform solution, and optional organic solvent can be suitably selected from those which are conventionally known as solvents for a chemical amplification-type resist composition and then used.

Examples of the component (S) include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate, polyhydric alcohol derivatives including compounds having an ether bond, such as a monoalkyl ether (such as monomethyl ether, monoethyl ether, monopropyl ether or monobutyl ether) compounds having an ester bond, such as ethylene glycol monoacetate, diethylene glycol monoacetate, propylene glycol monoacetate, and dipropylene glycol monoacetate, polyhydric alcohol derivatives including compounds having an ether bond, such as a monoalkyl ether (such as monomethyl ether, monoethyl ether, monopropyl ether or monobutyl ether) or monophenyl ether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzyl ether, cresylmethyl ether, diphenyl ether, dibenzyl ether, phenetole, butylphenyl ether, ethyl benzene, diethyl benzene, pentyl benzene, isopropyl benzene, toluene, xylene, cymene and mesitylene; and dimethylsulfoxide (DMSO).

In the resist composition according to the present embodiment, the component (S) may be used alone or as a mixed solvent of two or more kinds thereof. Among these, PGMEA, PGME, γ-butyrolactone, EL, and cyclohexanone are preferable.

Further, a mixed solvent obtained by mixing PGMEA with a polar solvent is also preferable as the component (S). The blending ratio (mass ratio) of the mixed solvent can be suitably determined, taking into consideration the compatibility of the PGMEA with the polar solvent, but is preferably in a range of 1:9 to 9:1 and more preferably in a range of 2:8 to 8:2.

More specifically, in a case where EL or cyclohexanone is blended as the polar solvent, the PGMEA:EL or cyclohexanone mass ratio is preferably in a range of 1:9 to 9:1 and more preferably in a range of 2:8 to 8:2. Alternatively, in a case where PGME is blended as the polar solvent, the PGMEA:PGME mass ratio is preferably in a range of 1:9 to 9:1, more preferably in a range of 2:8 to 8:2, and still more preferably in a range of 3:7 to 7:3. Furthermore, a mixed solvent of PGMEA, PGME, and cyclohexanone is also preferable.

Further, the component (S) is also preferably a mixed solvent of at least one selected from PGMEA and EL and γ-butyrolactone. In this case, as the mixing ratio, the mass ratio of the former to the latter is preferably in a range of 70:30 to 95:5.

The amount of the component (S) to be used is not particularly limited and is suitably set, depending on a thickness of a film to be coated, to a concentration at which the component (S) can be applied onto a substrate or the like. Generally, the component (S) is used such that the solid content concentration of the resist composition is in a range of 0.1% to 20% by mass and preferably in a range of 0.2% to 15% by mass.

As desired, other miscible additives can also be added to the resist composition according to the present embodiment. For example, for improving the performance of the resist film, an additive resin, a dissolution inhibitor, a plasticizer, a stabilizer, a colorant, a halation prevention agent, and a dye can be suitably contained therein.

After dissolving the resist material in the component (S), the resist composition according to the present embodiment may be subjected to removal of impurities and the like by using a porous polyimide film, a porous polyamideimide film, or the like. For example, the resist composition may be filtered using a filter made of a porous polyimide film, a filter made of a porous polyamideimide film, or a filter made of a porous polyimide film and a porous polyamideimide film. Examples of the porous polyimide film and the porous polyamideimide film include those described in Japanese Unexamined Patent Application, First Publication No. 2016-155121.

The resist composition according to the present embodiment described above contains the resin component (A1) having the constitutional unit (a01) and the constitutional unit (a02), the compound (B1), and the photo-degradable base (D1).

The constitutional unit (a01) in the resin component (A1) has an acid-dissociable group represented by "—$C'(R^{11})(R^{12})(R^{13})$" in General Formula (a0-1). In the acid-dissociable group, a carbon atom at the α-position of the tertiary carbon atom $C'$ constitutes a carbon-carbon unsaturated bond. For this reason, the acid-dissociable group in the constitutional unit (a01) is easily deprotected by an acid. Further, the constitutional unit (a02) has a phenolic hydroxyl group (an aromatic ring having a hydroxy group) that acts as a proton source. As a result, the sensitivity can be improved by increasing the amount of acid generated.

In addition, the component (B1) has a sulfonate ion having a specific structure that does not contain a fluorine atom in the anion moiety. For this reason, the acidity of the acid generated upon exposure does not become too high, and thus the action of the acid on the unexposed part of the resist film is suppressed. In addition, the resist composition according to the present embodiment contains the photo-degradable base (D1) having a specific structure capable of suitably suppressing the diffusion of an acid generated from the component (B1). Therefore, it is can be suppressed the acid diffuses to the unexposed part, thereby deteriorating the pattern shape and causing roughness.

As a result, it is presumed that with the resist composition according to the present embodiment, which is obtained by combining the above-described component (A1), component (B1), and component (D1), it is possible to achieve high sensitivity and form a good resist pattern having a good roughness reduction property and a good pattern shape.

(Method of forming resist pattern) A method of forming a resist pattern according to the second aspect according to the present invention is a method including a step of forming a resist film on a support using the resist composition according to the first aspect of the present embodiment described above, a step of exposing the resist film, and a step of developing the exposed resist film to form a resist pattern.

Examples of one embodiment of such a method of forming a resist pattern include a method of forming a resist pattern performed as described below.

First, the resist composition of the above-described embodiment is applied onto a support with a spinner or the like, and a baking (post-apply baking (PAB)) treatment is performed, for example, at a temperature condition of 80° C. to 150° C. for 40 to 120 seconds, preferably for 60 to 90 seconds to form a resist film.

Following the selective exposure performed on the resist film by, for example, exposure through a mask (mask pattern) having a predetermined pattern formed on the mask by using an exposure apparatus such as an electron beam lithography apparatus or an EUV lithography apparatus, or direct irradiation of the resist film for drawing with an electron beam without using a mask pattern, baking treatment (post-exposure baking (PEB)) is performed, for example, under a temperature condition of 80° C. to 150° C. for 40 to 120 seconds and preferably 60 to 90 seconds.

Next, the resist film is subjected to a developing treatment. The developing treatment is performed using an alkali developing solution in a case of an alkali developing process, and a developing solution containing an organic solvent (organic developing solution) in a case of a solvent developing process.

After the developing treatment, it is preferable to conduct a rinse treatment. As the rinse treatment, water rinsing using pure water is preferable in a case of an alkali developing process, and rinsing using a rinse liquid containing an organic solvent is preferable in a case of a solvent developing process.

In a case of a solvent developing process, after the developing treatment or the rinsing, the developing solution or the rinse liquid remaining on the pattern can be removed by a treatment using a supercritical fluid.

After the developing treatment or the rinse treatment, drying is conducted. As desired, baking treatment (post-baking) can be performed following the developing treatment.

In this manner, a resist pattern can be formed.

The support is not specifically limited, and a conventionally known support can be used. For example, substrates for electronic components, and such substrates having predetermined wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the support, any support having the above-described substrate on which an inorganic and/or organic film is provided may be used. As the inorganic film, an inorganic antireflection film (inorganic BARC) can be used. Examples of the organic film include an organic antireflection film (organic BARC) and an organic film such as a lower-layer organic film used in a multilayer resist method.

Here, the multilayer resist method is a method in which at least one layer of an organic film (lower-layer organic film) and at least one layer of a resist film (upper-layer resist film) are provided on a substrate, and a resist pattern formed on the upper-layer resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be performed using radiation such as an ArF excimer laser, a KrF excimer laser, an F2 excimer laser, extreme ultraviolet (EUV) rays, vacuum ultraviolet (VUV) rays, electron beams (EB), X-rays, or soft X-rays. The resist composition is highly useful for a KrF excimer laser, an ArF excimer laser, EB, or EUV, more useful for an ArF excimer laser, EB or EUV, and particularly useful for EB or EUV. That is, the method of forming a resist pattern according to the present embodiment is a particularly useful method in a case where the step of exposing the resist film includes an operation of exposing the resist film to extreme ultraviolet (EUV) rays or electron beams (EB).

The exposure of the resist film can be a general exposure (dry exposure) performed in air or an inert gas such as nitrogen, or liquid immersion exposure (liquid immersion lithography).

In liquid immersion lithography is an exposure method in which the region between the resist film and the lens at the lowermost position of the lithography apparatus is pre-filled with a solvent (liquid immersion medium) that has a larger refractive index than the refractive index of air, and the exposure (dipping exposure) is performed in this state.

The liquid immersion medium is preferably a solvent that exhibits a refractive index larger than the refractive index of air but smaller than the refractive index of the resist film to be exposed. The refractive index of such a solvent is not particularly limited as long as it satisfies the above-described requirements.

Examples of the solvent which exhibits a refractive index that is larger than the refractive index of air but smaller than the refractive index of the resist film include water, fluorine-based inert liquids, silicone-based solvents, and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$, or $C_5H_3F_7$ as the main component, and the boiling point is preferably in a range of 70° to 180° C. and more preferably in a range of 80° to 160° C. A fluorine-based inert liquid having a boiling point in the above-described range is advantageous in that removing the medium used in the liquid immersion after the exposure can be performed by a simple method.

A fluorine-based inert liquid is particularly preferably a perfluoroalkyl compound obtained by substituting all hydrogen atoms of the alkyl group with a fluorine atom. Examples of these perfluoroalkyl compounds include perfluoroalkyl ether compounds and perfluoroalkyl amine compounds.

Specifically, an example of a suitable perfluoroalkyl ether compound is perfluoro(2-butyl-tetrahydrofuran)(boiling point of 102° C.), and an example of a suitable perfluoroalkyl amine compound is perfluorotributyl amine (boiling point of 174° C.).

As the liquid immersion medium, water is preferable in terms of cost, safety, environment, and versatility.

Examples of the alkali developing solution used for a developing treatment in an alkali developing process include an aqueous solution of 0.1 to 10% by mass of tetramethylammonium hydroxide (TMAH).

As the organic solvent contained in the organic developing solution, which is used for a developing treatment in a solvent developing process, any one of the conventionally known organic solvents capable of dissolving the component (A) (component (A) prior to exposure) can be suitably selected from the conventionally known organic solvents. Specific examples of the organic solvent include polar solvents such as a ketone-based solvent, an ester-based solvent, an alcohol-based solvent, a nitrile-based solvent, an amide-based solvent, and an ether-based solvent, and hydrocarbon-based solvents.

A ketone-based solvent is an organic solvent containing C—C(=O)—C in the structure thereof. An ester-based solvent is an organic solvent containing C—C(=O)—O—C in the structure thereof. An alcohol-based solvent is an organic solvent containing an alcoholic hydroxyl group in the structure thereof. An "alcoholic hydroxyl group" indicates a hydroxyl group bonded to a carbon atom of an aliphatic hydrocarbon group. A nitrile-based solvent is an organic solvent containing a nitrile group in the structure thereof. An amide-based solvent is an organic solvent containing an amide group in the structure thereof. An ether-based solvent is an organic solvent containing C—O—C in the structure thereof.

Some organic solvents have a plurality of the functional groups which characterize the above-described solvents in the structure thereof. In such a case, the organic solvent can be classified as any type of solvent having a characteristic functional group. For example, diethylene glycol monomethyl ether can be classified as an alcohol-based solvent or an ether-based solvent.

A hydrocarbon-based solvent consists of a hydrocarbon which may be halogenated and does not have any substituent other than a halogen atom. The halogen atom is preferably a fluorine atom.

Among the above, the organic solvent contained in the organic developing solution is preferably a polar solvent and more preferably a ketone-based solvent, an ester-based solvent, or a nitrile-based solvent.

Examples of ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, propylenecarbonate, γ-butyrolactone and methylamyl ketone (2-heptanone). Among these examples, the ketone-based solvent is preferably methylamyl ketone (2-heptanone).

Examples of the ester-based solvent include methyl acetate, butyl acetate, ethyl acetate, isopropyl acetate, amyl acetate, isoamyl acetate, ethyl methoxyacetate, ethyl ethoxyacetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among these, the ester-based solvent is preferably butyl acetate.

Examples of the nitrile-based solvent include acetonitrile, propionitrile, valeronitrile, and butyronitrile.

As desired, the organic developing solution may have a conventionally known additive blended. Examples of the additive include surfactants. The surfactant is not particularly limited, and for example, an ionic or non-ionic fluorine-based and/or a silicone-based surfactant can be used. The surfactant is preferably a non-ionic surfactant and more preferably a non-ionic fluorine surfactant or a non-ionic silicone-based surfactant.

In a case where a surfactant is blended, the amount of the surfactant to be blended is typically in a range of 0.001% to 5% by mass, preferably in a range of 0.005% to 2% by mass, and more preferably in a range of 0.01% to 0.5% by mass with respect to the total amount of the organic developing solution.

The developing treatment can be performed by a conventionally known developing method. Examples thereof include a method in which the support is immersed in the developing solution for a predetermined time (a dip method), a method in which the developing solution is cast upon the surface of the support by surface tension and maintained for a predetermined time (a puddle method), a method in which the developing solution is sprayed onto the surface of the support (spray method), and a method in which a developing solution is continuously ejected from a developing solution-ejecting nozzle and applied to a support which is scanned at a constant rate while being rotated at a constant rate (dynamic dispense method).

As the organic solvent contained in the rinse liquid used in the rinse treatment after the developing treatment in a case of a solvent developing process, an organic solvent hardly dissolving the resist pattern can be suitably selected and used, among the organic solvents mentioned as organic solvents that are used for the organic developing solution. In general, at least one kind of solvent selected from the group consisting of a hydrocarbon-based solvent, a ketone-based solvent, an ester-based solvent, an alcohol-based solvent, an amide-based solvent, and an ether-based solvent is used. Among these, at least one kind of solvent selected from the group consisting of a hydrocarbon-based solvent, a ketone-based solvent, an ester-based solvent, an alcohol-based solvent, and an amide-based solvent is preferable, at least one kind of solvent selected from the group consisting of an alcohol-based solvent and an ester-based solvent is more preferable, and an alcohol-based solvent is particularly preferable.

The alcohol-based solvent used for the rinse liquid is preferably a monohydric alcohol of 6 to 8 carbon atoms, and the monohydric alcohol may be linear, branched, or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol, and benzyl alcohol. Among these, 1-hexanol, 2-heptanol, and 2-hexanol are preferable, and 1-hexanol and 2-hexanol are more preferable.

As the organic solvent, one kind of solvent may be used alone, or two or more kinds of solvents may be used in combination. Further, an organic solvent other than the above-described examples or water may be mixed thereto. However, in consideration of the development characteristics, the amount of water to be blended in the rinse liquid is preferably 30% by mass or less, more preferably 10% by mass or less, still more preferably 5% by mass or less, and most preferably 3% by mass or less with respect to the total amount of the rinse liquid.

A conventionally known additive can be blended with the rinse liquid as necessary. Examples of the additive include surfactants. Examples of the surfactant include the same surfactants as those described above, the surfactant is preferably a non-ionic surfactant and more preferably a non-ionic fluorine surfactant or a non-ionic silicone-based surfactant.

In a case where a surfactant is blended, the amount of the surfactant to be blended is typically in a range of 0.001% to 5% by mass, preferably in a range of 0.005% to 2% by mass, and more preferably in a range of 0.01% to 0.5% by mass with respect to the total amount of the rinse liquid.

The rinse treatment using a rinse liquid (washing treatment) can be performed by a conventionally known rinse method. Examples of the rinse treatment method include a method in which the rinse liquid is continuously applied to the support while rotating it at a constant rate (rotational coating method), a method in which the support is immersed in the rinse liquid for a predetermined time (dip method), and a method in which the rinse liquid is sprayed onto the surface of the support (spray method).

According to the method of forming a resist pattern according to the present embodiment described above, since the resist composition according to the embodiment described above is used, it is possible to form a resist pattern that is highly sensitive, has reduced roughness, and has high rectangularity.

EXAMPLES

Hereinafter, the present invention will be described in more detail based on Examples, but the present invention is not limited to these Examples.

Synthesis Example 1

Synthesis Example of Polymer Compound (A1-1)

10.0 g of a monomer (a02-1 pre), 13.1 g of a monomer (a01-1), and 2.4 g of azobis (isobutyric acid) dimethyl (V-601) as a polymerization initiator were dissolved in 50.0 g of methyl ethyl ketone (MEK), and the mixture was heated to 85° C. in a nitrogen atmosphere and stirred for 5 hours. Then, 9.4 g of acetic acid and 160 g of methanol were added to the reaction solution, and a deprotection reaction was carried out at 30° C. for 8 hours. After completion of the reaction, the obtained reaction solution was precipitated in 2,500 g of heptane, followed by washing. The obtained white solid was filtered and dried under reduced pressure overnight to obtain the target polymer compound (A1-1).

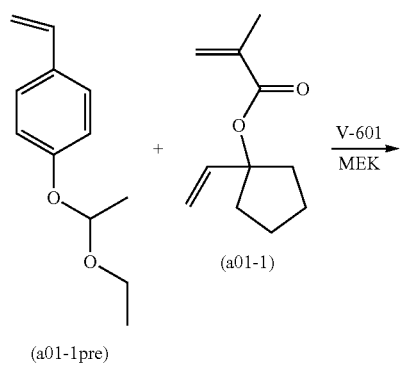

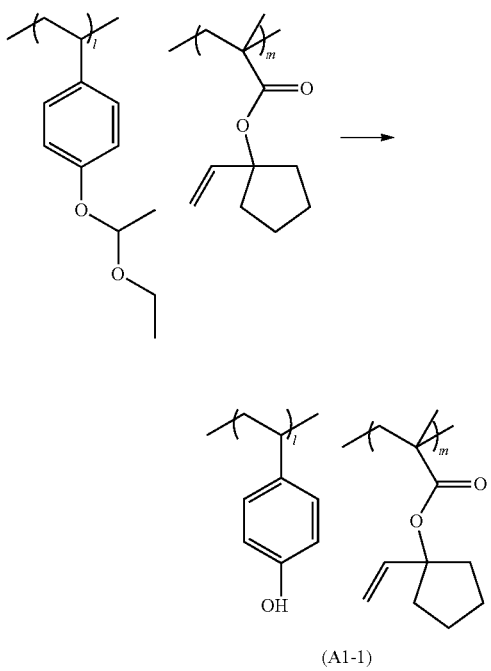

(A1-1)

As a result of a GPC measurement to determine the weight-average molecular weight (Mw) in terms of standard polystyrene, the obtained polymer compound (A1-1) had a weight-average molecular weight of 7,100 and a polydispersity (Mw/Mn) of 1.61. The copolymer compositional ratio (the ratio (the molar ratio) among constitutional units in the structural formula) determined by $^{13}$C-NMR was $l/m=50/50$.

Synthesis Examples 2 to 6

Polymer compounds (A1-2) to (A1-4), (A2-1), and (A2-2) having the compositional ratios shown in Table 1 were synthesized using the compounds shown below in the same manner as in Synthesis Example 1.

With respect to the obtained polymer compounds, the copolymerization compositional ratio (the ratio (molar ratio) between constitutional units, each of which is derived from a monomer) in the polymer compound, which was determined by $^{13}$C-NMR, the standard polystyrene-equivalent weight-average molecular weight (Mw), which was determined by GPC measurement, and the polydispersity (Mw/Mn) are shown in Table 1.

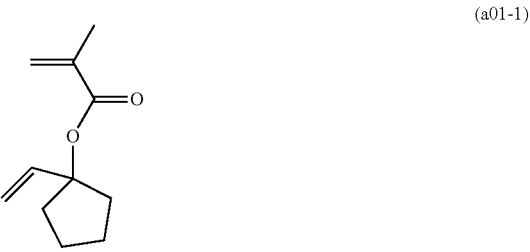

(a01-1)

(a01-2)
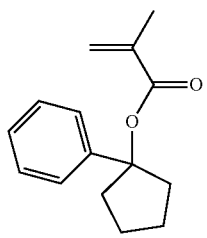
(a02-1pre)
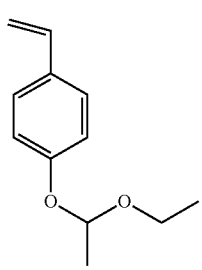
(a02-2pre)
(a02-3pre)
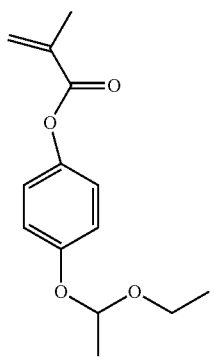
(a2-1)
(a1-1)
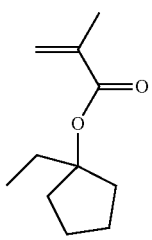
The polymer compounds (A1-1) to (A1-4), (A2-1), and (A2-2) obtained by the above Synthesis Examples are shown below.
(A1-1)
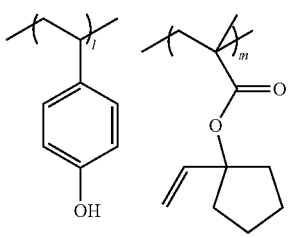
(A1-2)
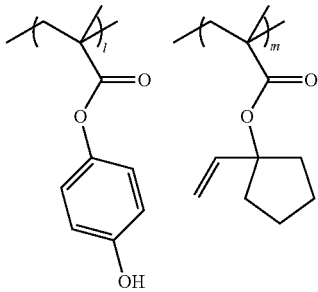
(A1-3)
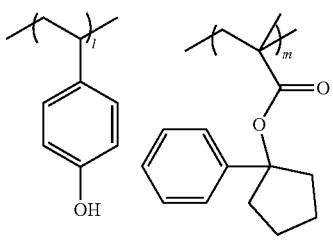
(A1-4)
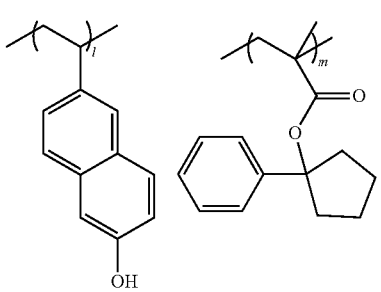

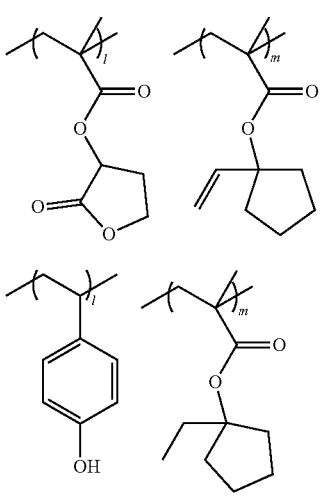

The constitutional units represented by Chemical Formula (a02-1), the constitutional unit represented by Chemical Formula (a02-2), and the constitutional unit represented by Chemical Formula (a02-3), which constitute the above-described copolymer, are a constitutional unit derived from a monomer represented by Chemical Formula (a02-1pre), a constitutional unit derived from a monomer represented by Chemical Formula (a02-2pre), and a monomer represented by Chemical Formula (a02-3pre).

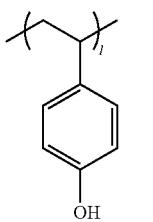

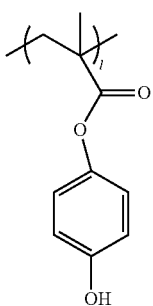

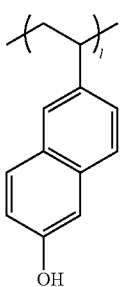

TABLE 1

| Polymer compound | | Copolymerization compositional ratio of polymer compound (molar ratio) | Weight-average molecular weight (Mw) | Polydispersity (Mw) |
|---|---|---|---|---|
| Synthesis Example 1 | (A1-1) | (a02-1)/(a01-1) = 50/50 | 7100 | 1.61 |
| Synthesis Example 2 | (A1-2) | (a02-2)/(a01-1) = 50/50 | 7100 | 1.59 |
| Synthesis Example 3 | (A1-3) | (a02-1)/(a01-2) = 50/50 | 6800 | 1.64 |
| Synthesis Example 4 | (A1-4) | (a02-3)/(a01-2) = 50/50 | 6600 | 1.66 |
| Synthesis Example 5 | (A2-1) | (a2-1)/(a01-1) = 50/50 | 7400 | 1.65 |
| Synthesis Example 6 | (A2-2) | (a02-1)/(a1-1) = 50/50 | 7000 | 1.61 |

<Preparation of Resist Composition>

Examples 1 to 7 and Comparative Examples 1 to 4

Each of the components shown in Tables 2 and 3 was mixed and dissolved to prepare a resist composition of each Example.

TABLE 2

| | Component (A) | Component (B) | | Component (D) | Component (S) |
|---|---|---|---|---|---|
| | | Component (B1) | Component (B2) | | |
| Example 1 | (A1)-1 [100] | (B1)-1 [14.3] | — | (D)-1 [4.0] | (S)-1 [6400] |
| Example 2 | (A1)-1 [100] | (B1)-2 [16.4] | — | (D)-1 [4.0] | (S)-1 [6400] |
| Example 3 | (A1)-1 [100] | (B1)-3 [15.5] | — | (D)-1 [4.0] | (S)-1 [6400] |
| Example 4 | (A1)-2 [100] | (B1)-3 [15.5] | — | (D)-1 [4.0] | (S)-1 [6400] |
| Example 5 | (A1)-3 [100] | (B1)-3 [15.5] | — | (D)-1 [4.0] | (S)-1 [6400] |
| Example 6 | (A1)-4 [100] | (B1)-3 [15.5] | — | (D)-1 [4.0] | (S)-1 [6400] |
| Example 7 | (A1)-1 [100] | (B1)-3 [7.7] | (B2)-1 [9.0] | (D)-1 [4.0] | (S)-1 [6400] |

TABLE 3

| | Component (A) | Component (B) | Component (D) | Component (S) |
|---|---|---|---|---|
| Comparative Example 1 | (A1)-1 [100] | (B2)-1 [18.0] | (D)-1 [4.0] | (S)-1 [6400] |
| Comparative Example 2 | (A2)-1 [100] | (B1)-3 [15.5] | (D)-1 [4.0] | (S)-1 [6400] |
| Comparative Example 3 | (A2)-2 [100] | (B1)-3 [15.5] | (D)-1 [4.0] | (S)-1 [6400] |
| Comparative Example 4 | (A1)-1 [100] | (B1)-3 [15.5] | — | (S)-1 [6400] |

In Tables 2 and 3, each abbreviation has the following meaning. The numerical values in the brackets are blending amounts (parts by mass).

(A1)-1 to (A1)-4: the polymer compounds (A1-1) to (A1-4).

(A2)-1, (A2)-2: the polymer compounds (A2-1), (A2-2).

(B1)-1 to (B1)-3: acid generators composed of compounds reach represented by Chemical Formulae (B1-1) to (B1-3).

(B2)-1: an acid generator composed of a compound represented by Chemical Formula (B2-1).

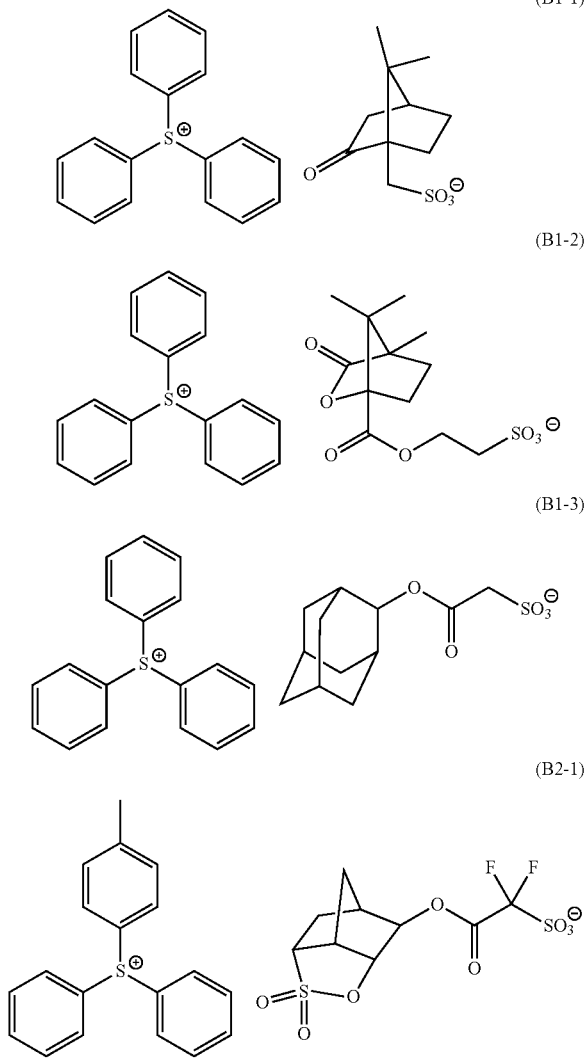

(D)-1: an acid diffusion controlling agent composed of a compound represented by Chemical Formula (D-1).

(S)-1: a mixed solvent of propylene glycol monomethyl ether acetate/propylene glycol monomethyl ether=60/40 (mass ratio)

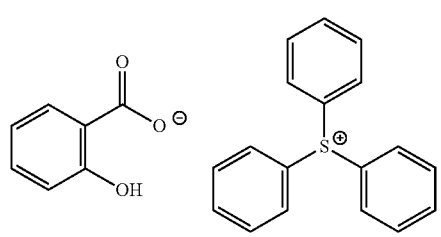

<Formation of Resist Pattern>

The resist composition of each Example was applied onto an 8-inch silicon substrate which had been subjected to a hexamethyldisilazane (HMDS) treatment using a spinner, the coated wafer was subjected to a post-apply baking (PAB) treatment on a hot plate at a temperature of 110° C. for 60 seconds so that the coated wafer was dried to form a resist film having a film thickness of 50 nm.

Next, drawing (exposure) was performed on the resist film by using an electron beam lithography apparatus JEOL-JBX-9300FS (manufactured by JEOL Ltd.), with the target size being set to a 1:1 line-and-space pattern (hereinafter, referred to as an "LS pattern") of a line width of 35 nm, at an accelerating voltage of 100 kV. Thereafter, a post-exposure baking (PEB) treatment was performed on the resist film at 110° C. for 60 seconds.

Subsequently, alkali development was performed at 23° C. for 60 seconds using a 2.38% by mass tetramethylammonium hydroxide (TMAH) aqueous solution "NMD-3" (trade name, manufactured by TOKYO OHKA KOGYO CO., LTD.).

Thereafter, rinsing was performed with pure water for 15 seconds.

As a result, a 1:1 LS pattern having a line width of 35 nm was formed.

[Evaluation of Optimum Exposure Amount (Eop)]

According to <Formation of resist pattern> described above, an optimum exposure amount Eop ($\mu C/cm^2$) for forming the LS pattern having the target size was determined. The results are shown in Tables 4 and 5 as "Eop ($\mu C/cm^2$)".

[Evaluation of Linewise Roughness (LWR)]

$3\sigma$ of the LS pattern formed in <Formation of resist pattern> described above, which is a scale indicating LWR, was determined. The results are shown in Tables 4 and 5 as "LWR (nm)".

"$3\sigma$" indicates a triple value (unit: nm) of the stand and deviation ($\sigma$) determined from measurement results obtained by measuring 400 line positions in the longitudinal direction of the line with a scanning electron microscope (accelerating voltage: 800V, trade name: S-9380, manufactured by Hitachi High-Tech Corporation)

The smaller the value of $3\sigma$ is, the smaller the roughness in the line side wall is, which means an LS pattern having a more uniform width was obtained.

[Evaluation of LS Pattern Shape]

In <Formation of resist pattern> described above, the cross-sectional shape in each of the obtained LS patterns was observed using a scanning electron microscope (accelerating voltage: 300V, trade name: SU8000, manufactured by Hitachi High-Tech Corporation), and the line width (Lt) of the upper part of the resist pattern and the line width (Lm) of the intermediate part of the resist pattern were measured. It is noted that the more close to 1 the value of Lt/Lm is, the better the rectangularity of the cross-sectional shape is. The rectangularity of the cross-sectional shape was evaluated as "A: particularly good" in a case of, 0.95≤(Lt/Lm)≤1.05; "B: good" in a case of 0.90≤(Lt/Lm)<0.95 or 1.05<(Lt/Lm) ≤1.10; or "x: defective" in a case of (Lt/Lm)<0.90 or 1.10<(Lt/Lm). The results are shown in Tables 4 and 5 as "Pattern shape".

TABLE 4

|  | PAB (° C.) | PEB (° C.) | Eop [$\mu C/cm^2$] | LWR [nm] | Pattern shape |
|---|---|---|---|---|---|
| Example 1 | 110 | 110 | 129 | 4.2 | A |
| Example 2 | 110 | 110 | 121 | 4.1 | A |
| Example 3 | 110 | 110 | 114 | 4.1 | A |
| Example 4 | 110 | 110 | 118 | 4.3 | A |

TABLE 4-continued

| | PAB (° C.) | PEB (° C.) | Eop [μC/cm$^2$] | LWR [nm] | Pattern shape |
|---|---|---|---|---|---|
| Example 5 | 110 | 110 | 111 | 4.4 | A |
| Example 6 | 110 | 110 | 122 | 4.2 | A |
| Example 7 | 110 | 110 | 107 | 4.4 | B |

TABLE 5

| | PAB (° C.) | PEB (° C.) | Eop [μC/cm$^2$] | LWR [nm] | Pattern shape |
|---|---|---|---|---|---|
| Comparative Example 1 | 110 | 110 | 101 | 4.6 | C |
| Comparative Example 2 | 110 | 110 | 139 | 5.7 | B |
| Comparative Example 3 | 110 | 110 | 122 | 5.1 | A |
| Comparative Example 4 | 110 | 110 | Not resolved | | |

As shown in Tables 4 to 5, it has been confirmed that it is possible to form resist patterns that are good in all of the sensitivity, the roughness reduction property, and the pattern shape (the pattern rectangularity) from the resist compositions of Examples, as compared with the resist compositions of Comparative Examples.

Since the resist composition of Comparative Example 1 contained an acid generator that generates an acid having a high acidity, the resist pattern formed from the resist composition of Comparative Example 1 was inferior in pattern shape.

Since the resist compositions of Comparative Examples 2 and 3 did not contain the resin component (A1) having the constitutional unit (a01) and the constitutional unit (a02), the sensitivity and the roughness reduction property in the resist pattern formation were inferior.

Since the resist composition of Comparative Example 4 did not contain the photo-degradable base (D1), the acid diffusion could not be controlled, and the solubility in the developing solution changed even in the unexposed part of the resist film, and thus the LS pattern could not be formed.

Further, in the resist composition of Examples, it has been confirmed that it is possible to form a resist pattern having a better pattern shape (a better pattern rectangularity) from the resist compositions of Examples 1 to 6 in which only an acid generator (the compound (B1)) that generates an acid having a relatively low acidity, as compared with the resist composition of Example 7 in which an acid generator which is conventionally used as the acid generator and generates an acid having a high acidity is used in combination.

While preferred embodiments of the invention have been described and illustrated above, it should be understood that these are exemplary of the invention and are not to be considered as limiting. Additions, omissions, substitutions, and other modifications can be made without departing from the scope of the invention. Accordingly, the invention is not to be considered as being limited by the foregoing description and is only limited by the scope of the appended claims.

What is claimed is:
1. A resist composition which generates an acid upon exposure and exhibits changed solubility in a developing solution under action of acid, the resist composition comprising:
a resin component (A1) exhibiting changed solubility in a developing solution under action of acid;
an acid generator component (B) generating an acid upon exposure; and
a photo-degradable base (D1) which controls diffusion of the acid generated upon exposure from the acid generator component (B),
wherein the resin component (A1) has a constitutional unit (a01) derived from a compound represented by General Formula (a01-1) and a constitutional unit (a02) derived from a compound represented by General Formula (a02-1),
the acid generator component (B) contains a compound (B1-10) represented by General Formula (b1-10) or a compound (B1-14) represented by General Formula (b1-14), and
the photo-degradable base (D1) contains a compound represented by General Formula (dl-1) or a compound represented by General Formula (d1-2), and
the proportion of the compound (B1-10) represented by General Formula (b1-10) or the compound (B1-14) represented by General Formula (b1-14) in the acid generator component (B) is 90% by mass or more with respect to the total mass of the acid generator component (B):

(a01-1)

wherein $W^{01}$ represents a polymerizable group-containing group, $C^t$ represents a tertiary carbon atom, and a carbon atom at an α-position of $C^t$ constitutes a carbon-carbon unsaturated bond, $R^{11}$ represents an aromatic hydrocarbon group or a chain hydrocarbon group, which may have a substituent, and $R^{12}$ and $R^{13}$ each independently represent a chain hydrocarbon group which may have a substituent or $R^{12}$ and $R^{13}$ are bonded to each other to form a cyclic group which may have a substituent;

(a02-1)

wherein $W^{02}$ represents a polymerizable group-containing group, $W^{02}$ represents an aromatic hydrocarbon group, provided that part or all of hydrogen atoms which the aromatic hydrocarbon group has may be substituted with a substituent other than a hydroxy group, $Wa^{02}$ may form a condensed ring with $W^{02}$, and n02 represents 1 or 2;

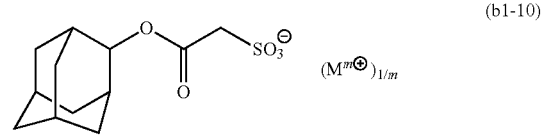

(b1-10)

-continued (b1-14)

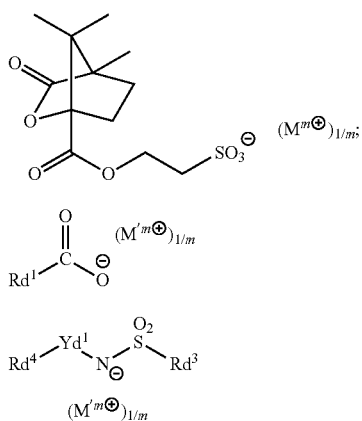

(d1-1)

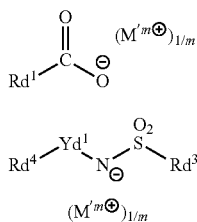

(d1-2)

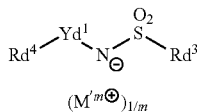

wherein, in General Formula (d1-1), $Rd^1$ represents a cyclic group which may have a substituent, a chain alkyl group which may have a substituent, or chain alkenyl group which may have a substituent, m represents an integer of 1 or greater, and $M'^{m+}$ represents an m-valent organic cation, wherein in General Formula (d1-2), $Rd^3$ and $Rd^4$ each independently represents a cyclic group which may have a substituent, a chain alkyl group which may have a substituent, or chain alkenyl group which may have a substituent, $Yd^1$ represents a single bond or a divalent linking group, m represents an integer of 1 or greater, and $M'^{m+}$ represents an m-valent organic cation, and wherein in General Formulas (b1-10) and (b1-14), m represents an integer of 1 or greater, and $M^{m+}$ represents an m-valent organic cation.

2. The resist composition according to claim 1, wherein the constitutional unit (a01) is a constitutional unit derived from a compound represented by General Formula (a01-1-1):

(a01-1-1)

wherein $W^{01}$ represents a polymerizable group-containing group, $C^t$ represents a tertiary carbon atom, and a carbon atom at an α-position of $C^t$ constitutes a carbon-carbon unsaturated bond, $R^{11}$ represents an aromatic hydrocarbon group or a chain hydrocarbon group, which may have a substituent, and $X^t$ represents a group that forms a cyclic hydrocarbon group together with $C^t$, provided that part or all of hydrogen atoms which the cyclic hydrocarbon group has may be substituted with a substituent.

3. A method of forming a resist pattern, comprising:
forming a resist film on a support using the resist composition according to claim 1;
exposing the resist film; and
developing the exposed resist film to form a resist pattern.

4. The method of forming a resist pattern according to claim 3, wherein the resist film is exposed with an extreme ultraviolet (EUV) rays or an electron beam (EB).

* * * * *